United States Patent
Godo et al.

(10) Patent No.: US 10,411,013 B2
(45) Date of Patent: Sep. 10, 2019

(54) SEMICONDUCTOR DEVICE AND MEMORY DEVICE

(71) Applicant: Semiconductor Energy Laboratory Co., Ltd., Atsugi-shi, Kanagawa-ken (JP)

(72) Inventors: Hiromichi Godo, Isehara (JP); Tatsunori Inoue, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/407,695

(22) Filed: Jan. 17, 2017

(65) Prior Publication Data

US 2017/0213833 A1    Jul. 27, 2017

(30) Foreign Application Priority Data

Jan. 22, 2016 (JP) .................................. 2016-010520
Jan. 22, 2016 (JP) .................................. 2016-010524

(51) Int. Cl.
*H01L 27/108*    (2006.01)
*H01L 23/528*    (2006.01)
(Continued)

(52) U.S. Cl.
CPC ...... *H01L 27/10802* (2013.01); *H01L 23/528* (2013.01); *H01L 27/10814* (2013.01);
(Continued)

(58) Field of Classification Search
CPC combination set(s) only.
See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

EP    1737044 A    12/2006
EP    2226847 A     9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Matthew L Reames
(74) *Attorney, Agent, or Firm* — Robinson Intellectual Property Law Office; Eric J. Robinson

(57) ABSTRACT

To provide a semiconductor device with large storage capacity and low power consumption. The semiconductor device includes an oxide semiconductor, a first transistor, a second transistor, and a dummy word line. A channel formation region in the first transistor and a channel formation region in the second transistor are formed in different regions in the oxide semiconductor. The dummy word line is provided to extend between the channel formation region in the first transistor and the channel formation region in the second transistor. By applying a predetermined potential to the dummy word line, the first transistor and the second transistor are electrically isolated in a region of the oxide semiconductor which intersects the dummy word line.

17 Claims, 29 Drawing Sheets

(51) Int. Cl.
  *H01L 27/11* (2006.01)
  *H01L 27/13* (2006.01)
  *H01L 29/786* (2006.01)
  *H01L 27/11582* (2017.01)
  *H01L 49/02* (2006.01)

(52) U.S. Cl.
  CPC .... *H01L 27/1108* (2013.01); *H01L 27/11582* (2013.01); *H01L 27/13* (2013.01); *H01L 28/00* (2013.01); *H01L 29/7869* (2013.01); *H01L 29/78648* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,867,994 B2 | 3/2005 | Tsukikawa |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,274,079 B2 | 9/2012 | Yamazaki |
| 8,390,064 B2 | 3/2013 | Mikasa |
| 8,558,960 B2 | 10/2013 | Yamazaki et al. |
| 8,582,348 B2 | 11/2013 | Inoue et al. |
| 8,803,142 B2 | 8/2014 | Yamazaki et al. |
| 9,305,630 B2 | 4/2016 | Kurokawa |
| 9,305,944 B2 | 4/2016 | Yamazaki et al. |
| 9,424,923 B2 | 8/2016 | Nagatsuka et al. |
| 9,576,982 B2 | 2/2017 | Yamazaki et al. |
| 9,608,122 B2 | 3/2017 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0150019 A1* | 8/2004 | Nakashima ........... G11C 11/412 257/296 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0075372 A1 | 4/2007 | Terashima et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148248 A1 | 6/2010 | Mikasa |
| 2011/0133191 A1* | 6/2011 | Yamazaki ........... H01L 27/1225 257/57 |
| 2012/0007085 A1* | 1/2012 | Suzuki ................. H01L 27/1225 257/59 |
| 2012/0155150 A1 | 6/2012 | Nagatsuka et al. |
| 2013/0187161 A1* | 7/2013 | Yamazaki ............. H01L 29/786 257/57 |
| 2013/0299911 A1* | 11/2013 | Larson .................. H01L 27/088 257/368 |
| 2014/0264324 A1 | 9/2014 | Yamazaki |
| 2014/0325249 A1 | 10/2014 | Toyotaka |
| 2016/0218118 A1 | 7/2016 | Yamazaki et al. |
| 2016/0336051 A1 | 11/2016 | Nagatsuka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |

(56) References Cited

FOREIGN PATENT DOCUMENTS

| JP | 2003-086000 A | 3/2003 |
|---|---|---|
| JP | 2003-086808 A | 3/2003 |
| JP | 2004-103957 A | 4/2004 |
| JP | 2004-193483 A | 7/2004 |
| JP | 2004-273614 A | 9/2004 |
| JP | 2004-273732 A | 9/2004 |
| JP | 2010-141107 A | 6/2010 |
| JP | 2013-182926 A | 9/2013 |
| JP | 2014-216327 A | 11/2014 |
| JP | 2015-084270 A | 4/2015 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn, J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004. vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide Tfts and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-26106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

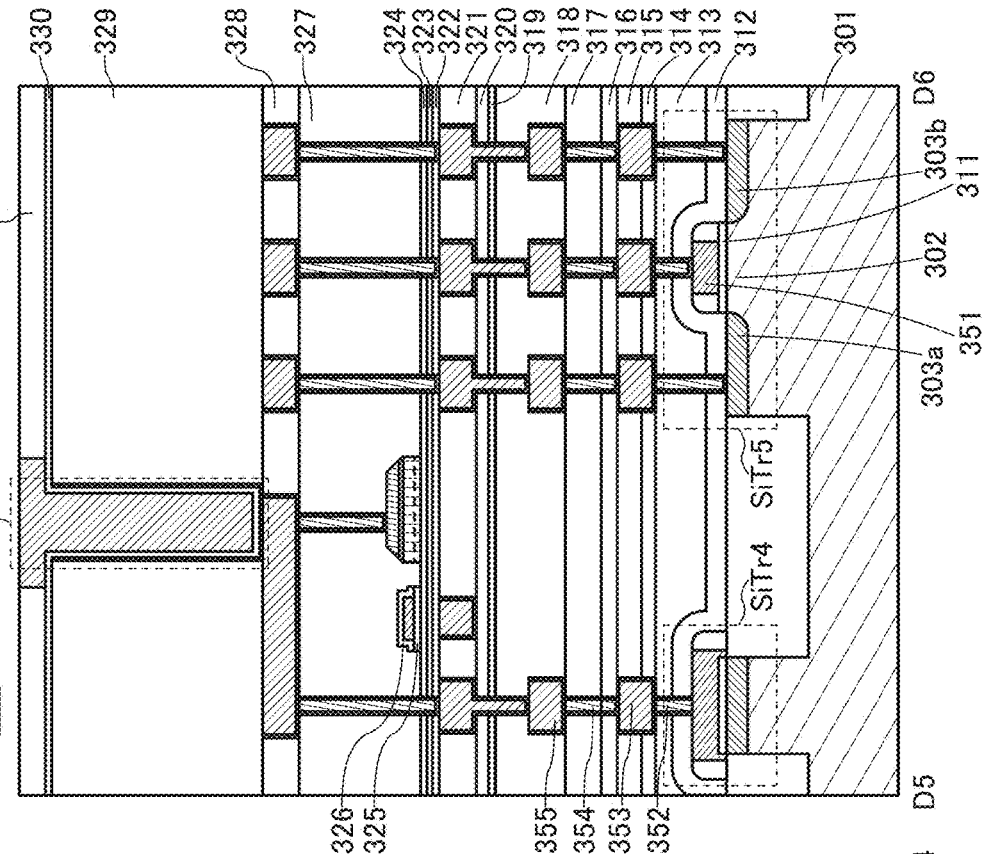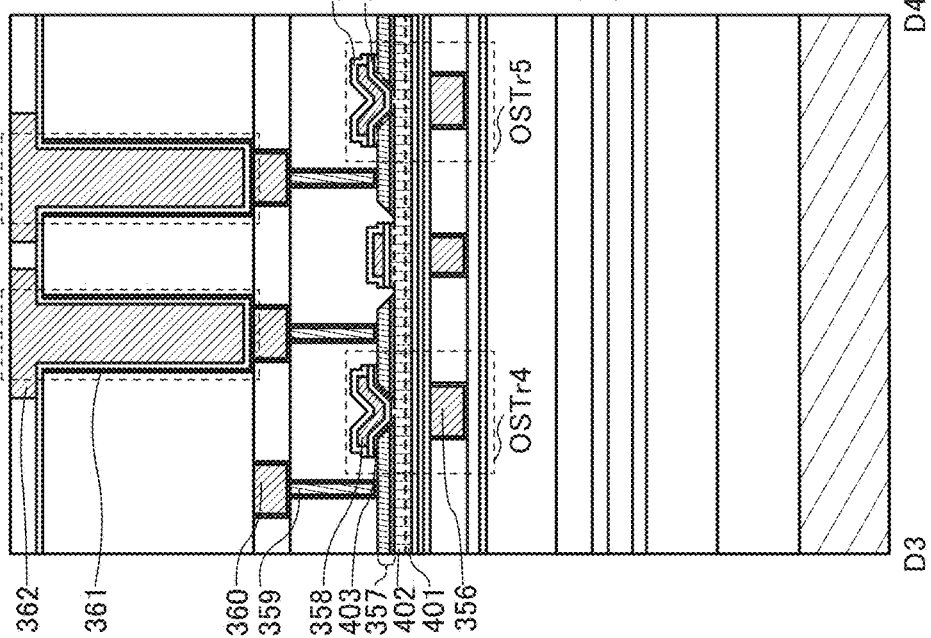

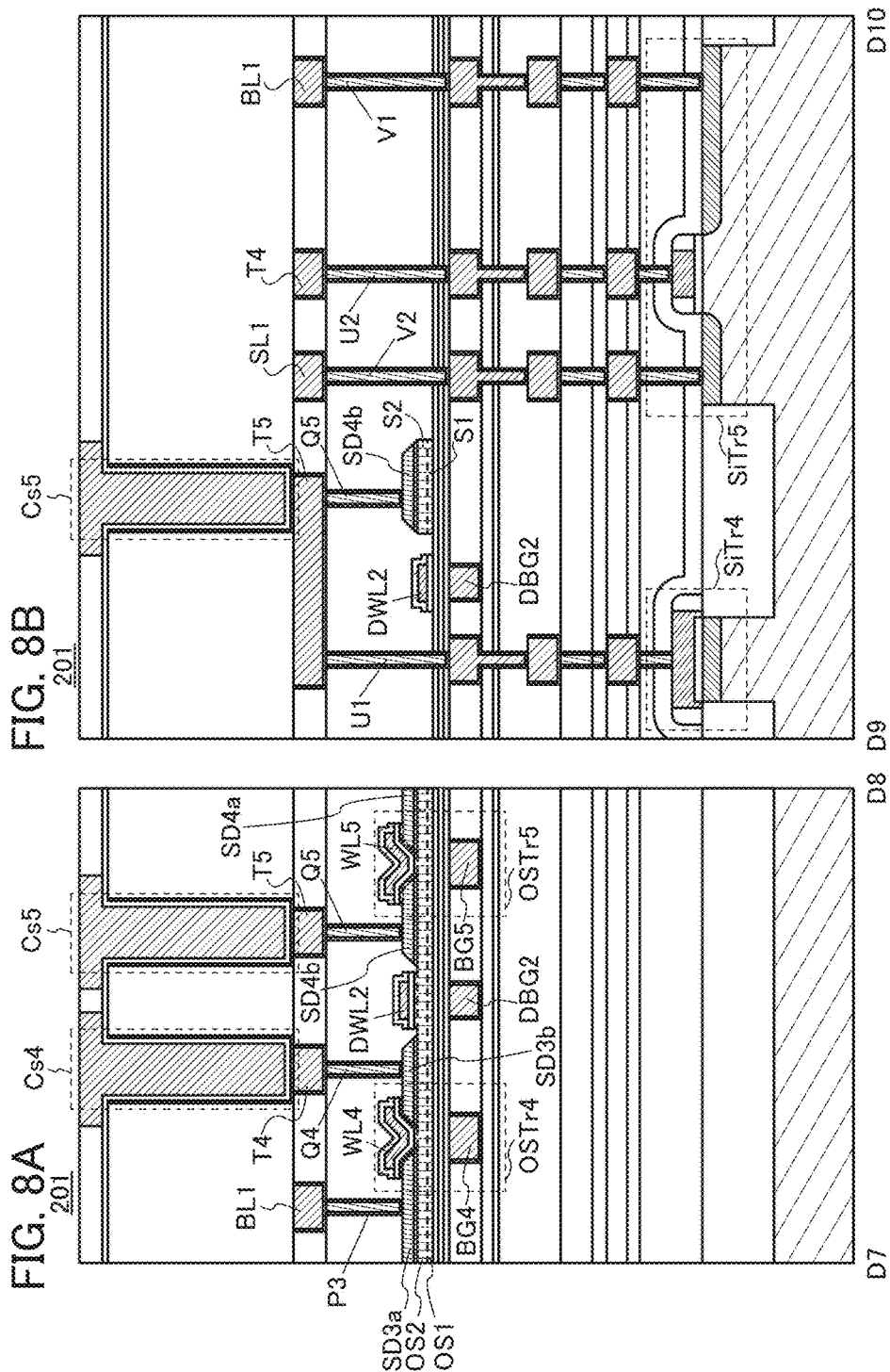

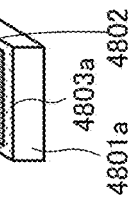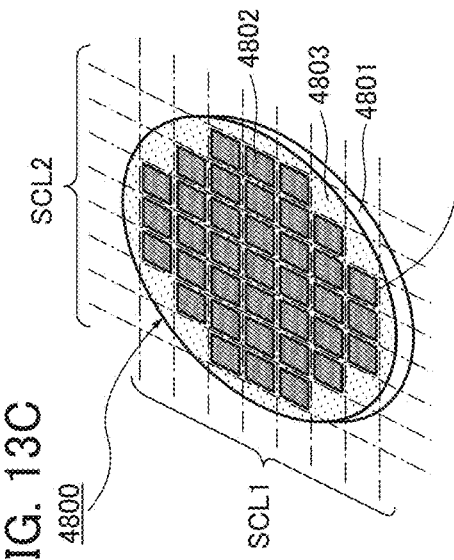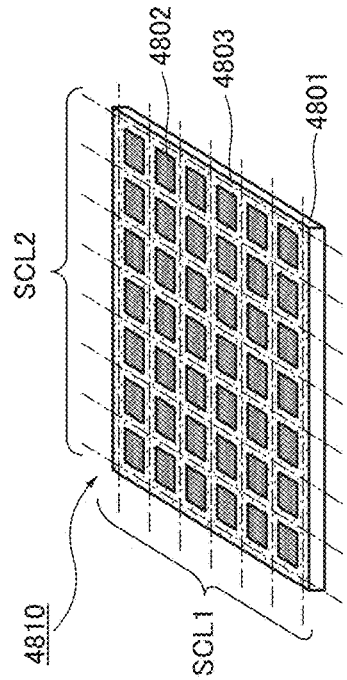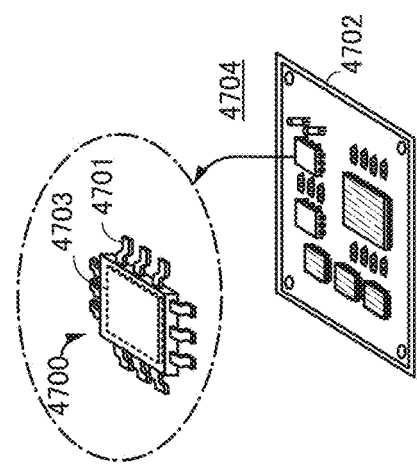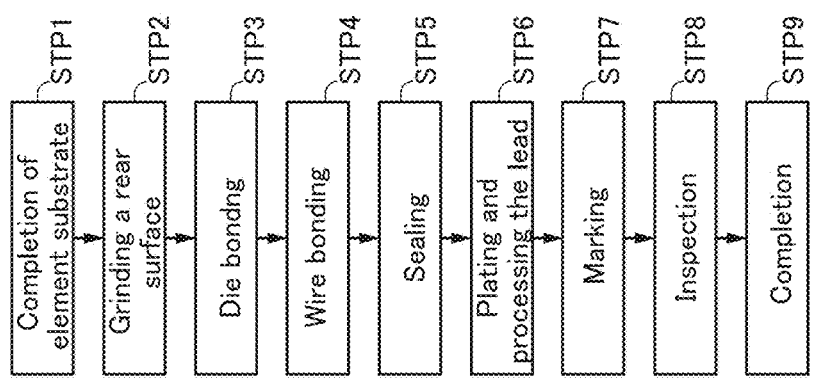

4000

4000

4000

4000

4000

4000

Crystal structure of $InMZnO_4$

SEMICONDUCTOR DEVICE AND MEMORY DEVICE

BACKGROUND OF THE INVENTION

1. Field of the Invention

One embodiment of the present invention relates to a semiconductor device and a memory device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

In recent years, electronic components such as central processing units (CPUs), memory devices, and sensors have been used in various electronic devices such as personal computers, smart phones, and digital cameras. The electronic components have been improved to achieve miniaturization, lower power consumption, and other various objectives.

In particular, the data amount processed in the electronic devices has increased in recent years, and thus, the development of memory devices that can retain a large amount of data has progressed. Miniaturization is a method of manufacturing a memory device with large capacity. The miniaturization here refers to miniaturization of a memory cell, that is, an increase in the number of memory cells per unit area by reducing the size of a memory cell included in the memory device.

REFERENCE

Patent Document

[Patent Document 1] Japanese Published Patent Application No. 2013-182926
[Patent Document 2] Japanese Published Patent Application No. 2004-193483
[Patent Document 3] Japanese Published Patent Application No. 2014-216327
[Patent Document 4] Japanese Published Patent Application No. 2010-141107
[Patent Document 5] Japanese Published Patent Application No. 2015-84270

SUMMARY OF THE INVENTION

For the miniaturization of a memory cell, small elements need to be manufactured by patterning of a lithography process and an etching process. Specifically, there are a method of narrowing the distance between adjacent memory cells and a method of reducing the size of a transistor included in a memory cell, for example. As the miniaturization advances, higher accuracy is required for manufacture of elements by patterning.

Patent Documents 1 to 5 disclose the inventions of DRAMs in which active layers are electrically isolated (hereinafter referred to as element isolation in some cases) using a dummy word line so as to establish a non-conducting state between transistors. Note that in this specification and the like, being "electrically isolated" refers to a state in which a potential or the like prevents a current from flowing between two objects. This method can prevent the optical proximity effect by a lithography process which occurs as the miniaturization advances. Although element isolation of transistors is performed using pn junction of silicon in Patent Documents 1 to 5, a leakage current might flow between transistors because of a leakage current flowing in a region of the pn junction, that is, there is a possibility of data loss due to the leakage current. Therefore, in the case of the element isolation using pn junction of silicon, constant refresh operations are needed.

An object of one embodiment of the present invention is to provide a novel semiconductor device. Another object of one embodiment of the present invention is to provide a memory device or a module including the novel semiconductor device. Another object of one embodiment of the present invention is to provide an electronic device using the memory device or module including the novel semiconductor device. Another object of one embodiment of the present invention is to provide a system with the memory device or module including the novel semiconductor device.

Another object of one embodiment of the present invention is to provide a memory device with large storage capacity. Another object of one embodiment of the present invention is to provide a memory device with low power consumption. Another object of one embodiment of the present invention is to provide an electronic device including the memory device.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a semiconductor device including an oxide semiconductor, a first transistor, a second transistor, a first capacitor, a second capacitor, a first wiring, a second wiring, and a third wiring. The first wiring serves as a gate of the first transistor. A first terminal of the first capacitor is electrically connected to a first terminal of the first transistor. The second wiring serves as a gate of the second transistor. A first terminal of the second capacitor is electrically connected to a first terminal of the second transistor. A channel formation region in the first transistor is formed in the oxide semiconductor. A channel formation region in the second transistor is formed in the oxide semiconductor. The third wiring includes a region overlapping with the oxide semiconductor. The first transistor and the second transistor are electrically isolated by a potential of the third wiring.

(2) Another embodiment of the present invention is the semiconductor device described in (1) further including a fourth wiring and a fifth wiring. The fourth wiring is electrically connected to a second terminal of the first transistor. The fifth wiring is electrically connected to a second terminal of the second transistor. The oxide semiconductor includes a region overlapping with the first wiring, a region overlapping with the second wiring, a region overlapping with the third wiring, a region overlapping with the fourth wiring, and a region overlapping with the fifth wiring. The fourth wiring includes a region overlapping with the first wiring, a region overlapping with the second wiring, and a region overlapping with the third wiring. The fifth wiring includes a region overlapping with the first wiring, a region overlapping with the second wiring, and a region overlapping with the third wiring.

(3) Another embodiment of the present invention is the semiconductor device described in (1) or (2) further including a sixth wiring. The sixth wiring is provided to overlap with the third wiring with the oxide semiconductor positioned between the sixth wiring and the third wiring.

(4) Another embodiment of the present invention is the semiconductor device described in any one of (1) to (3) further including a seventh wiring and an eighth wiring. The seventh wiring serves as a back gate of the first transistor. The seventh wiring is provided to overlap with the first wiring with a channel formation region in the first transistor positioned between the seventh wiring and the first wiring. The eighth wiring serves as a back gate of the second transistor. The eighth wiring is provided to overlap with the second wiring with a channel formation region in the second transistor positioned between the eighth wiring and the second wiring.

(5) Another embodiment of the present invention is a semiconductor device including an oxide semiconductor, a first transistor, a second transistor, a third transistor, a fourth transistor, a first capacitor, a second capacitor, a first wiring, a second wiring, and a third wiring. The first wiring serves as a gate of the first transistor. A first terminal of the first capacitor is electrically connected to a first terminal of the first transistor. A gate of the second transistor is electrically connected to a first terminal of the first transistor. The second wiring serves as a gate of the third transistor. A first terminal of the second capacitor is electrically connected to a first terminal of the third transistor. A gate of the fourth transistor is electrically connected to a first terminal of the third transistor. A channel formation region in the first transistor is formed in the oxide semiconductor. A channel formation region in the third transistor is formed in the oxide semiconductor. The third wiring includes a region overlapping with the oxide semiconductor. The first transistor and the third transistor are electrically isolated by a potential of the third wiring.

(6) Another embodiment of the present invention is the semiconductor device described in (5) further including a fourth wiring, a fifth wiring, a sixth wiring, a seventh wiring, and an eighth wiring. The fourth wiring is electrically connected to a second terminal of the first transistor. The fifth wiring is electrically connected to a first terminal of the second transistor. The sixth wiring is electrically connected to a second terminal of the third transistor. The seventh wiring is electrically connected to a first terminal of the fourth transistor. The eighth wiring is electrically connected to a second terminal of the second transistor. The eighth wiring is electrically connected to a second terminal of the fourth transistor. The oxide semiconductor includes a region overlapping with the first wiring, a region overlapping with the second wiring, a region overlapping with the third wiring, a region overlapping with the fourth wiring, a region overlapping with the fifth wiring, a region overlapping with the sixth wiring, a region overlapping with the seventh wiring, and a region overlapping with the eighth wiring. The first wiring includes a region overlapping with the fourth wiring, a region overlapping with the fifth wiring, a region overlapping with the sixth wiring, a region overlapping with the seventh wiring, and a region overlapping with the eighth wiring. The second wiring includes a region overlapping with the fourth wiring, a region overlapping with the fifth wiring, a region overlapping with the sixth wiring, a region overlapping with the seventh wiring, and a region overlapping with the eighth wiring. The third wiring includes a region overlapping with the fourth wiring, a region overlapping with the fifth wiring, a region overlapping with the sixth wiring, a region overlapping with the seventh wiring, and a region overlapping with the eighth wiring.

(7) Another embodiment of the present invention is the semiconductor device described in (5) further including a fourth wiring, a fifth wiring, and a sixth wiring. The fourth wiring is electrically connected to a second terminal of the first transistor. The fourth wiring is electrically connected to a first terminal of the second transistor. The fifth wiring is electrically connected to a second terminal of the third transistor. The fifth wiring is electrically connected to a first terminal of the fourth transistor. The sixth wiring is electrically connected to a second terminal of the second transistor. The sixth wiring is electrically connected to a second terminal of the fourth transistor. The oxide semiconductor includes a region overlapping with the first wiring, a region overlapping with the second wiring, a region overlapping with the third wiring, a region overlapping with the fourth wiring, a region overlapping with the fifth wiring, and a region overlapping with the sixth wiring. The first wiring includes a region overlapping with the fourth wiring, a region overlapping with the fifth wiring, and a region overlapping with the sixth wiring. The second wiring includes a region overlapping with the fourth wiring, a region overlapping with the fifth wiring, and a region overlapping with the sixth wiring. The third wiring includes a region overlapping with the fourth wiring, a region overlapping with the fifth wiring, and a region overlapping with the sixth wiring.

(8) Another embodiment of the present invention is the semiconductor device described in any one of (5) to (7) further including a ninth wiring. The ninth wiring is provided to overlap with the third wiring with the oxide semiconductor positioned between the ninth wiring and the third wiring.

(9) Another embodiment of the present invention is the semiconductor device described in any one of (5) to (8) further including a tenth wiring and an eleventh wiring. The tenth wiring serves as a back gate of the first transistor. The tenth wiring is provided to overlap with the first wiring with a channel formation region in the first transistor positioned between the tenth wiring and the first wiring. The eleventh wiring serves as a back gate of the third transistor. The eleventh wiring is provided to overlap with the second wiring with a channel formation region in the third transistor positioned between the eleventh wiring and the second wiring.

(10) Another embodiment of the present invention is the semiconductor device described in any one of (5) to (9) further including a first layer and a second layer. The first layer includes the first transistor and the third transistor. The second layer includes the second transistor and the fourth transistor. The first layer is above the second layer.

(11) Another embodiment of the present invention is the semiconductor device described in any one of (5) to (10), in which at least one of channel formation regions in the second transistor and the fourth transistor includes silicon.

(12) Another embodiment of the present invention is the semiconductor device described in any one of (1) to (11), in which the oxide semiconductor includes at least one of indium, an element M, and zinc, and the element M represents any of aluminum, gallium, yttrium, and tin.

(13) Another embodiment of the present invention is a memory device including the semiconductor device described in any one of (1) to (12) and a driver circuit.

(14) Another embodiment of the present invention is a semiconductor wafer including a region for dicing and a plurality of semiconductor devices described in any one of (1) to (12) or a plurality of memory devices described in (13).

(15) Another embodiment of the present invention is an electronic device including a housing and the memory device described in (13).

According to one embodiment of the present invention, a novel semiconductor device can be provided. According to one embodiment of the present invention, a memory device or module including the novel semiconductor device can be provided. According to one embodiment of the present invention, an electronic device using the memory device or module including the novel semiconductor device can be provided. According to one embodiment of the present invention, a system with the memory device including the novel semiconductor device can be provided.

According to one embodiment of the present invention, a memory device with large storage capacity can be provided. According to one embodiment of the present invention, a memory device with low power consumption can be provided. According to one embodiment of the present invention, an electronic device including the above-described memory device can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

FIGS. 7A and 7B are cross-sectional views illustrating an example of a semiconductor device.

FIGS. 8A and 8B are cross-sectional view illustrating an example of a semiconductor device.

FIG. 13A is a flow chart illustrating a manufacturing method of electronic components and FIGS. 13B to 13E are perspective views illustrating the electronic components.

DETAILED DESCRIPTION OF THE INVENTION

An "electronic device", an "electronic component", a "module", and a "semiconductor device" are described. In general, an "electronic device" may refer to as a personal computer, a mobile phone, a tablet terminal, an e-book reader, a wearable terminal, an audiovisual (AV) device, an electronic appliance, a household appliance, an industrial appliance, a digital signage, a car, or an electric appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switching circuit, an amplifier circuit, a memory circuit, a memory cell, a display circuit, a display pixel, or the like which includes a semiconductor element and is included in an electronic component or a module.

In this specification, an oxide semiconductor is referred to as an OS in some cases. Thus, a transistor including an oxide semiconductor in a channel formation region is referred to as an OS transistor in some cases.

In this specification, when there is a description saying that a high-level potential is applied to a wiring, the high-level potential sometimes means at least one of the following potentials: a potential high enough to turn on an n-channel transistor with a gate connected to the wiring; and a potential high enough to turn off a p-channel transistor with a gate connected to the wiring. Thus, when high-level potentials are applied to different two or more wirings, the high-level potentials applied to the wirings may be at different levels.

In this specification, when there is a description saying that a low-level potential is applied to a wiring, the low-level potential sometimes means at least one of the following potentials: a potential low enough to turn off an n-channel transistor with a gate connected to the wiring; and a potential low enough to turn on a p-channel transistor with a gate connected to the wiring. Thus, when low-level potentials are applied to different two or more wirings, the low-level potentials applied to the wirings may be at different levels.

Embodiment 1

In this embodiment, an example of a semiconductor device of one embodiment of the present invention will be described.

<Memory Cell for DRAM>

Figure 3A:
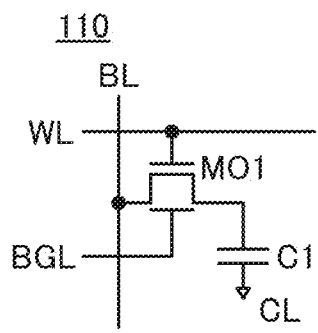
FIGS. 3A and 3B are circuit diagrams illustrating examples of memory cells.

FIG. 3A illustrates a circuit configuration example of a memory cell for a DRAM. The details of this circuit configuration will be described in Embodiment 2. The memory cell for a DRAM includes one transistor and one capacitor.

Figure 1A:
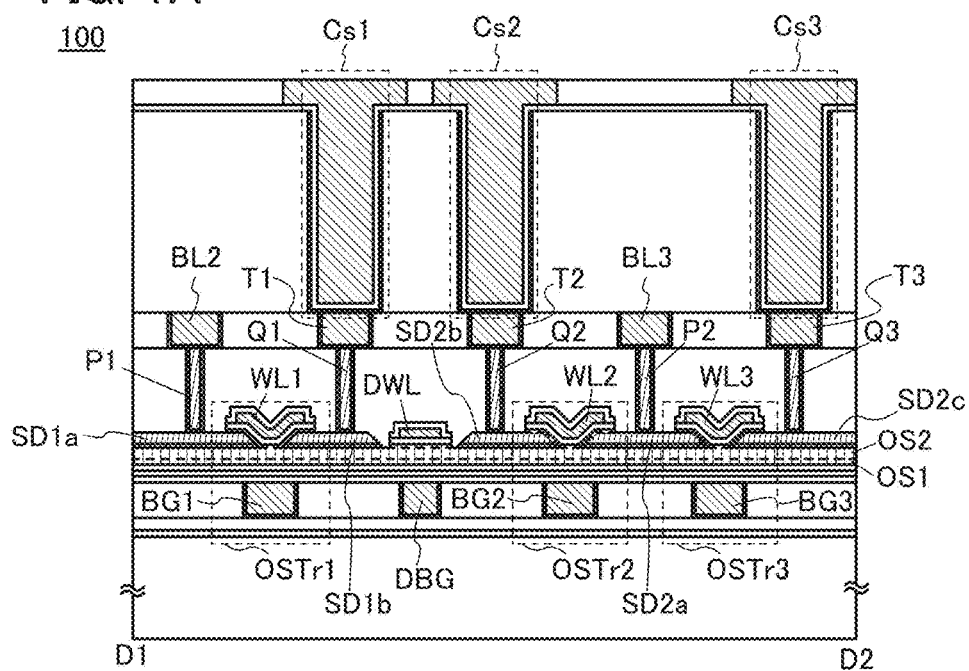
FIGS. 1A and 1B are a cross-sectional view and a top view illustrating an example of a semiconductor device.
Figure 1B:
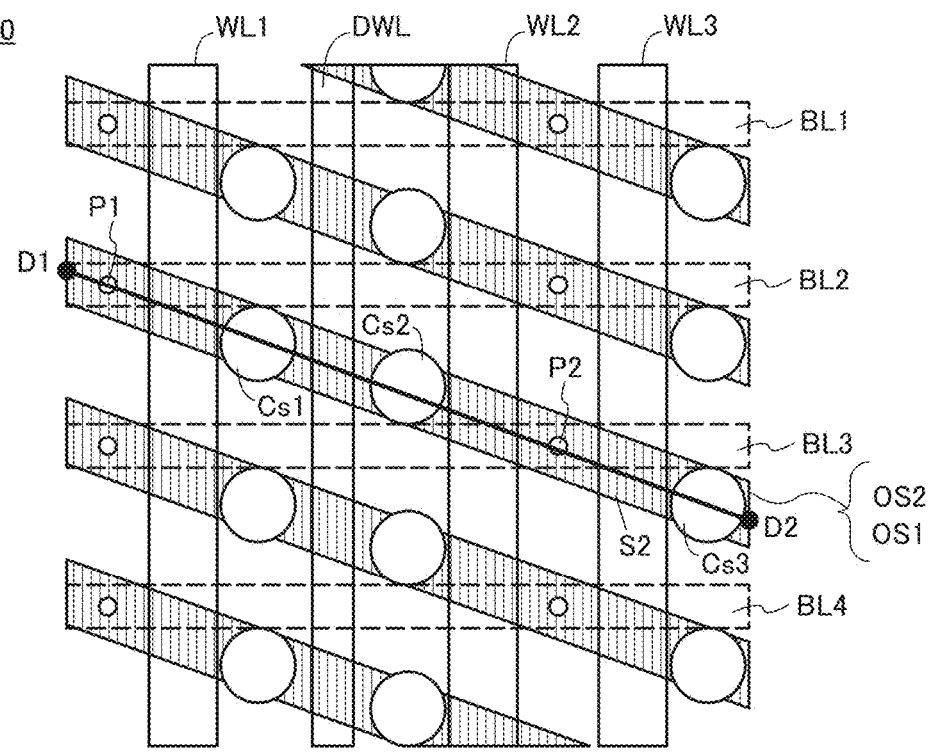

Next described is a configuration in which a plurality of memory cells each corresponding to the memory cell in FIG. 3A is arranged. A semiconductor device 100 illustrated in FIGS. 1A and 1B has the configuration in which the plurality of memory cells in FIG. 3A is arranged. FIG. 1A is a cross-sectional view of the semiconductor device 100, and FIG. 1B is a top view of the semiconductor device 100. Note that the cross-sectional view of FIG. 1A is taken along a black bold line D1-D2 in the top view of FIG. 1B.

In the cross-sectional view of the semiconductor device 100 in FIG. 1A, a transistor OSTr1, a transistor OSTr2, a transistor OSTr3, a capacitor Cs1, a capacitor Cs2, and a capacitor Cs3 are illustrated. As wirings included in the semiconductor device 100 in FIG. 1A, a wiring BL2, a wiring BL3, a wiring WL1, a wiring WL2, a wiring WL3, a wiring BG1, a wiring BG2, a wiring BG3, a wiring DWL, a wiring DBG, a wiring SD1$a$, a wiring SD1$b$, a wiring SD2$a$, a wiring SD2$b$, a wiring SD2$c$, a conductor P1, a conductor P2, a conductor Q1, a conductor Q2, a conductor Q3, a conductor T1, a conductor T2, and a conductor T3 are illustrated. In addition, as oxide semiconductors included in the semiconductor device 100 in FIG. 1A, an oxide semiconductor OS1 and an oxide semiconductor OS2 are illustrated. Note that in FIG. 1A, regions which are not hatched and do not have reference numerals correspond to insulators.

In the top view of the semiconductor device 100 in FIG. 1B, a wiring BL1, the wiring BL2, the wiring BL3, a wiring BL4, the wiring WL1, the wiring WL2, the wiring WL3, the wiring DWL, the oxide semiconductor OS1, the oxide semiconductor OS2, the capacitor Cs1, the capacitor Cs2, the capacitor Cs3, the conductor P1, the conductor P2, and the black bold line D1-D2 are illustrated, and the other reference numerals are omitted.

The wirings BL1 and BL2 function as bit lines, and the wirings WL1 to WL3 function as word lines. The wiring DWL functions as a first dummy word line, and the wiring DBG functions as a second dummy word line.

Here, the connection structure of the semiconductor device 100 is described with reference to the cross-sectional view in FIG. 1A. Each of the transistors OSTr1 to OSTr3 is a dual-gate transistor including a front gate and a back gate.

The wirings WL1 to WL3 are extended as front gates of the transistors OSTr1 to OSTr3, respectively. The wirings BG1 to BG3 are extended as back gates of the transistors OSTr1 to OSTr3, respectively. The wiring SD1$a$ is provided as one of a source and a drain of the transistor OSTr1, and the wiring SD1$b$ is provided as the other of the source and the drain of the transistor OSTr1. The wiring SD2$a$ is provided as one of a source and a drain of the transistor OSTr2, and the wiring SD2$b$ is provided as the other of the source and the drain of the transistor OSTr2. The wiring SD2$a$ is provided as one of a source and a drain of the transistor OSTr3, and the wiring SD2$c$ is provided as the other of the source and the drain of the transistor OSTr3.

The conductor P1 is positioned over the wiring SD1$a$, and the wiring BL2 is positioned over the conductor P1. That is, the wiring SD1$a$ is electrically connected to the wiring BL2 through the conductor P1. The conductor Q1 is positioned over the wiring SD1$b$, and the conductor T1 is positioned over the conductor Q1. A first terminal of the capacitor Cs1 is positioned over and in contact with the conductor T1. That is, the wiring SD1$b$ is electrically connected to the first terminal of the capacitor Cs1 through the conductor Q1 and the conductor T1.

The conductor P2 is positioned over the wiring SD2$a$, and the wiring BL3 is positioned over the conductor P2. That is, the wiring SD2$a$ is electrically connected to the wiring BL3 through the conductor P2. The conductor Q2 is positioned over the wiring SD2$b$, and the conductor T2 is positioned over the conductor Q2. A first terminal of the capacitor Cs2 is positioned over and in contact with the conductor T2. That is, the wiring SD2$b$ is electrically connected to the first terminal of the capacitor Cs2 through the conductor Q2 and the conductor T2.

The conductor Q3 is positioned over the wiring SD2$c$, and the conductor T3 is positioned over the conductor Q3. A first terminal of the capacitor Cs3 is positioned over and in contact with the conductor T3. That is, the wiring SD2$c$ is electrically connected to the first terminal of the capacitor Cs3 through the conductor Q3 and the conductor T2.

The oxide semiconductor OS1 and the oxide semiconductor OS2 are positioned above the wirings BG1 to BG3 and the wiring DBG, and positioned below the wiring SD1$a$, the wiring SD1$b$, the wiring SD2$a$, the wiring SD2$b$, the wiring SD2$c$, and the wiring DWL. Furthermore, as shown in the cross-sectional view of FIG. 1A and the top view of FIG. 1B, the oxide semiconductor OS1 and the oxide semiconductor OS2 are extended in one direction. The term "one direction" here refers to a direction that is not parallel to the wirings WL1 to WL3, the wirings BL1 to BL4, and the wiring DWL.

Here, the functions of the wiring DWL and the wiring DBG are described. When a high-level potential is applied to the wiring DWL and the wiring DBG, carriers (electrons) are induced in the oxide semiconductor OS1 and the oxide semiconductor OS2, leading to a reduction in the resistance of the oxide semiconductors OS1 and OS2. Meanwhile, when a low-level potential is applied to the wiring DWL and the wiring DBG, a depletion layer is formed in each of the oxide semiconductor OS1 and the oxide semiconductor OS2, leading to an increase in the resistance of the oxide semiconductors OS1 and OS2. In particular, a semiconductor having a wide band gap (a band gap of greater than or equal to 2.2 eV), such as an oxide semiconductor, has a low intrinsic carrier density, so that the amount of current flowing through the depletion layer is significantly small. Therefore, the transistors OSTr1 and OSTr2 can be electrically isolated by keeping a low-level potential supplied to the wiring DWL and the wiring DBG. As a result, the amount of leakage current flowing between the wiring SD1$b$ and the wiring SD2$b$ can be significantly small. Therefore, memory cell isolation can be performed in a region where the wiring DWL and the wiring DBG, which are used as dummy word lines, intersect with the oxide semiconductors OS1 and OS2. Furthermore, the memory cells included in the semiconductor device 100 have a significantly small leakage current of the transistors OSTr1 and OSTr2, and thus the frequency of refresh operations can be reduced. As a result, the power consumption of the semiconductor device 100 can be reduced.

In particular, with the use of a metal oxide 1230$b$, a metal oxide 1432, or a metal oxide 1602 described in Embodiment 7 as the oxide semiconductor OS2, the off-state current flowing in the above-described intersection region can be significantly small when a low-level potential is applied to the wiring DWL and the wiring DBG.

Figure 2:
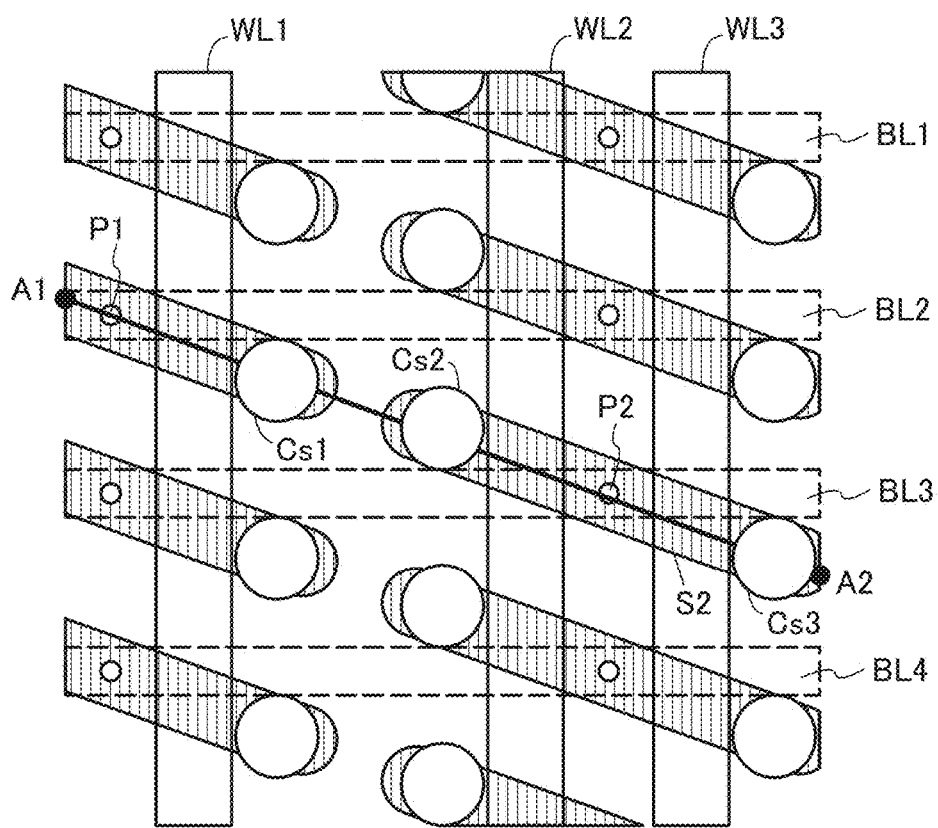
FIG. 2 is a top view illustrating an example of a semiconductor device.

In the case where the wiring DWL and the wiring DBG are not provided and the intersection regions in the oxide semiconductors OS1 and OS2 are removed through a lithography process or the like, end portions of the oxide semiconductors OS1 and OS2 might have round shapes as illustrated in FIG. 2 because of the optical proximity effect. In particular, as miniaturization of the memory device advances, this effect is enhanced in some cases. In that case, variations in characteristics of formed transistor might occur.

To prevent this, as described above, the wiring DWL and the wiring DBG may be provided as shown in FIGS. 1A and 1B and the memory cell isolation may be performed. Thus, it is possible to provide a semiconductor device in which both miniaturization and small variations in characteristics of transistors are achieved.

Figure 4:
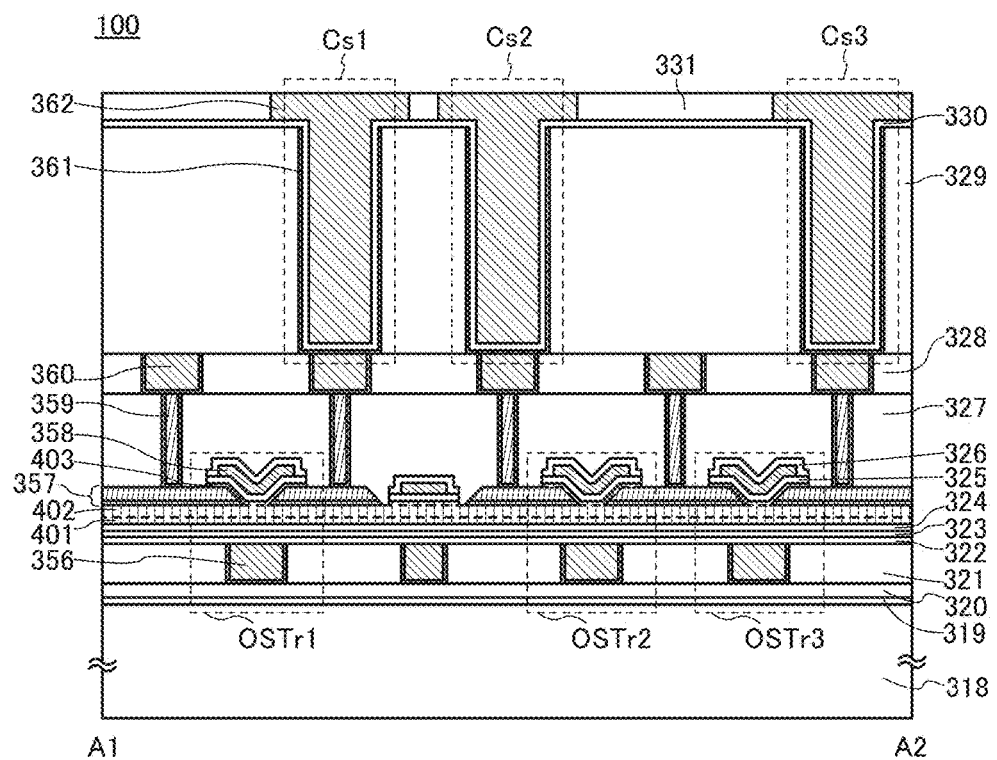
FIG. 4 is a cross-sectional view illustrating an example of a semiconductor device.

Next, conductors (wirings), insulators, and oxide semiconductors included in the semiconductor device 100 illustrated in FIG. 1A are described. In FIG. 4, the conductors (wirings), the insulators, and the oxide semiconductors illustrated in the cross-sectional view of the semiconductor device 100 in FIG. 1A are denoted by reference numerals.

The semiconductor device 100 includes insulators to 318 to 331, conductors 356 to 362, and oxide semiconductors 401 to 403.

The insulator 318 is formed with a single-layer structure or a stacked-layer structure using silicon oxide, silicon oxynitride, silicon nitride oxide, silicon nitride, aluminum oxide, aluminum oxynitride, aluminum nitride oxide, or aluminum nitride, for example. The insulator 318 is preferably formed using silicon nitride containing oxygen and hydrogen (SiNOH) because the amount of hydrogen released by heating can be increased. The insulator 318 can also be formed using silicon oxide with high step coverage that is formed by reacting tetraethyl orthosilicate (TEOS), silane, or the like with oxygen, nitrous oxide, or the like.

The insulator 318 can be formed by a sputtering method, a CVD method (including a thermal CVD method, an MOCVD method, and a PECVD method), an MBE method, an ALD method, or a PLD method, for example. In particular, the insulator is formed preferably by a CVD method, more preferably a plasma CVD method because coverage can be further improved. A thermal CVD method, an MOCVD method, or an ALD method is preferably used to reduce plasma damage.

The insulator 319 is positioned over the insulator 318. The insulator 320 is positioned over the insulator 319. In particular, the insulators 319 and 320 preferably have a barrier property against hydrogen and oxygen. The insulators 319 and 320 can be formed using a material and a method similar to those used for forming the insulator 318.

The insulator 319 is preferably formed with, for example, a metal oxide such as an aluminum oxide, a hafnium oxide, or a tantalum oxide. In particular, as an example of the film having a barrier property against hydrogen, an aluminum oxide formed by an ALD method is more preferably used. A dense insulator whose defects such as cracks or pinholes are reduced or an insulator having a uniform thickness can be formed by an ALD method.

The insulator 320 is preferably formed with, for example, a metal oxide such as an aluminum oxide, a hafnium oxide, or a tantalum oxide. In particular, as an example of the film having a barrier property against hydrogen, an aluminum oxide formed by a sputtering method is more preferred.

The insulator 321 is positioned over the insulator 320. The insulator 321 is preferably formed with, for example, a silicon oxide, a silicon nitride, or a silicon oxynitride. In particular, as an example of the film having a barrier property against hydrogen, silicon nitride formed by a CVD method is more preferred.

The conductor 356 is positioned over the insulator 320 and on a side surface of the insulator 321. As a material of the conductor 356, a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, it is preferable to use a low-resistance conductive material such as aluminum or copper. The use of a low-resistance conductive material can reduce wiring resistance.

Like the gate electrode described in <Transistor structure example 1> in Embodiment 7, the conductor 356 preferably has a two-layer structure or a stacked-layer structure of three or more layers. For example, as a conductor having a barrier property against hydrogen, a tantalum nitride layer or the like may be formed as the first layer and a tungsten layer having high conductivity may be stacked as the second layer over the insulator 320 and on the side surface of the insulator 321.

The conductor 356 functions as the wiring BG1, the wiring BG2, the wiring BG3, and the wiring DBG of the semiconductor device 100 in FIGS. 1A and 1B.

The insulator 322 is positioned over the insulator 321 and the conductor 356. The insulator 323 is positioned over the insulator 322. The insulator 324 is positioned over the insulator 323.

For the details of the insulator 322, the insulator 323, and the insulator 324, description of an insulator 1220, an insulator 1222, and an insulator 1224 in <Transistor structure example 1> in Embodiment 7 is referred to.

The oxide semiconductor 401 is positioned over the insulator 324. The oxide semiconductor 402 is positioned over the oxide semiconductor 401. For the details of a material of the oxide semiconductor 401, description of a metal oxide 1230a in <Transistor structure example 1> in Embodiment 7 is referred to. For the details of a material of the oxide semiconductor 402, description of the metal oxide 1230b in <Transistor structure example 1> in Embodiment 7 is referred to.

The conductor 357 is positioned in a region that does not overlap with the conductor 356. Note that part of the conductor 357 may be positioned in a region overlapping with the conductor 356 as long as not the whole of the region overlapping with the conductor 356 is covered with the conductor 357. The conductor 357 functions as the wiring SD1a, the wiring SD1b, the wiring SD2a, the wiring SD2b, and the wiring SD2c of the semiconductor device 100 in FIGS. 1A and 1B. Note that the conductor 357 preferably has a two-layer structure or a three-layer structure. For example, a stacked-layer structure of a conductor 1241a or a conductor 1241b and a conductor 1240a or a conductor 1240b which is described in <Transistor structure example 1> in Embodiment 7 is preferred. When the conductor 357 has a stacked-layer structure, as materials of the conductor 357, a material of the conductor 1240a or the conductor 1240b described in Embodiment 7 and a material of the conductor 1241a or the conductor 1241b described in Embodiment 7 may be used.

The oxide semiconductor 403 is positioned over the oxide semiconductor 402 and part of the conductor 357. For the details of a material of the oxide semiconductor 403, description of a metal oxide 1230c in <Transistor structure example 1> in Embodiment 7 is referred to.

The insulator 325 is positioned over the oxide semiconductor 403. The conductor 358 is positioned over part of the insulator 325. The insulator 326 is positioned over the insulator 325 and the conductor 358.

For the details of the insulator 325, the conductor 358, and the insulator 326, descriptions of an insulator 1250, a conductor 1260, and an insulator 1270, respectively, in <Transistor structure example 1> in Embodiment 7 are referred to.

The insulator 327 is positioned over the conductor 357, on a side surface of the oxide semiconductor 403, a side surface of the insulator 325, and a side surface and a top surface of the insulator 326, and over the oxide semiconductor 402.

For the details of the insulator 327, description of an insulator 1280 in <Transistor structure example 1> in Embodiment 7 is referred to.

The conductor 359 is positioned over the conductor 357 and on a side surface of the insulator 327. For a material and a formation method of the conductor 359, description of a material and a formation method of the conductor 356 is referred to.

The insulator 328 is positioned over the insulator 327. The insulator 328 can be formed using a material and a method similar to those of the insulator 318.

The conductor 360 is positioned on a side surface of the conductor 359, over the insulator 327, and on a side surface of the insulator 328. For a material and a formation method of the conductor 360, description of a material and a formation method of the conductor 356 is referred to.

Note that the formation method of one embodiment of the present invention is not limited to the method of separately forming the conductor 359 and the conductor 360. In the case where the conductor 359 and the conductor 360 have the same number of layers and formed with the same material, the conductor 359 and the conductor 360 may be formed at the same time.

The insulator 329 is positioned over the insulator 328 and part of the conductor 360. As the insulator 329, a film having a barrier property that prevents diffusion of hydrogen and impurities is preferably used. For example, a silicon oxide, a silicon oxynitride, a silicon nitride oxide, a silicon nitride, an aluminum oxide, an aluminum oxynitride, an aluminum nitride oxide, or an aluminum nitride can be used.

The conductor 361 is positioned over the other part of the conductor 360 (the region of the conductor 360 over which the insulator 329 is not provided) and the insulator 328 and on a side surface of the insulator 329. As a material of the conductor 361, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 361 is formed concurrently with another component such as a conductor, copper, aluminum, or the like which is a low-resistance metal material may be used.

The insulator 330 is over the insulator 329 and a surface of the conductor 361. The insulator 330 has a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

In the case where the insulator 330 has a stacked-layer structure, for example, the stacked-layer structure is preferably formed with a high dielectric constant (high-k) material such as aluminum oxide and a material with high dielectric strength such as silicon oxynitride. Such a structure enables the capacitors Cs1 to Cs3 to have sufficient capacitance due to the insulator with a high dielectric constant (high-k) and increased dielectric strength due to the insulator with high dielectric strength. Thus, the electrostatic breakdown of the capacitors Cs1 to Cs3 can be prevented.

The conductor 362 is positioned over a region overlapping with the conductor 361 with the insulator 330 positioned therebetween. The conductor 362 can be formed using a material and a method similar to those of the conductor 361.

The insulator 331 is positioned over the insulator 330 and on a side surface of the conductor 362. The insulator 331 can be formed using a material and a method similar to those of the insulator 318.

Although not illustrated in FIG. 4, a substrate that supports the semiconductor device 100 is positioned below the insulator 318. Examples of the substrate are a glass substrate, a ceramic substrate, a quartz substrate, and a sapphire substrate. Alternatively, as the substrate, a single crystal semiconductor substrate or a polycrystalline semiconductor substrate of silicon, silicon carbide, or the like, a compound semiconductor substrate of silicon germanium, gallium arsenide, indium arsenide, or indium gallium arsenide, or the like, a silicon-on-insulator (SOI) substrate, a germanium-on-insulator (GOI) substrate, or the like can be used. Further alternatively, any of these substrates provided with a semiconductor element may be used.

Alternatively, a flexible substrate may be used as the substrate. A transistor may be directly formed over a flexible substrate; or alternatively, a transistor may be formed over a substrate and then separated from the substrate and transferred to a flexible substrate. In order that the transistor be separated from the different substrate to be transferred to the flexible substrate, it is preferable to provide a separation layer between the manufacturing substrate and the transistor including an oxide semiconductor.

Such a method makes it possible to obtain a semiconductor device with large storage capacity. Furthermore, with the use of oxide semiconductors for the channel formation regions of the transistors OSTr1 to OSTr3, the off-state current can be significantly small; accordingly, data loss caused by leakage current can be inhibited. Therefore, the frequency of refresh operations can be reduced and a semiconductor device with low power consumption can be achieved.

One embodiment of the present invention is not limited to the above-described structure of the semiconductor device 100. Depending on conditions, circumstances, or necessity, choice of components and circuit connection can be changed. For example, a structure without including the wiring DBG (the structure is not shown) may be employed in the case where the oxide semiconductor OS1 and the oxide semiconductor OS2 in the semiconductor device 100 in FIGS. 1A and 1B can be electrically isolated by only the wiring DWL. In that case, the thickness of each of the oxide semiconductors OS1 and OS2 is preferably small. The structure without including the wiring DBG can reduce the number of wirings in the semiconductor device 100, resulting in a reduction in the area and power consumption of the semiconductor device.

As another example, a structure without including the wirings BG1 to BG3 which function as back gates may be employed in the case where the threshold voltages of the transistors OSTr1 to OSTr3 do not need to be changed. The structure without including the wirings BG1 to BG3 can reduce the number of wirings in the semiconductor device 100, resulting in a reduction in the area and power consumption of the semiconductor device.

<Gain Cell Including Two Transistors and One Capacitor>

Figure 10A:
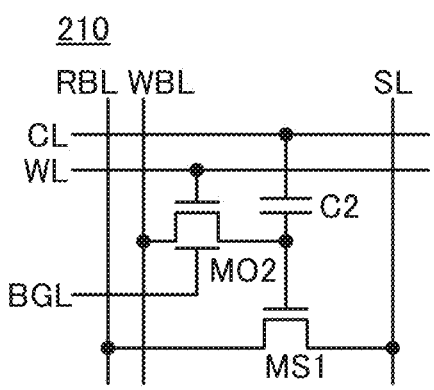
FIGS. 10A to 10C are circuit diagrams illustrating examples of memory cells.

FIG. 10A illustrates a circuit configuration example of a gain cell including two transistors and one capacitor. The details of this circuit configuration will be described in Embodiment 2. The memory cell illustrated in FIG. 10A includes two transistors and one capacitor.

Figure 5A:
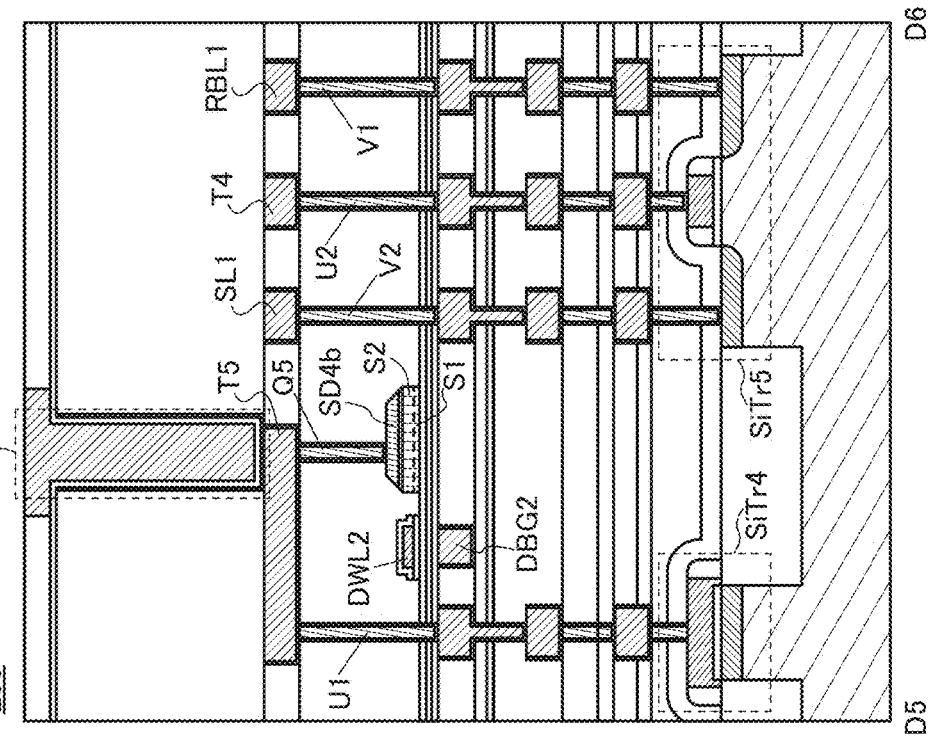
FIGS. 5A and 5B are cross-sectional views illustrating an example of a semiconductor device.
Figure 5B:
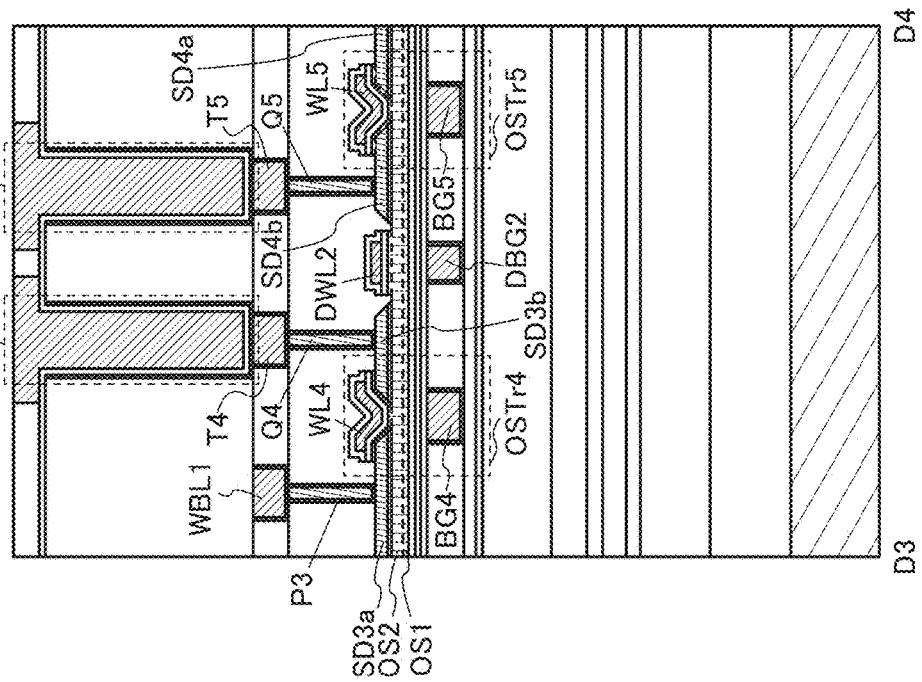
Figure 6:
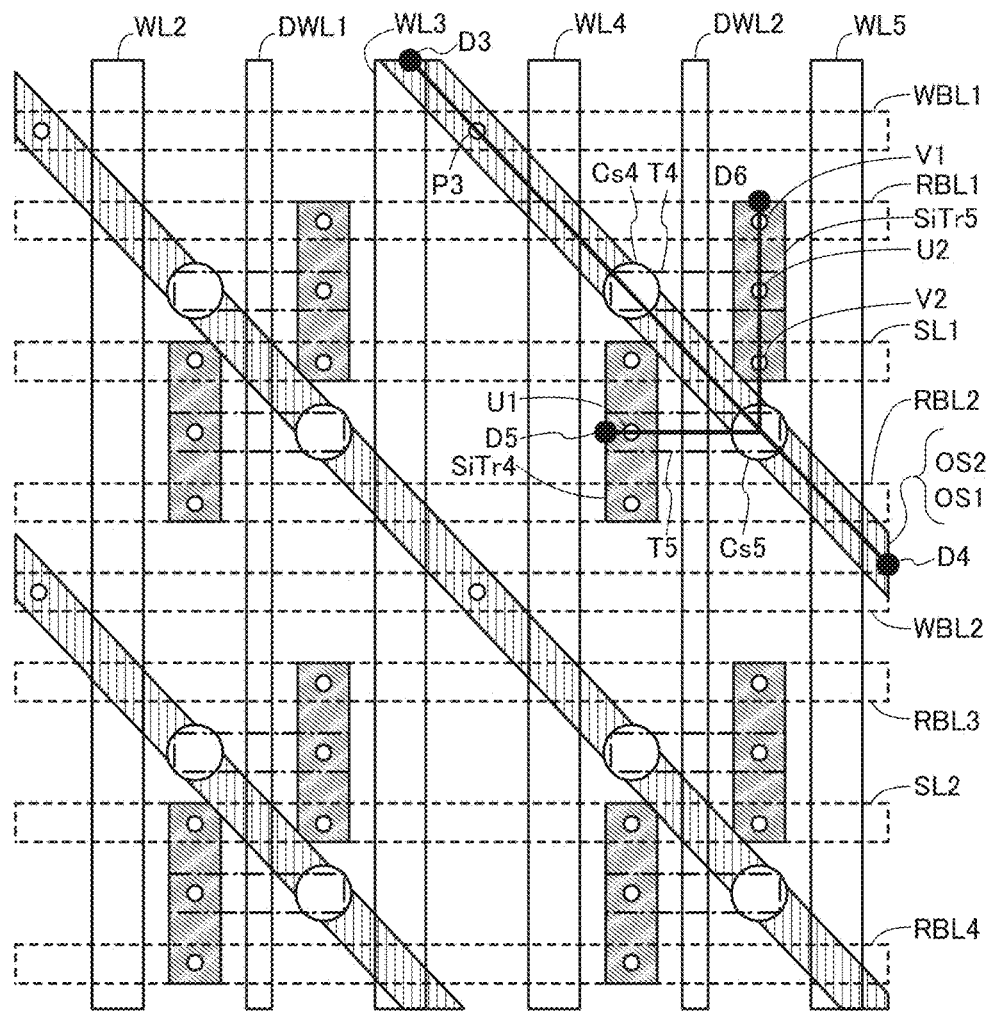
FIG. 6 is a top view illustrating an example of a semiconductor device.

Next described is a configuration in which a plurality of memory cells each corresponding to the memory cell in FIG. 10A is arranged. A semiconductor device 200 illustrated in FIGS. 5A and 5B and FIG. 6 has the configuration in which the plurality of memory cells in FIG. 10A is arranged. FIGS. 5A and 5B are cross-sectional views of the semiconductor device 200, and FIG. 6 is a top view of the semiconductor device 200. Note that the cross-sectional view of FIG. 5A is a view taken along a black bold line D3-D4 in the top view of FIG. 6, and the cross-sectional view of FIG. 5B is a view taken along a black bold line D5-D6 in the top view of FIG. 6.

The semiconductor device 200 illustrated in FIGS. 5A and 5B includes a transistor OSTr4, a transistor OSTr5, a transistor SiTr4, a transistor SiTr5, a capacitor Cs4, and a capacitor Cs5. As wirings included in the semiconductor device 200 in FIGS. 5A and 5B, a wiring WBL1, a wiring RBL1, a wiring SL1, a wiring WL4, a wiring WL5, a wiring BG4, a wiring BG5, a wiring DWL2, a wiring DBG2, a wiring SD3a, a wiring SD3b, a wiring SD4a, a wiring SD4b, a conductor P3, a conductor Q4, a conductor Q5, a conductor T4, a conductor T5, a conductor U1, a conductor U2, a conductor V1, and a conductor V2 are illustrated. In addition, as oxide semiconductors included in the semiconductor device 200 in FIGS. 5A and 5B, the oxide semiconductor OS1 and the oxide semiconductor OS2 are illustrated. Note that reference numerals of conductors and wirings in the vertical direction to which the conductors U1, U2, V1, and V2 are electrically connected are omitted. Note that in FIGS. 5A and 5B, regions which are not hatched and do not have reference numerals correspond to insulators.

In the top view of the semiconductor device 200 in FIG. 6, the wiring WL2, a wiring DWL1, the wiring WL3, the wiring WL4, the wiring DWL2, the wiring WL5, the wiring WBL1, the wiring RBL1, the wiring SL1, a wiring RBL2, a wiring WBL2, a wiring RBL3, a wiring SL2, a wiring RBL4, the oxide semiconductor OS1, the oxide semiconductor OS2, the capacitor Cs4, the capacitor Cs5, the conductor P3, the conductor T4, the conductor T5, the conductor U1, the conductor U2, the conductor V1, the conductor V2, the black bold line D3-D4, the black bold line D5-D6, the transistor SiTr4, and the transistor SiTr5 are illustrated, and the other reference numerals are omitted.

The wirings WL2 to WL5 function as word lines, the wirings WBL1 and WBL2 function as write bit lines, and the wirings RBL1 to RBL4 function as read bit lines. The wirings SL1 and SL2 supply a predetermined potential to elements electrically connected to the wirings SL1 and SL2. Each of the wirings DWL1 and DWL2 functions as the first dummy word line, and the wiring DBG2 functions as the second dummy word line.

Here, the connection structure of the semiconductor device 200 is described with reference to the cross-sectional views in FIGS. 5A and 5B. Each of the transistors OSTr4 to OSTr5 is a dual-gate transistor including a front gate and a back gate.

The wirings WL4 and WL5 are extended as front gates of the transistors OSTr4 and OSTr5, respectively. The wirings BG4 to BG5 are extended as back gates of the transistors OSTr4 and OSTr5, respectively. The wiring SD3a is provided as one of a source and a drain of the transistor OSTr4, and the wiring SD3b is provided as the other of the source and the drain of the transistor OSTr4. The wiring SD4a is provided as one of a source and a drain of the transistor OSTr5, and the wiring SD4b is provided as the other of the source and the drain of the transistor OSTr5.

The conductor P3 is positioned over the wiring SD3a, and the wiring WBL1 is positioned over the conductor P3. That is, the wiring SD3a is electrically connected to the wiring WBL1 through the conductor P3. The conductor Q4 is positioned over the wiring SD3b, and the conductor T4 is positioned over the conductor Q4. A first terminal of the capacitor Cs4 is positioned over and in contact with the conductor T4. That is, the wiring SD3b is electrically connected to the first terminal of the capacitor Cs4 through the conductor Q4 and the conductor T4.

The conductor Q5 is positioned over the wiring SD4b, and the conductor T5 is positioned over the conductor Q5. A first terminal of the capacitor Cs5 is positioned over and in contact with the conductor T5. That is, the wiring SD4b is electrically connected to the first terminal of the capacitor Cs5 through the conductor Q5 and the conductor T5.

The oxide semiconductor OS1 and the oxide semiconductor OS2 are positioned above the wirings BG4 and BG5 and the wiring DBG2, and positioned below the wiring SD3a, the wiring SD3b, the wiring SD4a, the wiring SD4b, and the wiring DWL2. Furthermore, as shown in the cross-sectional view of FIG. 5A and the top view of FIG. 5B and the top view of FIG. 6, the oxide semiconductor OS1 and the oxide semiconductor OS2 are extended in one direction. The term "one direction" here refers to a direction that is not parallel to the wirings WL2 to WL5, the wirings WBL1 and WBL2, the wirings RBL1 to RBL4, the wirings SL1 and SL2, and the wiring DWL.

The wirings DWL1, DWL2, and DBG2 are wirings for electrically isolating the transistor OSTr4 and the transistor OSTr5. This element isolation can be performed by keeping a low-level potential supplied to the wirings DWL1, DWL2, and DBG2 in a manner similar to the method of element isolation between the transistors OSTr1 and OSTr2 in the above description of <Memory cell for DRAM> by which a low-level potential is kept supplied to the wirings DWL and DBG. For the behavior of carriers in the oxide semiconductors OS1 and OS2 at this time, the description of the element isolation in <Memory cell for DRAM> is referred to. Furthermore, the memory cells included in the semiconductor device 200 have a significantly small leakage current of the transistors OSTr4 and OSTr5, and thus the frequency of refresh operations can be reduced, as in the semiconductor device 100. As a result, the power consumption of the semiconductor device 200 can be reduced.

In particular, with the use of a metal oxide 1230b, a metal oxide 1432, or a metal oxide 1602 described in Embodiment 7 as the oxide semiconductor OS2, the off-state current flowing in a region where the oxide semiconductor OS2 intersects with the wiring DWL2 and the wiring DBG2 can be significantly small when a low-level potential is applied to the wiring DWL2 and the wiring DBG2.

Next, conductors (wirings), insulators, and oxide semiconductors included in the semiconductor device 200 illustrated in FIGS. 5A and 5B and FIG. 6 are described. In FIGS. 7A and 7B, the conductors (wirings), the insulators, and the oxide semiconductors illustrated in the cross-sectional view of the semiconductor device 200 in FIGS. 5A and 5B are denoted by reference numerals.

The semiconductor device 200 includes the substrate 301, insulators to 311 to 331, conductors 351 to 362, and the oxide semiconductors 401 to 403.

The transistor SiTr4 and the transistor SiTr5 are formed over the substrate 301. The transistor SiTr5 includes the conductor 351, the insulator 311, a semiconductor region 302 that is part of the substrate 301, a low-resistance region 303a that functions as one of a source region and a drain region, and a low-resistance region 303b that functions as the other of the source region and the drain region.

Figure 10B:
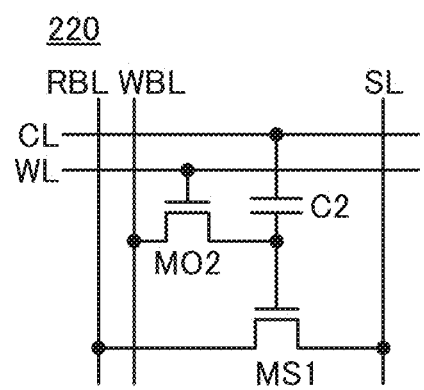
Figure 10C:
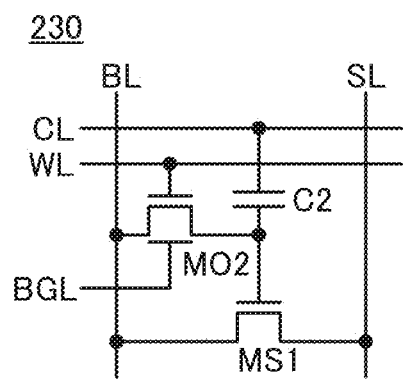

The transistor SiTr4 or the transistor SiTr5 can be used as the transistor MS1 in FIGS. 10A to 10C. Although the transistor MS1 is an n-channel transistor in FIGS. 10A to 10C, the transistor MS1 may be a p-channel transistor depending on conditions or circumstances. In other words, each of the transistors SiTr4 and SiTr5 may be either an n-channel transistor or a p-channel transistor.

A channel formation region of the semiconductor region 302, a region around the channel formation region, the low-resistance regions 308a and 308b serving as a source region and a drain region, and the like contain preferably a semiconductor such as a silicon-based semiconductor, more preferably single crystal silicon. Alternatively, they may contain a material containing germanium (Ge), silicon germanium (SiGe), gallium arsenide (GaAs), gallium aluminum arsenide (GaAlAs), or the like. They may contain silicon whose effective mass is controlled by applying stress to the crystal lattice and thereby changing the lattice spacing. Alternatively, the transistor SiTr4 and/or the transistor SiTr5 may be a high-electron-mobility transistor (HEMT) using GaAs and GaAlAs, or the like.

The low-resistance regions 303a and 303b contain an element that imparts n-type conductivity (e.g., arsenic or phosphorus) or an element that imparts p-type conductivity (e.g., as boron) in addition to a semiconductor material used for the semiconductor region 302.

The conductor 351 functioning as a gate electrode can be formed using a semiconductor material such as silicon containing an element that imparts n-type conductivity (e.g., arsenic or phosphorus) or an element that imparts p-type conductivity (e.g., boron), or a conductive material such as a metal material, an alloy material, or a metal oxide material.

Note that the threshold voltage of the transistor can be adjusted by setting the work function of the gate electrode with a material of the conductor. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Although the transistor SiTr4 and the transistor SiTr5 in FIG. 7B are planar transistors, FIN-type transistors may be employed.

The insulator 312 covers the transistor SiTr4 and the transistor SiTr5. The insulator 313 is positioned over the insulator 312, an insulator 314 is positioned over the insulator 313, and an insulator 315 is positioned over the insulator 314.

The insulators 312, 313, 314, and 315 can be formed with, for example, silicon oxide, silicon oxynitride, silicon nitride oxide, silicon nitride, aluminum oxide, aluminum oxynitride, aluminum nitride oxide, aluminum nitride, or the like.

Specifically, the insulator 312 is formed with a single-layer structure or a stacked-layer structure using silicon oxide, silicon oxynitride, silicon nitride oxide, silicon nitride, aluminum oxide, aluminum oxynitride, aluminum nitride oxide, or aluminum nitride, for example. The insulator 312 is preferably formed using silicon nitride containing oxygen and hydrogen (SiNOH) because the amount of hydrogen released by heating can be increased. The insulator 312 can also be formed using silicon oxide with high step coverage that is formed by reacting tetraethyl orthosilicate (TEOS), silane, or the like with oxygen, nitrous oxide, or the like.

The insulator 312 can be formed by a sputtering method, a CVD method (including a thermal CVD method, an MOCVD method, and a PECVD method), an MBE method, an ALD method, or a PLD method, for example. In particular, the insulator is formed preferably by a CVD method, more preferably a plasma CVD method because coverage can be further improved. A thermal CVD method, an MOCVD method, or an ALD method is preferably used to reduce plasma damage.

A film having a barrier property is preferably used as the insulator 314 to prevent hydrogen and impurities from diffusing from, for example, the substrate 301 or the transistors SiTr4 and SiTr5 into regions where the transistor OSTr4 and the transistor OSTr5 are provided.

As an example of the film having a barrier property against hydrogen, a silicon nitride film formed by a CVD method can be given. In the case where the transistor OSTr4 and the transistor OSTr5 include an oxide semiconductor, hydrogen might be diffused into the transistor OSTr4 and the transistor OSTr5 and the diffused hydrogen might degrade the semiconductor element characteristics. Accordingly, a film that suppresses hydrogen diffusion is preferably provided between the transistors OSTr4 and OSTr5 and the transistors SiTr4 and SiTr5.

Note that the dielectric constant of the insulator 315 is preferably lower than that of the insulator 314. For example, the relative dielectric constant of the insulator 315 is preferably lower than 4, more preferably lower than 3. For example, the relative dielectric constant of the insulator 314 is preferably 0.7 times or less that of the insulator 315, more preferably 0.6 times or less that of the insulator 315. In the case where a material with a low dielectric constant is used for an interlayer film, the parasitic capacitance between wirings can be reduced.

Conductors 352 are provided in openings in the insulator 312 and the insulator 313, and are positioned over the low-resistance region 303*a*, the low-resistance region 303*b*, and the conductor 351. A conductor 353 is positioned over the conductor 352, the insulator 313, on a side surface of the insulator 314, and a side surface of the insulator 315. As materials of the conductors 352 and 353, a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, it is preferable to use a low-resistance conductive material such as aluminum or copper. The use of a low-resistance conductive material can reduce wiring resistance.

A wiring layer can be provided above the insulator 315 and the conductor 353. For example, in FIGS. 7A and 7B, an insulator 316, an insulator 317, and an insulator 318 are stacked sequentially. Furthermore, a conductor 354 and a conductor 355 are formed in the insulator 316, the insulator 317, and the insulator 318. The conductors 354 and 355 function as wirings. Note that the conductors 354 and 355 can be formed with materials similar to those of the conductors 352 and 353.

Note that for example, the insulator 316 is preferably formed with an insulator having a barrier property against hydrogen, like the insulator 314. Furthermore, the conductors 354 and 355 preferably include a conductor having a barrier property against hydrogen. In particular, a conductor having a barrier property against hydrogen is preferably formed in an opening of the insulator 316 having a barrier property against hydrogen. With the above structure, the transistor OSTr4 and the transistor OSTr5, and the transistor SiTr4 and the transistor SiTr5 can be isolated by the layers having a barrier property, whereby hydrogen diffusion from the transistors OSTr4 and OSTr5 to the transistors SiTr4 and SiTr5 can be suppressed.

Note that as the conductor having a barrier property against hydrogen, tantalum nitride may be used, for example. By stacking tantalum nitride and tungsten, which has high conductivity, the diffusion of hydrogen from the transistors OSTr4 and OSTr5 can be inhibited while the conductivity of a wiring is ensured. In this case, a tantalum nitride layer having a barrier property against hydrogen is preferably in contact with the insulator 316 having a barrier property against hydrogen.

The insulator 318 can be formed using a material and a method similar to those of the insulator 312.

The insulator 319 is positioned over the insulator 318. The insulator 320 is positioned over the insulator 319. In particular, the insulators 319 and 320 preferably have a barrier property against hydrogen and oxygen. The insulators 319 and 320 can be formed using a material and a method similar to those used for forming the insulator 312.

The insulator 319 can be formed using a material and a method similar to those used for forming the insulator 319 in the above description of <Memory cell for DRAM>.

The insulator 320 can be formed using a material and a method similar to those used for forming the insulator 320 in the above description of <Memory cell for DRAM>.

The insulator 321 is positioned over the insulator 320. The insulator 321 can be formed using a material and a method similar to those used for forming the insulator 321 in the above description of <Memory cell for DRAM>.

The conductor 356 is positioned over the insulator 320 and on a side surface of the insulator 321. As a material of the conductor 356, a material similar to that of the conductor 356 in the above description of <Memory cell for DRAM> can be used.

Note that the structure of the conductor 356 can be similar to that of the conductor 356 in the above description of <Memory cell for DRAM>.

The conductor 356 functions as the wiring BG4, the wiring BG5, and the wiring DBG2 of the semiconductor device 200 illustrated in FIGS. 5A and 5B.

The insulator 322 is positioned over the insulator 321 and the conductor 356. The insulator 323 is positioned over the insulator 322. The insulator 324 is positioned over the insulator 323.

As in the above description of <Memory cell for DRAM>, for the details of the insulator 322, the insulator 323, and the insulator 324, the description of the insulator 1220, the insulator 1222, and the insulator 1224 in <Transistor structure example 1> in Embodiment 7 is referred to.

The oxide semiconductor 401 is positioned over the insulator 324. The oxide semiconductor 402 is positioned over the oxide semiconductor 401. As in the above description of <Memory cell for DRAM>, for the details of a material of the oxide semiconductor 401, the description of the metal oxide 1230*a* in <Transistor structure example 1> in Embodiment 7 is referred to. For the details of a material of the oxide semiconductor 402, the description of the metal oxide 1230*b* in <Transistor structure example 1> in Embodiment 7 is referred to.

The conductor 357 is positioned in a region that does not overlap with the conductor 356. Note that part of the conductor 357 may be positioned in a region overlapping with the conductor 356 as long as not the whole of the region overlapping with the conductor 356 is covered with the conductor 357. The conductor 357 functions as the wiring SD3*a*, the wiring SD3*b*, the wiring SD4*a*, and the wiring SD4*b* of the semiconductor device 200 in FIGS. 5A and 5B. For a structure and a material of the conductor 357, the conductor 357 in the above description of <Memory cell for DRAM> is referred to.

The oxide semiconductor 403 is positioned over the oxide semiconductor 402 and part of the conductor 357. As in the description of <Memory cell for DRAM>, for the details of a material of the oxide semiconductor 403, description of the metal oxide 1230*c* in <Transistor structure example 1> in Embodiment 7 is referred to.

The insulator 325 is positioned over the oxide semiconductor 403. The conductor 358 is positioned over part of the insulator 325. The insulator 326 is positioned over the insulator 325 and the conductor 358.

As in the description of <Memory cell for DRAM>, for the details of the insulator 325, the conductor 358, and the insulator 326, descriptions of the insulator 1250, the conductor 1260, and the insulator 1270, respectively, in <Transistor structure example 1> in Embodiment 7 are referred to.

The insulator 327 is positioned over the conductor 357, on a side surface of the oxide semiconductor 403, a side surface of the insulator 325, and a side surface and a top surface of the insulator 326, and over the oxide semiconductor 402.

As in the description of <Memory cell for DRAM>, for the details of the insulator 327, description of the insulator 1280 in <Transistor structure example 1> in Embodiment 7 is referred to.

The conductor 359 is positioned over the conductor 357 and on a side surface of the insulator 327. For a material and a formation method of the conductor 359, description of a material and a formation method of the conductor 356 is referred to.

The insulator 328 is positioned over the insulator 327. The insulator 328 can be formed using a material and a method similar to those of the insulator 312.

The conductor 360 is positioned on a side surface of the conductor 359, over the insulator 327, and on a side surface of the insulator 328. For a material and a formation method of the conductor 360, description of a material and a formation method of the conductor 356 is referred to.

Note that the formation method of one embodiment of the present invention is not limited to the method of separately forming the conductor 359 and the conductor 360. In the case where the conductor 359 and the conductor 360 have the same number of layers and formed with the same material, the conductor 359 and the conductor 360 may be formed at the same time.

The insulator 329 is positioned over the insulator 328 and part of the conductor 360. As a material of the insulator 329, a material similar to that of the insulator 329 in the above description of <Memory cell for DRAM> can be used.

The conductor 361 is positioned over the other part of the conductor 360 (the region of the conductor 360 over which the insulator 329 is not provided) and the insulator 328 and on a side surface of the insulator 328. As a material of the conductor 361, a material similar to that of the conductor 361 in the above description of <Memory cell for DRAM> can be used.

The insulator 330 is over the insulator 329 and a surface of the conductor 361. As a material of the insulator 330, a material similar to that of the insulator 330 in the above description of <Memory cell for DRAM> can be used. In addition, the insulator 330 can have a single-layer structure or a stacked-layer structure like the insulator 330 in the above description of <Memory cell for DRAM>.

The conductor 362 is positioned over a region overlapping with the conductor 361 with the insulator 330 positioned therebetween. The conductor 362 can be formed using a material and a method similar to those of the conductor 361.

The insulator 331 is positioned over the insulator 330 and on a side surface of the conductor 362. The insulator 331 can be formed using a material and a method similar to those of the insulator 312.

Such a method makes it possible to obtain a semiconductor device with large storage capacity. Furthermore, with the use of oxide semiconductors for the channel formation regions of the transistors OSTr4 and OSTr5, the off-state current can be significantly small; accordingly, data loss caused by leakage current can be inhibited. Therefore, the frequency of refresh operations can be reduced and a semiconductor device with low power consumption can be achieved. Alternatively, a semiconductor device that does not need a refresh operation can be achieved.

Figure 9:
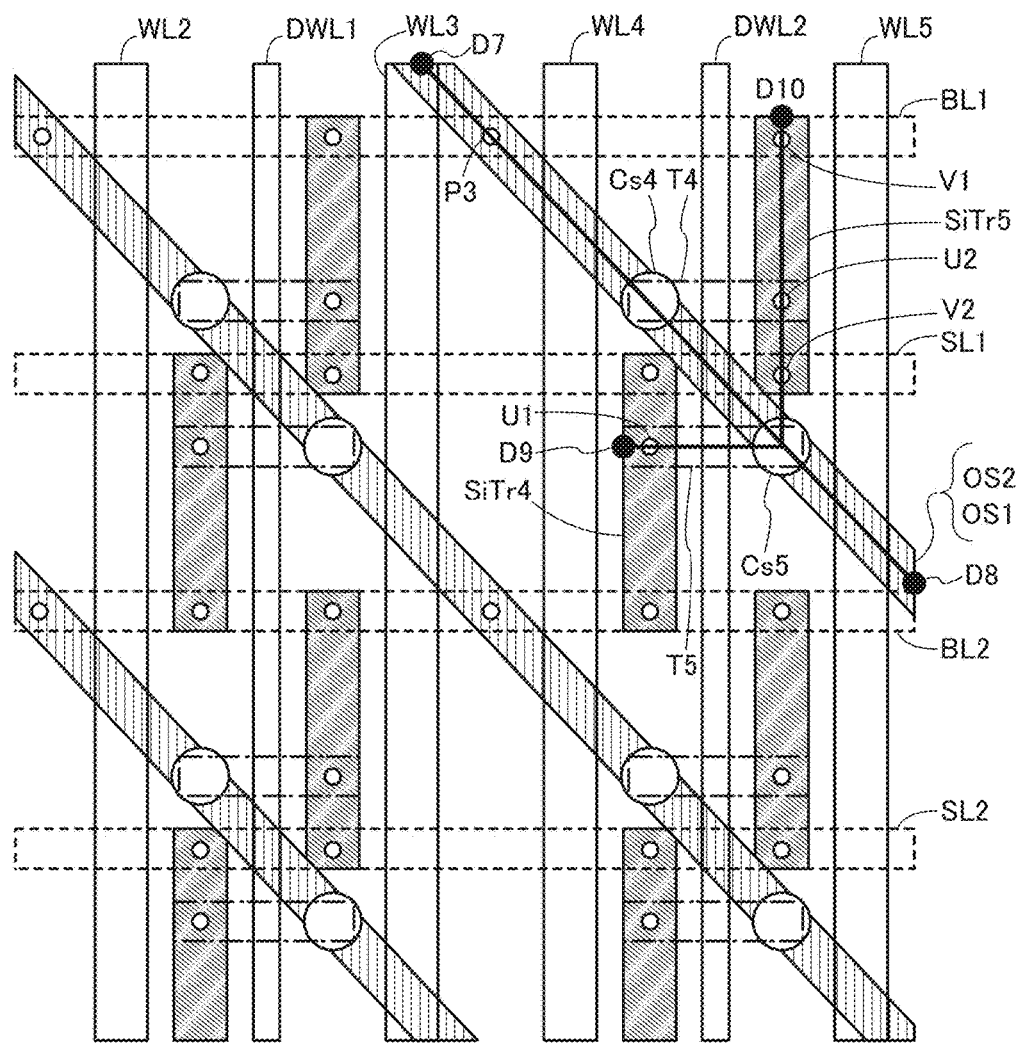
FIG. 9 is a top view illustrating an example of a semiconductor device.

One embodiment of the present invention is not limited to the above-described structure of the semiconductor device 200. Depending on conditions, circumstances, or necessity, choice of elements, element connection, choice of wirings, wiring connection, choice of components, and circuit connection can be changed. For example, one bit line may be used as the write bit line and the read bit line of the semiconductor device 200. A semiconductor device with such a structure is illustrated in FIGS. 8A and 8B and FIG. 9. A semiconductor device 201 has a structure in which one bit line is used as a write bit line and a read bit line. Specifically, the wiring BL1 of the semiconductor device 201 corresponds to the wiring WBL1 and the wiring RBL1 of the semiconductor device 200, and a wiring BL2 of the semiconductor device 201 corresponds to the wiring WBL2, the wiring RBL2, and the wiring RBL3 of the semiconductor device 200. A bit line (not illustrated in FIGS. 8A and 8B and FIG. 9) of the semiconductor device 201 corresponds to the wiring RBL4 and a write word line (not illustrated) of the semiconductor device 200. Such a structure can increase the number of memory cells per unit area, resulting in a memory device with a large storage capacity. The cross-sectional view of FIG. 8A is a view taken along the black bold line D7-D8 in the top view of FIG. 9. The cross-sectional view of FIG. 8B is a view taken along a black bold line D9-D10 in the top view of FIG. 9.

For example, a structure without including the wiring DBG2 (the structure is not shown) may be employed in the case where the oxide semiconductor OS1 and the oxide semiconductor OS2 in the semiconductor device 200 in FIGS. 5A and 5B can be electrically isolated by only the wiring DWL2. In that case, the thickness of each of the oxide semiconductors OS1 and OS2 is preferably small. The structure without including the wiring DBG2 can reduce the number of wirings in the semiconductor device 200, resulting in a reduction in the area and power consumption of the semiconductor device.

As another example, in the case where threshold voltages of the transistors OSTr4 and OSTr5 do not need to be changed, a structure without including the wiring BG4 and the wiring BG5 which function as back gates may be employed. The structure without including the wirings BG4 and BG5 can reduce the number of wirings in the semiconductor device 200, resulting in a reduction in the area and power consumption of the semiconductor device.

In this embodiment, one embodiment of the present invention has been described. Other embodiments of the present invention will be described in the other embodiments. Note that one embodiment of the present invention is not limited to the above examples. In other words, various embodiments of the invention are described in this embodiment and the other embodiments, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited thereto. Depending on the circumstances or conditions, a variety of semiconductors may be used for transistors in one embodiment of the present invention, the channel formation regions of the transistors, the source and drain regions of the transistors, and the like. Depending on the circumstances or conditions, transistors in one embodiment of the present invention, the channel formation regions of the transistors, the source and drain regions of the transistors, and the like may include, for example, at least one of silicon, germanium, silicon germanium, silicon carbide, gallium arsenide, aluminum gallium arsenide, indium phosphide, gallium nitride, and an organic semiconductor. Depending on the circumstances or case, transistors in one embodiment of the present invention, the channel formation regions of the transistors, the source and drain regions of the transistors, and the like do not necessarily include an oxide semiconductor.

Note that this embodiment can be combined with any of the other embodiments in this specification as appropriate.

Embodiment 2

In this embodiment, memory cells that can be used in the semiconductor device 100 described in Embodiment 1 are described.

<Memory Cell for DRAM>

FIG. 3A illustrates a circuit configuration example of a memory cell for a DRAM. A memory cell 110 includes a transistor MO1 and a capacitor C1. The transistor MO1 is a dual-gate transistor and includes a front gate (simply referred to as gate in some cases) and a back gate.

A first terminal of the transistor MO1 is electrically connected to a first terminal of the capacitor C1. A second terminal of the transistor MO1 is electrically connected to a wiring BL. A gate of the transistor MO1 is electrically connected to a wiring WL. A back gate of the transistor MO1 is electrically connected to a wiring BGL. A second terminal of the capacitor C1 is electrically connected to a wiring CL.

The wiring BL functions as a bit line, and the wiring WL functions as a word line. The wiring CL functions as a wiring for applying a predetermined potential to the second terminal of the capacitor C1. In the time of data writing and data reading, a low-level potential (also referred to as reference potential in some cases) is preferably applied to the wiring CL.

The wiring BGL functions as a wiring for applying a predetermined potential to the back gate of the transistor MO1. By applying the predetermined potential to the wiring BGL, the threshold voltage of the transistor MO1 can be changed.

Data writing and data reading are performed in such a manner that a high-level potential is applied to the wiring WL to turn on the transistor MO1, and thus the wiring BL is electrically connected to the first terminal of the capacitor C1.

Figure 3B:
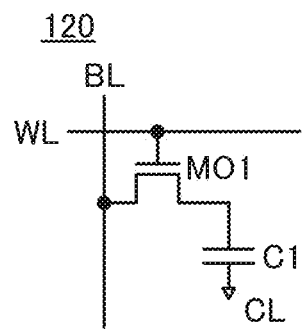

A memory cell that can be used in the semiconductor device 100 described in Embodiment 1 is not limited to the memory cell 110. Depending on conditions, circumstances, or necessity, choice of components and circuit connection can be changed. For example, a memory cell including the transistor MO1 without the back gate can be used. A circuit configuration example of such a memory cell is illustrated in FIG. 3B. A memory cell 120 has a configuration in which the back gate is subtracted from the transistor MO1 of the memory cell 110. The semiconductor device 100 including the memory cell 120 has a configuration of the semiconductor device 100 illustrated in FIG. 1A from which the wiring BG1, the wiring BG2, and the wiring BG3 are subtracted (not illustrated).

Note that the circuit configuration of the memory cell 110 illustrated in FIG. 3A corresponds to that of the memory cell in the semiconductor device 100 in FIGS. 1A and 1B. The transistor MO1 in FIG. 3A corresponds to the transistor OSTr1, OSTr2, or OSTr3 in FIG. 1A.

<Gain Cell Including Two Transistors and One Capacitor>

FIG. 10A illustrates a circuit configuration example of a gain cell including two transistors and one capacitor. A memory cell 210 includes a transistor MO2, a transistor MS1, and a capacitor C2. The transistor MO2 is a dual-gate transistor and includes a front gate (simply referred to as gate in some cases) and a back gate.

A first terminal of the transistor MO2 is electrically connected to a first terminal of the capacitor C2. A second terminal of the transistor MO2 is electrically connected to a wiring WBL. A gate of the transistor MO2 is electrically connected to the wiring WL. A back gate of the transistor MO2 is electrically connected to the wiring BGL. A second terminal of the capacitor C2 is electrically connected to the wiring CL. A first terminal of the transistor MS1 is electrically connected to a wiring RBL, a second terminal of the transistor MS1 is electrically connected to a wiring SL, and a gate of the transistor MS1 is electrically connected to a first terminal of the capacitor C2.

The wiring WBL functions as a bit line, the wiring RBL functions as a read bit line, and the wiring WL functions as a word line. The wiring CL functions as a wiring for applying a predetermined potential to the second terminal of the capacitor C2. In the time of data writing, data retaining, and data reading, a low-level potential (also referred to as reference potential in some cases) is preferably applied to the wiring CL.

The wiring BGL functions as a wiring for applying a predetermined potential to the back gate of the transistor MO2. By applying the predetermined potential to the wiring BGL, the threshold voltage of the transistor MO2 can be changed.

Data writing is performed in such a manner that a high-level potential is applied to the wiring WL to turn on the transistor MO2, and thus the wiring WBL is electrically connected to the first terminal of the capacitor C2. Specifically, when the transistor MO2 is on, a potential corresponding to information to be written is applied to the wiring WBL, so that the potential is written to the first terminal of the capacitor C2 and the gate of the transistor MS1. Then, a low-level potential is applied to the wiring WL to turn off the transistor MO2, whereby the potential of the first terminal of the capacitor C2 and the potential of the gate of the transistor MS1 are retained.

Data reading is performed by applying a predetermined potential to the wiring SL. A current flowing between a source and a drain of the transistor MS1 and the potential of the first terminal of the transistor MS1 are determined by the potential of the gate of the transistor MS1 and a potential of the second terminal of the transistor MS1. Therefore, by reading a potential of the wiring RBL connected to the first terminal of the transistor MS1, a potential retained in the first terminal of the capacitor C2 (or the gate of the transistor MS1) can be read. That is, information written in the memory cell can be read on the basis of the potential retained in the first terminal of the capacitor C2 (or the gate of the transistor MS1).

Note that the circuit configuration of the memory cell 210 illustrated in FIG. 10A corresponds to that of the memory cell in the semiconductor device 200 in FIGS. 5A and 5B and FIG. 6. The transistor MO2 in FIG. 10A corresponds to the transistor OSTr4 or OSTr5 in FIG. 5A. Specifically, when the transistor MO2 corresponds to the transistor OSTr5, the transistor MS1 corresponds to the transistor SiTr4.

The memory cell that can be used in the semiconductor device 200 described in Embodiment 1 is not limited to the memory cell 210. For example, a memory cell including the transistor MO2 without the back gate can be used. A circuit configuration example of such a memory cell is illustrated in FIG. 10B. A memory cell 220 has a configuration in which the back gate is subtracted from the transistor MO2 of the memory cell 210. The semiconductor device 200 including the memory cell 220 has a configuration of the semiconductor device 200 illustrated in FIG. 5A from which the wiring BG4 and the wiring BG5 are subtracted (not illustrated).

Furthermore, for example, one wiring BL may be used as the wiring WBL and the wiring RBL. A circuit configuration example of such a memory cell is illustrated in FIG. 10C. A memory cell 230 includes one wiring BL instead of the wiring WBL and the wiring RBL of the memory cell 210. In the memory cell 230, the second terminal of the transistor MO2 and the first terminal of the transistor MS1 are electrically connected to the wiring BL. In that case, the wiring WBL1 and the wiring RBL1 of the semiconductor device 200 illustrated in FIGS. 5A and 5B and FIG. 6 correspond to one wiring BL in FIGS. 8A and 8B and FIG. 9, and the wiring WBL2 and the wiring RBL2 of the semiconductor device 200 correspond to one wiring BL in FIGS. 8A and 8B and FIG. 9.

<Gain Cell Including Three Transistors and One Capacitor>

In addition to the above-described memory cell for a DRAM and the above-described gain cell including two transistors and one capacitor, although not described in Embodiment 1, a circuit configuration of a memory cell capable of element isolation is considered. As an example, a gain cell including three transistors and one capacitor is described.

Figure 11A:
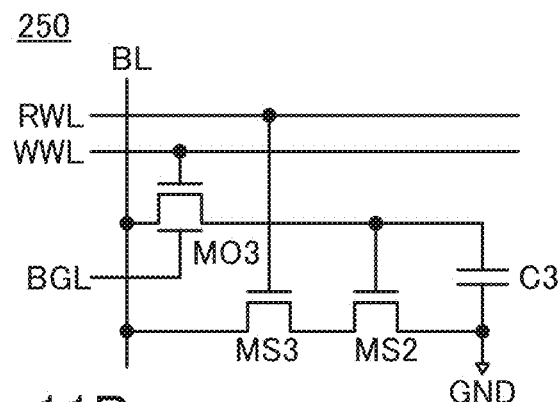
FIGS. 11A and 11B are circuit diagrams illustrating examples of memory cells.

FIG. 11A illustrates a gain cell including three transistors and one capacitor. A memory cell 250 includes a transistor MO3, a transistor MS2, a transistor MS3, and a capacitor C3. The transistor MO3 is a dual-gate transistor and includes a front gate (simply referred to as gate in some cases) and a back gate.

A first terminal of the transistor MO3 is electrically connected to a first terminal of the capacitor C3. A second terminal of the transistor MO3 is electrically connected to the wiring BL. A gate of the transistor MO3 is electrically connected to a wiring WWL. A back gate of the transistor MO3 is electrically connected to the wiring BGL. A second terminal of the capacitor C3 is a first terminal of the transistor MS2 and a wiring GND. A second terminal of the transistor MS2 is electrically connected to a first terminal of the transistor MS3, and a gate of the transistor MS2 is electrically connected to a first terminal of the capacitor C3. A second terminal of the transistor MS3 is electrically connected to the wiring BL, and a gate of the transistor MS3 is electrically connected to a wiring RWL.

The wiring BL functions as a bit line, the wiring WWL functions as a write word line, and the wiring RWL functions as a read word line.

The wiring BGL functions as a wiring for applying a predetermined potential to the back gate of the transistor MO3. By applying the predetermined potential to the wiring BGL, the threshold voltage of the transistor MO3 can be changed.

The wiring GND supplies a low-level potential.

Data writing is performed in such a manner that a high-level potential is applied to the wiring WWL to turn on the transistor MO3, and thus the wiring BL is electrically connected to the first terminal of the capacitor C3. Specifically, when the transistor MO3 is on, a potential corresponding to information to be written is applied to the wiring BL, so that the potential is written to the first terminal of the capacitor C3 and the gate of the transistor MS2. Then, a low-level potential is applied to the wiring WWL to turn off the transistor MO3, whereby the potential of the first terminal of the capacitor C3 and the potential of the gate of the transistor MS2 are retained.

Data reading is performed in such a manner that the wiring BL is precharged to a predetermined potential, and then the wiring BL is brought into an electrically floating state and a high-level potential is applied to the wiring RWL. The high-level potential of the wiring RWL turns on the transistor MS3, whereby the wiring BL is electrically connected to the second terminal of the transistor MS2. At this time, the potential of the wiring BL is applied to the second terminal of the transistor MS2, but the potential of the second terminal of the transistor MS2 and the potential of the wiring BL are changed in accordance with a potential retained in the first terminal of the capacitor C3 (or the gate of the transistor MS2). By reading a potential of the wiring BL, a potential retained in the first terminal of the capacitor C3 (or the gate of the transistor MS2) can be read. That is, information written in the memory cell can be read on the basis of the potential retained in the first terminal of the capacitor C3 (or the gate of the transistor MS2).

<Memory Cell for SRAM>

In addition to the memory cell for a DRAM and the above-described gain cell including two transistors and one capacitor, although not described in Embodiment 1, a circuit configuration of a memory cell capable of element isolation is considered. As an example, a static random access memory (SRAM) is described.

Figure 11B:
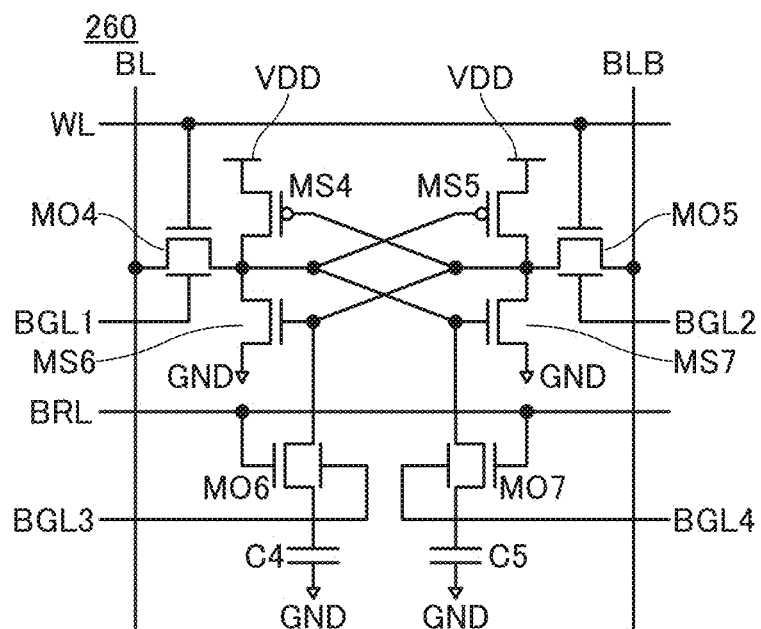

FIG. 11B illustrates an example of an SRAM memory cell. A memory cell 260 illustrated in FIG. 11B is an SRAM memory cell capable of a backup operation. The memory cell 260 includes a transistor MO4, a transistor MO5, a transistor MO6, a transistor MO7, a transistor MS4, a transistor MS5, a transistor MS6, a transistor MS7, a capacitor C4, and a capacitor C5. Note that each of the transistors MO4 to MO7 is a dual-gate transistor and includes a front gate (simply referred to as gate in some cases) and a back gate. The transistors MS4 and MS5 are p-channel transistors, and the transistors MS6 and MS7 are n-channel transistors.

A first terminal of the transistor MO4 is electrically connected to the wiring BL. A second terminal of the transistor MO4 is electrically connected to a first terminal of the transistor MS4, a first terminal of the transistor MS6, a gate of the transistor MS5, a gate of the transistor MS7, and a first terminal of the transistor MO6. A gate of the transistor MO4 is electrically connected to the wiring WL. A back gate of the transistor MO4 is electrically connected to a wiring BGL1. A first terminal of the transistor MO5 is electrically connected to a wiring BLB. A second terminal of the transistor MO5 is electrically connected to a first terminal of the transistor MS5, a first terminal of the transistor MS7, a gate of the transistor MS4, a gate of the transistor MS6, and a first terminal of the transistor MO7. A gate of the transistor MO5 is electrically connected to the wiring WL. A back gate of the transistor MO5 is electrically connected to a wiring BGL2.

A second terminal of the transistor MS4 is electrically connected to a wiring VDD. A second terminal of the transistor MS5 is electrically connected to the wiring VDD. A second terminal of the transistor MS6 is electrically connected to the wiring GND. A second terminal of the transistor MS7 is electrically connected to the wiring GND.

A second terminal of the transistor MO6 is electrically connected to a first terminal of the capacitor C4. A gate of the transistor MO6 is electrically connected to a wiring BRL. A back gate of the transistor MO6 is electrically connected to a wiring BGL3. A second terminal of the transistor MO7 is electrically connected to a first terminal of the capacitor C5. A gate of the transistor MO7 is electrically connected to the wiring BRL. A back gate of the transistor MO7 is electrically connected to a wiring BGL4.

A second terminal of the capacitor C4 is electrically connected to the wiring GND. A second terminal of the capacitor C5 is electrically connected to the wiring GND.

The wiring BL and the wiring BLB function as bit lines. The wiring WL functions as a word line. The wiring BRL controls on/off states of the transistors MO6 and MO7.

The wirings BGL1 to BGL4 function as wirings for applying a predetermined potential to back gates of the transistors MO4 to MO7, respectively. By applying the predetermined potential to the wirings BGL1 to BGL4, the threshold voltages of the transistors MO4 to MO7 can be changed.

The wiring VDD supplies a high-level potential. The wiring GND supplies a low-level potential.

Data writing is performed by applying a high-level potential to the wiring WL and the wiring BRL. Specifically, when the transistor MO4 is on, a potential corresponding to information to be written is applied to the wiring BL, whereby the potential is written to the second terminal of the transistor MO4.

In the memory cell 260, the transistors MS4 to MS7 form an inverter loop. Thus, an inversion signal of a data signal corresponding to the potential is input to the second terminal of the transistor MO5. Since the transistor MO5 is on, an inversion signal of the potential that has been applied to the wiring BL (i.e., the signal that has been input to the wiring BL) is output to the wiring BLB. Since the transistor MO6 and the transistor MO7 are on, a potential of the second terminal of the transistor MO4 is input to the first terminal of the capacitor C4, and a potential of the second terminal of the transistor MO5 is retained in the first terminal of the capacitor C5. Then, a low-level potential is applied to the wiring WL and the wiring BRL to turn off the transistors MO4 to MO7, whereby the first terminal of the capacitor C4 retains the potential of the second terminal of the transistor MO5 and the first terminal of the capacitor C5 retains the potential of the second terminal of the transistor MO4.

Data reading is performed in such a manner that the wiring BL and the wiring BLB are precharged to a predetermined potential, a high-level potential is applied to the wiring WL and the wiring BRL, and a potential of the first terminal of the capacitor C4 is refreshed by the inverter loop in the memory cell 260 and output to the wiring BLB. Furthermore, a potential of the first terminal of the capacitor C5 is refreshed by the inverter loop in the memory cell 260 and output to the wiring BL. Since the potentials of the wiring BL and the wiring BLB are changed from the precharged potentials to the potentials of the first terminal of the capacitor C5 and the first terminal of the capacitor C4, the potential retained in the memory cell can be read on the basis of the potentials of the wiring BL and the wiring BLB.

For channel formation regions in the transistors MO1 to MO7 described in this embodiment, an oxide semiconductor including any one of indium, element M (element M represents aluminum, gallium, yttrium, or tin), and zinc is preferably used. In particular, an oxide semiconductor including indium, gallium, and zinc is preferred. A transistor formed with the oxide semiconductor including indium, gallium, and zinc has a significantly small off-state current characteristics; thus, when such transistors are used as the transistors MO1 to MO7, leakage current of the transistors MO1 to MO7 can be significantly small. That is, written data can be retained for a long time in the transistors MO1 to MO7, so that the frequency of refresh operations of the memory cell can be reduced. Alternatively, the refresh operation of the memory cell becomes unnecessary.

Note that this embodiment can be combined with any of the other embodiments in this specification as appropriate.

Embodiment 3

A configuration example of a memory device of one embodiment of the present invention will be described with reference to FIG. 12.

Figure 12:
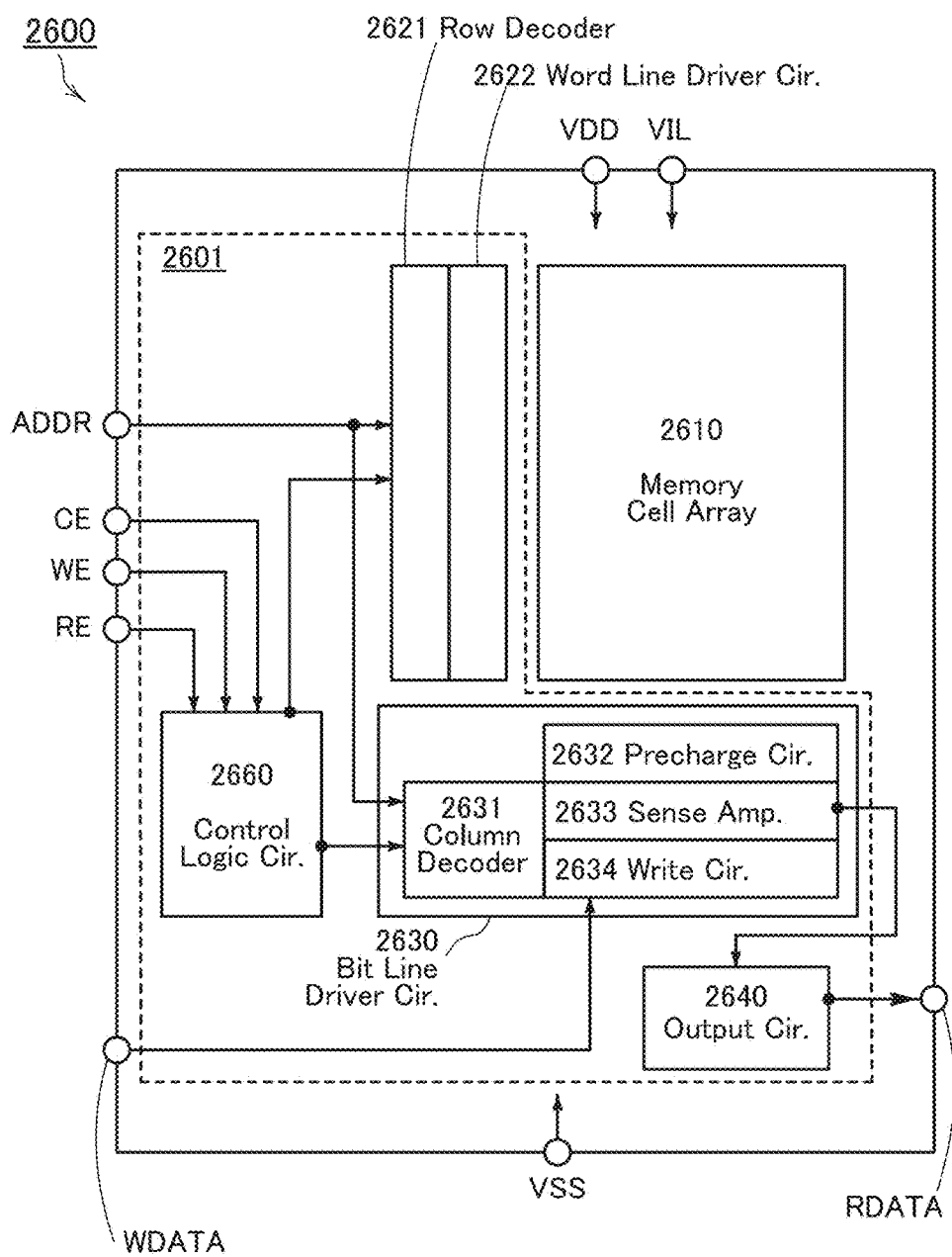
FIG. 12 is a block diagram illustrating an example of a memory device.

FIG. 12 shows one example of a structure of a memory device. A memory device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660.

The bit line driver circuit 2630 includes a column decoder 2631, a precharge circuit 2632, a sense amplifier 2633, and a write circuit 2634. The precharge circuit 2632 has a function of precharging the wiring BL (not shown in FIG. 12) described in Embodiment 1 and Embodiment 2. The sense amplifier 2633 has a function of amplifying a data signal read from the wiring BL. The amplified data signal is output as a digital data signal RDATA to the outside of the memory device 2600 through the output circuit 2640.

As power source voltages, a low power source voltage (VSS), a high power source voltage (VDD) for the peripheral circuit 2601, and a high power source voltage (VIL) for the memory cell array 2610 are supplied to the memory device 2600 from the outside.

Control signals (CE, WE, and RE), an address signal ADDR, and a data signal WDATA are input to the memory device 2600 from the outside. The address signal ADDR is input to the row decoder 2621 and the column decoder 2631, and the data signal WDATA is input to the write circuit 2634.

The control logic circuit 2660 processes the signals (CE, WE, RE) input from the outside, and generates control signals for the row decoder 2621 and the column decoder 2631. The signal CE is a chip enable signal, the signal WE is a write enable signal, and the signal RE is a read enable signal. Signals processed by the control logic circuit 2660 are not limited to those listed above, and other control signals may be input as necessary.

Note that whether each circuit or each signal described above is provided or not can be determined as appropriate as needed.

When a p-channel Si transistor and a transistor including a channel formation region using an oxide semiconductor (preferably an oxide containing In, Ga, and Zn) described in Embodiment below are used in the memory device 2600, the memory device 2600 can be reduced in size. In addition, the memory device 2600 can be reduced in power consumption. Furthermore, the memory device 2600 can be increased in operation speed. Particularly when the Si transistors are only p-channel ones, the manufacturing cost can be reduced.

Note that the configuration of this embodiment is not limited to that shown in FIG. 12. The configuration may be changed as appropriate: for example, part of the peripheral circuit 2601, e.g., the precharge circuit 2632 and/or the sense amplifier 2633 may be provided below the memory cell array 2610.

Note that this embodiment can be combined with any of the other embodiments in this specification as appropriate.

Embodiment 4

In this embodiment, examples in which the semiconductor device described in any of the above embodiments is used as a memory device in an electronic component and in an electronic device including the electronic component are described with reference to FIGS. 13A to 13E and FIGS. 14A to 14H.

<Electronic Component>

FIG. 13A shows an example in which the semiconductor device described in any of the above embodiments is used as a memory device in an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A semiconductor device including the transistors described in Embodiments 1 and 3 is completed through an assembly process (post-process) of integrating detachable components on a printed board.

The post-process can be finished through the steps in FIG. 13A. Specifically, after an element substrate obtained in the preceding process is completed (Step STP1), a rear surface of the substrate is ground (Step STP2). The substrate is thinned in this step to reduce warpage or the like of the substrate in the preceding process and to reduce the size of the component itself.

After the rear surface of the substrate is ground, a dicing step is performed to divide the substrate into a plurality of chips. Then, the divided chips are separately picked up to be mounted on and bonded to a lead frame in a die bonding process (Step STP3). In this die bonding process, the chip is bonded to the lead frame by an appropriate method depending on a product, for example, bonding with a resin or a tape. Note that in the die bonding process, the chip may be mounted on an interposer to be bonded.

Note that in this embodiment, when an element is formed on a surface of a substrate, the other surface is referred to as a rear surface (a surface on which the element is not formed).

Next, wiring bonding for electrically connecting a lead of the lead frame and an electrode on a chip through a metal wire is performed (Step STP4). A silver line or a gold line can be used as the metal fine line. Ball bonding or wedge bonding can be used as the wire bonding.

A wire-bonded chip is subjected to a molding step of sealing the chip with an epoxy resin or the like (Step STP5). With the molding step, the inside of the electronic component is filled with a resin, thereby reducing damage to the circuit portion and the wire embedded in the component caused by external mechanical force as well as reducing deterioration of characteristics due to moisture or dust.

Next, plate processing is performed on the lead of the lead frame. Then, the lead is cut and processed into a predetermined shape (Step STP6). This plate processing prevents rust of the lead and facilitates soldering at the time of mounting the chip on a printed wiring board in a later step.

Next, printing (marking) is performed on a surface of the package (Step STP7). After a final testing step (Step STP8), the electronic component is completed (Step STP9).

The above electronic component can include the semiconductor device described in the above embodiment. Thus, a highly reliable electronic component can be obtained.

FIG. 13B is a schematic perspective view of the completed electronic component. FIG. 13B shows a schematic perspective diagram of a quad flat package (QFP) as an example of the electronic component. An electronic component 4700 in FIG. 13B includes a lead 4701 and a circuit portion 4703. The electronic component 4700 in FIG. 13B is mounted on a printed board 4702, for example. A plurality of electronic components 4700 which are combined and electrically connected to each other over the printed board 4702 can be mounted on an electronic device. A completed circuit board 4704 is provided in an electronic device or the like.

One embodiment of the present invention is not limited to the shape of the electronic component 4700, and the element substrate fabricated in Step STP1 is included. In addition, the element substrate of one embodiment of the present invention includes an element substrate that has been subjected to Step STP2 where the rear surface of the substrate is ground. For example, a semiconductor wafer 4800 or the like shown in FIG. 13C corresponds to the element substrate. In the semiconductor wafer 4800, a plurality of circuit portions 4802 are formed on a top surface of a wafer 4801. A part without the circuit portions 4802 on the top surface of the wafer 4801 is a spacing 4803 that is a region for dicing.

The dicing is carried out along scribe lines SCL1 and scribe lines SCL2 (referred to as dicing line or cutting line in some cases) indicated by dashed-dotted lines. For performing the dicing step easily, the spacing 4803 is preferably provided such that a plurality of scribe lines SCL1 are parallel to each other, a plurality of scribe lines SCL2 are parallel to each other, and the scribe lines SCL1 and the scribe lines SCL2 are intersected perpendicularly with each other.

With the dicing step, a chip 4800a as shown in FIG. 13D can be cut out from the semiconductor wafer 4800. The chip 4800a includes a wafer 4801a, the circuit portion 4802, and a spacing 4803a. Note that it is preferable to provide the spacing 4803a to be made as small as possible. In this case, it is preferable that the width of the spacing 4803 between adjacent circuit portions 4802 be substantially the same as a length of margin for cutting of the scribe line SCL1 or the scribe line SCL2.

The shape of the element substrate of one embodiment of the present invention is not limited to the shape of the semiconductor wafer 4800 shown in FIG. 13C. For example, a rectangular semiconductor wafer 4810 shown in FIG. 13E can be employed. The shape of the element substrate can be changed as appropriate, depending on a process for fabricating an element and an apparatus for fabricating an element.

<Electronic Device>

Next, electronic devices including the aforementioned electronic component will be described.

A semiconductor device of one embodiment of the present invention can be used for a display device, a personal computer, or an image reproducing devices provided with recording media (typically, devices that reproduce the content of recording media such as digital versatile discs (DVDs) and have displays for displaying the reproduced images). Other than the above, as electronic devices which can be equipped with the semiconductor device of one embodiment of the present invention, mobile phones, portable game machines, portable information terminals, e-book readers, video cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), vending machines, medical devices, and the like can be given. FIGS. 14A to 14H illustrate specific examples of these electronic devices.

Figure 14A:
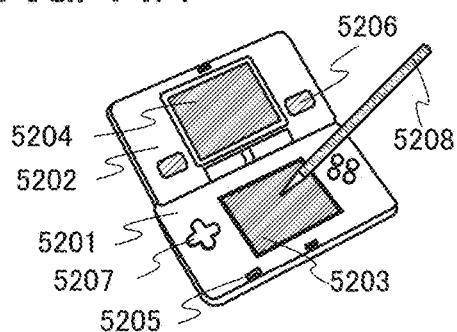
FIGS. 14A to 14H are perspective views illustrating examples of electronic devices.

FIG. 14A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 14A has the two display portions 5203 and 5204, the number of display portions included in a portable game machine is not limited to this.

Figure 14B:
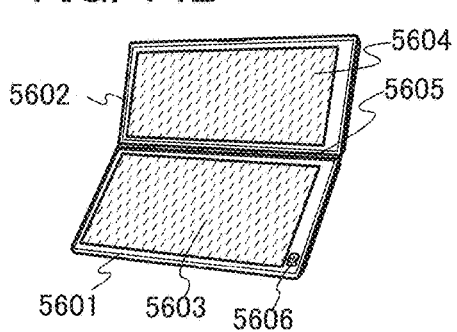

FIG. 14B illustrates a personal digital assistant, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 14C:
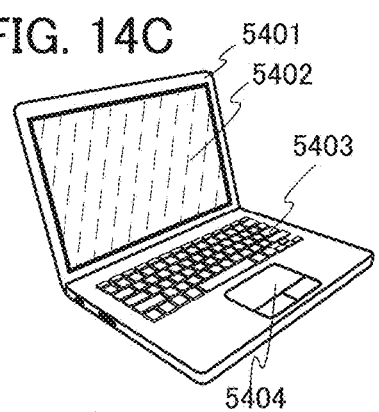

FIG. 14C illustrates a notebook personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 14D:
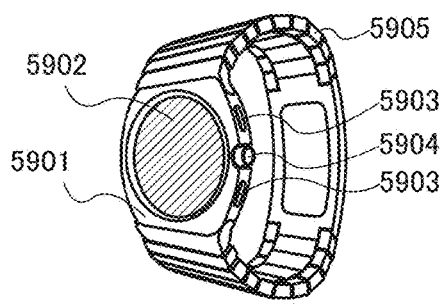

FIG. 14D illustrates a smart watch which is one of wearable terminals. The smart watch includes a housing 5901, a display portion 5902, operation buttons 5903, an operator 5904, and a band 5905. The semiconductor device of one embodiment of the present invention can be used for a variety of integrated circuits included in the smart watch. A display device with a position input function may be used as a display portion 5902. Note that the position input function can be added by provision of a touch panel in a display device. Alternatively, the position input function can be added by providing a photoelectric conversion element called a photosensor in a pixel area of a display device. As the operation buttons 5903, any one of a power switch for starting the smart watch, a button for operating an application of the smart watch, a volume control button, a switch for turning on or off the display portion 5902, and the like can be used. Although the smart watch in FIG. 14D includes two operation buttons 5903, the number of the operation buttons included in the smart watch is not limited to two. The operator 5904 functions as a crown performing time adjustment in the smart watch. The operator 5904 may be used as an input interface for operating an application of the smart watch as well as the crown for a time adjustment. Although the smart watch illustrated in FIG. 14D includes the operator 5904, one embodiment of the present invention is not limited thereto and the operator 5904 is not necessarily provided.

Figure 14E:
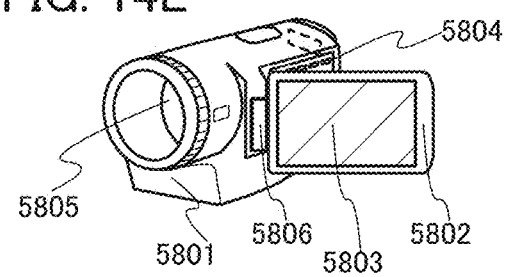

FIG. 14E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 14F:
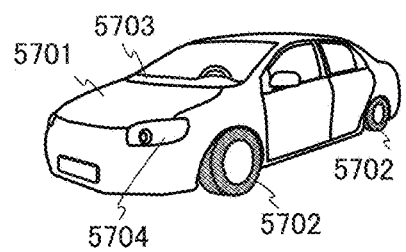

FIG. 14F illustrates a passenger car including a car body 5701, wheels 5702, a dashboard 5703, lights 5704, and the like. The semiconductor device of one embodiment of the present invention can be used for a variety of integrated circuits included in cars.

Figure 14G:
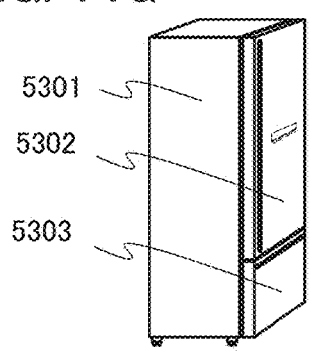

FIG. 14G illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 14H:
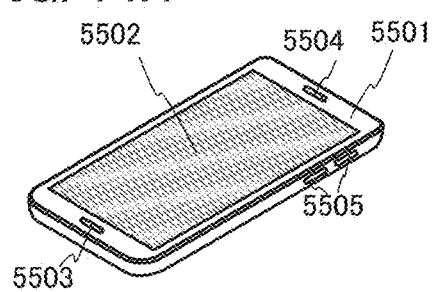

FIG. 14H is a mobile phone having a function of an information terminal. The mobile phone includes a housing 5501, a display portion 5502, a microphone 5503, a speaker 5504, and operation buttons 5505. A display device with a position input function may be used as the display portion 5502. Note that the position input function can be added by provision of a touch panel in a display device. Alternatively, the position input function can be added by providing a photoelectric conversion element called a photosensor in a pixel area of a display device. As operation buttons 5505, any one of a power switch for starting the mobile phone, a button for operating an application of the mobile phone, a volume control button, a switch for turning on or off the display portion 5502, and the like can be used. Although the mobile phone in FIG. 14H includes two operation buttons 5505, the number of the operation buttons included in the mobile phone is not limited to two. Although not illustrated, the mobile phone illustrated in FIG. 14H may be provided with a camera. Although not illustrated, the mobile phone illustrated in FIG. 14H may include a light-emitting device used for a flashlight or a lighting purpose. Although not illustrated, the mobile phone in FIG. 14H may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays) in the housing 5501. In particular, the direction of the mobile phone (the direction of the mobile phone with respect to the vertical direction) shown in FIG. 14H is determined by providing a sensing device which includes a sensor for sensing inclinations, such as a gyroscope or an acceleration sensor, and display on the screen of the display portion 5502 can be automatically changed in accordance with the direction of the mobile phone. In particular, in the case where a sensing device including a sensor obtaining biological information of fingerprints, veins, iris, voice prints, or the like is provided, a mobile phone having a function of biometric authentication can be obtained.

Next, a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device which is a device including a display element, a light-emitting element, and a light-emitting device which is a device including a light-emitting element can employ a variety of modes or can include a variety of elements. For example, the display element, the display device, the light-emitting element, or the light-emitting device includes at least one of an electroluminescence (EL) element (e.g., an EL element including organic and inorganic materials, an organic EL element, or an inorganic EL element), a light-emitting diode (LED) chip (e.g., a white LED chip, a red LED chip, a green LED chip, or a blue LED chip), a transistor (a transistor that emits light depending on current), a plasma display panel (PDP), an electron emitter, a display element including a carbon nanotube, a liquid crystal element, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulation (IMOD) element, a MEMS shutter display element, an optical-interference-type MEMS display element, or a piezoelectric ceramic display), quantum dots, and the like. Other than the above, a display medium whose contrast, luminance, reflectance, transmittance, or the like is changed by electric or magnetic action may be included in the display element, the display device, the light-emitting element, or the light-emitting device. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum or silver. In such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. As described above, the provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In the case of a display element including micro electro mechanical systems (MEMS), a drying agent may be provided in a space where the display element is sealed (e.g., between an element substrate over which the display element is placed and a counter substrate opposed to the element substrate). Providing a dry agent can prevent MEMS and the like from becoming difficult to move or deteriorating easily because of moisture or the like.

Note that this embodiment can be combined with any of the other embodiments in this specification as appropriate.

Embodiment 5

The memory device of one embodiment of the present invention can be used for removable memory devices such as memory cards (e.g., SD cards), universal serial bus (USB) memories, and solid state drives (SSD). In this embodiment, some structure examples of the removable memory device are described with reference to FIGS. 15A to 15E.

Figure 15A:
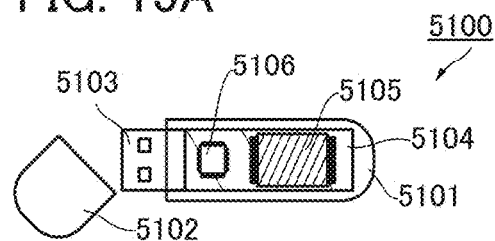
FIGS. 15A to 15E are perspective views illustrating examples of electronic devices.

FIG. 15A is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory device and a circuit for driving the memory device. For example, the substrate 5104 is provided with a memory chip 5105 and a controller chip 5106. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5105. Specifically, a processor, a work memory, an ECC circuit, and the like are incorporated in the controller chip 5106. Note that the circuit configurations of the memory chip 5105 and the controller chip 5106 are not limited to those described above, and can be changed depending on circumstances or conditions. For example, the word line driver circuit 2622, the row decoder 2621, the sense amplifier 2633, the precharge circuit 2632, and the column decoder 2631 may be incorporated into not the memory chip 5105 but the controller chip 5106. The USB connector 5103 functions as an interface for connection to an external device.

Figure 15B:
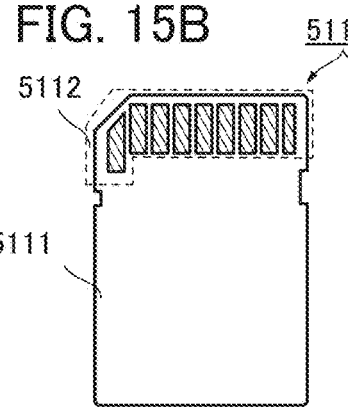
Figure 15C:
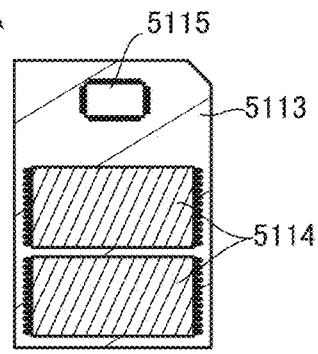

FIG. 15B is a schematic external diagram of an SD card, and FIG. 15C is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with a memory chip 5114 and a controller chip 5115. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5114. A processor, a work memory, an ECC circuit, and the like are incorporated in the controller chip 5115. Note that the circuit configurations of the memory chip 5114 and the controller chip 5115 are not limited to those described above, and can be changed depending on circumstances or conditions. For example, the word line driver circuit 2622, the row decoder 2621, the sense amplifier 2633, the precharge circuit 2632, and the column decoder 2631 may be incorporated into not the memory chip 5114 but the controller chip 5115.

When the memory chip 5114 is also provided on a back side of the substrate 5113, the capacity of the SD card 5110 can be increased. In addition, a wireless chip with a radio communication function may be provided on the substrate 5113. This structure enables wireless communication between an external device and the SD card 5110, making it possible to write/read data to/from the memory chip 5114.

Figure 15D:
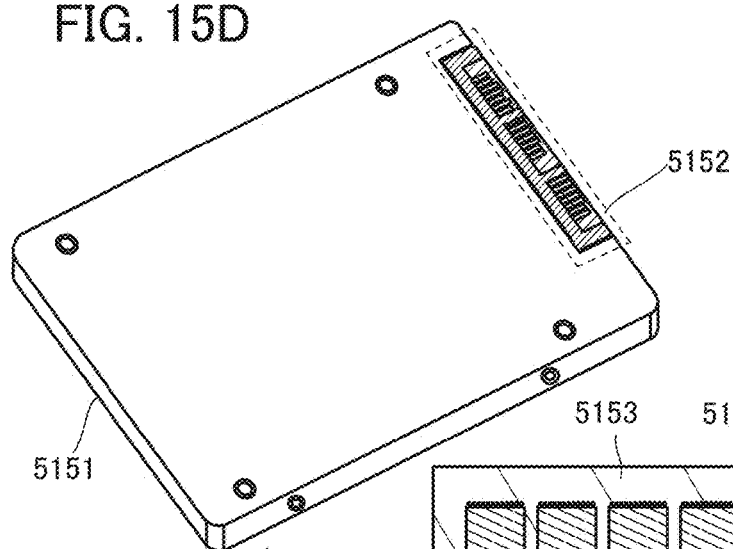
Figure 15E:
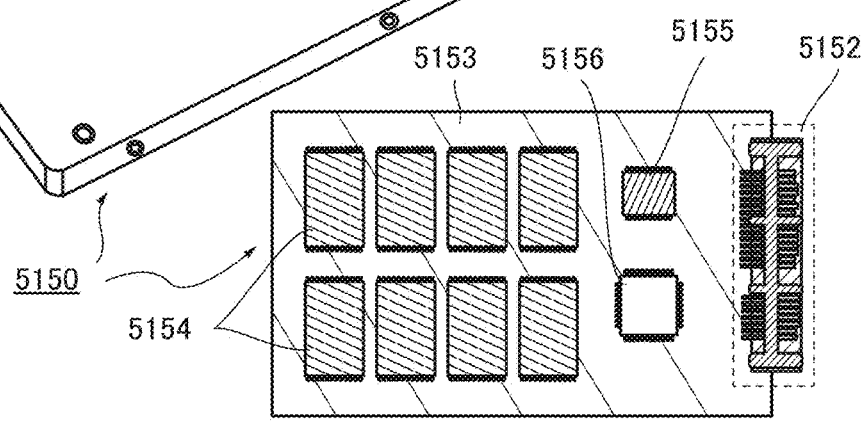
Figure 16A:
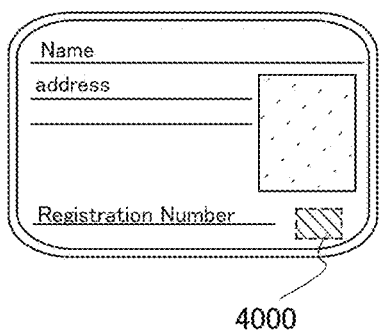
FIGS. 16A to 16F are perspective views illustrating usage examples of an RF tag.
Figure 16B:
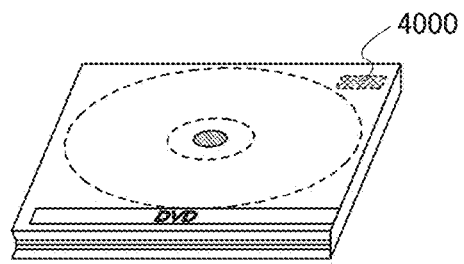
Figure 16C:
Figure 16D:
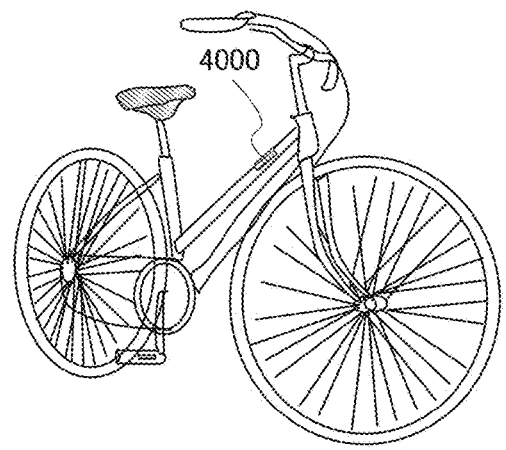
Figure 16E:
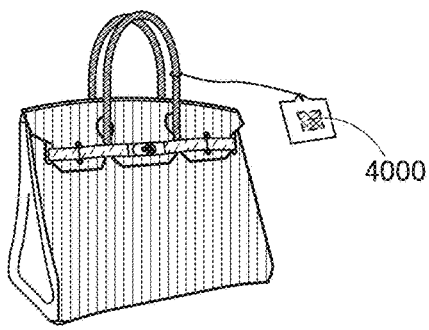
Figure 16F:
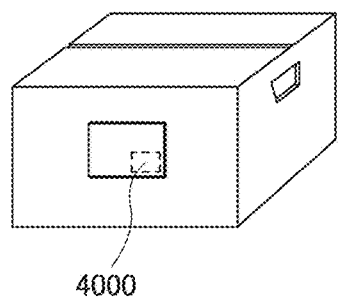

FIG. 15D is a schematic external diagram of an SSD, and FIG. 15E is a schematic diagram illustrating the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with a memory chip 5154, a memory chip 5155, and a controller chip 5156. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5154. When the memory chip 5154 is also provided on a back side of the substrate 5153, the capacity of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the memory chip 5154, the memory chip 5155, and the controller chip 5115 are not limited to those described above, and can be changed depending on circumstances or conditions. For example, a memory functioning as a work memory may also be provided in the controller chip 5156.

Note that this embodiment can be combined with any of the other embodiments in this specification as appropriate.

Embodiment 6

In this embodiment, application examples of an RF tag that can include the memory device of one embodiment of the present invention will be described with reference to FIGS. 16A to 16F. The RF tag is widely used and can be provided for, for example, products such as bills, coins, securities, bearer bonds, documents (e.g., driver's licenses or resident's cards, see FIG. 16A), recording media (e.g., DVD or video tapes, see FIG. 16B), packaging containers (e.g., wrapping paper or bottles, see FIG. 16C), vehicles (e.g., bicycles, see FIG. 16D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 16E and 16F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have a higher level of security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with any of the other embodiments in this specification as appropriate.

Embodiment 7

Described in this embodiment are transistors of one embodiment of the disclosed invention.

Transistors in one embodiment of the present invention each preferably include an nc-OS or a CAAC-OS, which is described in Embodiment 8.

Transistor Structure Example 1

Figure 17A:
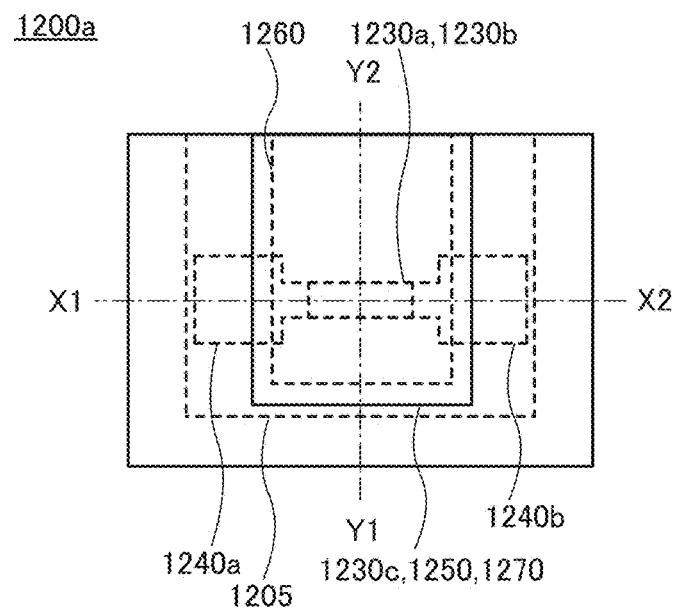
FIG. 17A is a top view and FIGS. 17B and 17C are cross-sectional views illustrating a structure example of a transistor.
Figure 17B:
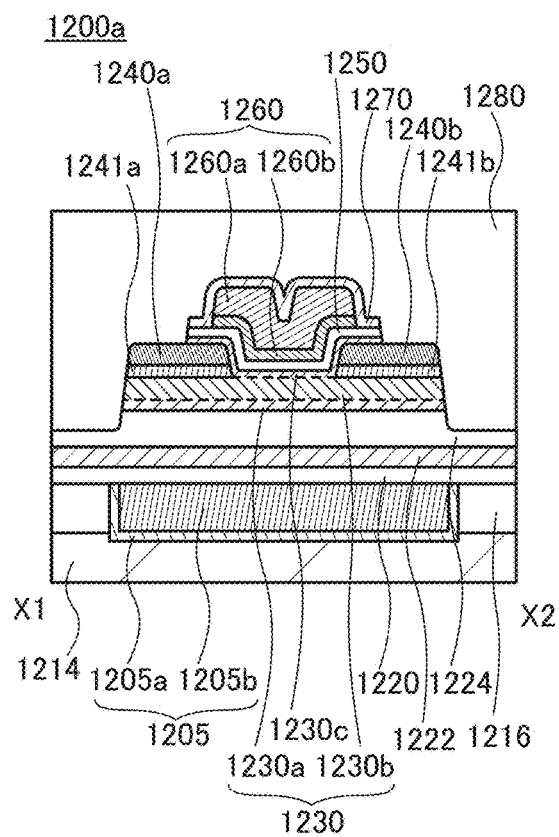
Figure 17C:
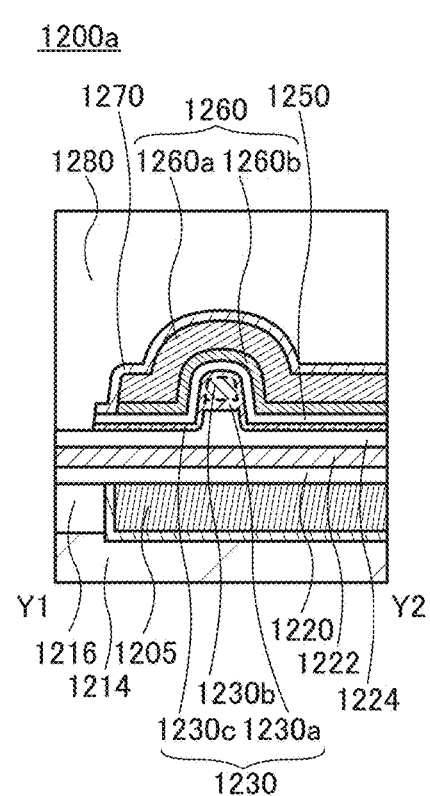

An example of a transistor of one embodiment of the present invention is described below. FIGS. 17A to 17C are a top view and cross-sectional views of a transistor of one embodiment of the present invention. FIG. 17A is a top view. FIG. 17B is a cross-sectional view taken along dashed-dotted line X1-X2 in FIG. 17A. FIG. 17C is a cross-sectional view taken along dashed-dotted line Y1-Y2 in FIG. 17A. Note that for simplification of the drawing, some components in the top view in FIG. 17A are not illustrated.

A transistor 1200a includes a conductor 1205 and a conductor 1260 that function as gate electrodes; an insulator 1220, an insulator 1222, an insulator 1224, and an insulator 1250 that function as gate insulating layers; a metal oxide 1230 that includes a region where a channel is formed; a conductor 1240a and a conductor 1241a that function as one of a source and a drain; a conductor 1240b and a conductor 1241b that function as the other of the source and the drain; an insulator 1214; an insulator 1216; an insulator 1270; and the insulator 1280 that includes excess oxygen.

The metal oxide 1230 includes a metal oxide 1230a, a metal oxide 1230b over the metal oxide 1230a, and a metal oxide 1230c over the metal oxide 1230b. When the transistor 1200a is turned on, current flows (a channel is formed) mainly in the metal oxide 1230b. Although current sometimes flow through a region in the vicinity of the interface (a mixed region in some cases) between the metal oxide 1230b and the metal oxides 1230a and 1230c, the metal oxides 1230a and 1230c function as insulators at the other region.

<<Interlayer Insulating Film and Protective Insulating Film>>

The insulator 1214 is preferably formed using a material that has a barrier property with respect to hydrogen or oxygen. As an example of the film having a barrier property with respect to hydrogen, silicon nitride formed by a CVD method can be used for the insulator 1214. As the insulator 1214, metal oxide such as aluminum oxide, hafnium oxide, or tantalum oxide is preferably used, for example. In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 1200a in and after a manufacturing process of the transistor. In addition, release of oxygen from the metal oxide in the transistor 1200a can be prevented. Therefore, aluminum oxide is suitably used as a protective film for the transistor 1200a.

The insulator 1216 is provided over the insulator 1214. The insulator 1216 is formed using a material such as silicon oxide, silicon oxynitride, silicon nitride oxide, silicon nitride, aluminum oxide, aluminum oxynitride, aluminum nitride oxide, or aluminum nitride.

Each of the insulators 1220 and 1224 is preferably an insulator containing oxygen, such as a silicon oxide film or a silicon oxynitride film. In particular, the insulator 1224 is preferably an insulator containing excess oxygen (containing oxygen in excess of that in the stoichiometric composition). In the case where such an insulator containing excess oxygen is provided in contact with a metal oxide in the transistor 1200a, oxygen vacancies in the metal oxide can be compensated. Note that the insulators 1222 and 1224 are not necessarily formed of the same material.

The insulator 1222 preferably has a single-layer structure or a stacked-layer structure formed using, for example, one or more of an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and $(Ba,Sr)TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

Note that the insulator 1222 may have a stacked-layer structure of two or more layers. In this case, the stacked layers are not necessarily formed of the same material but may be formed of different materials.

In the case where the insulator 1222 including a high-k material is provided between the insulator 1220 and the insulator 1224, electrons can be trapped in the insulator 1222 under specific conditions, and the threshold voltage can be increased. As a result, the insulator 1222 is negatively charged in some cases.

For example, in the case where the insulator 1220 and the insulator 1224 are formed using silicon oxide and the insulator 1222 is formed using a material having a lot of electron trap states such as hafnium oxide, aluminum oxide, or tantalum oxide, the state where the potential of the conductor 1205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide metal in the transistor 1200a to the conductor 1205. At this time, some of the moving electrons are trapped by the electron trap states of the insulator 1222.

In the transistor in which a necessary amount of electrons is trapped by the electron trap states of the insulator 1222, the threshold voltage is shifted in the positive direction. By controlling the voltage of the conductor 1205, the amount of electrons to be trapped can be controlled, and thus the threshold voltage can be controlled. The transistor 1200a having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging. In either case, it is preferable that the transistor be not exposed to temperatures of 125° C. or higher for one hour or more after the process for trapping electrons.

When the insulators 1220 and 1224 are formed using silicon oxide and the insulator 1222 is formed using hafnium oxide, the insulators 1220 and 1224 may be formed by a chemical vapor deposition method (including a CVD method and an atomic layer deposition (ALD) method) and the insulator 1222 may be formed by a sputtering method. Note that using a sputtering method for the formation of the insulator 1222 might easily crystallize the insulator 1222 at low temperature to generate a large amount of fixed charges.

The threshold voltages can be controlled by appropriate adjustment of the thicknesses of the insulator 1220, the insulator 1222, and the insulator 1224. The materials of the insulator 1220, the insulator 1222, and the insulator 1224 are preferably a 10-nm-thick silicon oxynitride film, a 20-nm-thick aluminum oxide film, and a 30-nm-thick silicon oxynitride film, respectively. It is further preferable to use a 5-nm-thick silicon oxynitride film, a 5-nm-thick aluminum oxide film, and a 5-nm-thick silicon oxynitride film.

The insulator 1222 is preferably formed using a material having a barrier property with respect to oxygen and hydrogen. When such a material is used, release of oxygen from the metal oxide in the transistor 1200a or entry of an impurity such as hydrogen from the outside can be prevented.

The insulator 1250 can have a single-layer structure or a stacked-layer structure formed using, for example, one or more of an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and $(Ba,Sr)TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

As the insulator 1250, like the insulator 1224, an oxide insulator that contains oxygen in excess of that in the stoichiometric composition is preferably used. When such an insulator containing excess oxygen is provided in contact with the metal oxide 1230, oxygen vacancies in the metal oxide 1230 can be reduced.

As the insulator 1250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties with respect to oxygen and hydrogen, can be used. The insulator 1250 formed of such a material serves as a layer which prevents release of oxygen from the metal oxide 1230 and entry of an impurity such as hydrogen from the outside.

Note that the insulator 1250 may have a stacked-layer structure similar to that of the insulator 1220, the insulator 1222, and the insulator 1224. When the insulator 1250 includes an insulator in which a necessary amount of electrons is trapped by electron trap states, the threshold voltage of the transistor 1200*a* can be shifted in the positive direction. The transistor 1200*a* having the structure is a normally-off transistor which is in a non-conduction state (also referred to as an off state) even when the gate voltage is 0 V.

In addition to the insulator 1250, a barrier film may be provided between the metal oxide 1230 and the conductor 1260 in the transistor illustrated in FIGS. 17A to 17C. Alternatively, the metal oxide 1230*c* may have a barrier property.

For example, an insulating film containing excess oxygen is provided in contact with the metal oxide 1230 and covered by a barrier film, whereby the composition of the metal oxide can be almost the same as the stoichiometric composition or can be in a supersaturated state containing more oxygen than that in the stoichiometric composition. It is also possible to prevent entry of an impurity such as hydrogen into the metal oxide 1230.

The insulator 1270 may be provided to cover the conductor 1260. In the case where the insulator 1280 is formed using an oxide material from which oxygen is released, the insulator 1270 is formed using a substance having a barrier property with respect to oxygen to prevent the conductor 1260 from being oxidized by the released oxygen.

For example, the insulator 1270 can be formed using metal oxide such as aluminum oxide. The insulator 1270 is formed to a thickness with which the oxidation of the conductor 1260 is prevented. For example, the thickness of the insulator 1270 is set greater than or equal to 1 nm and less than or equal to 10 nm, preferably greater than or equal to 3 nm and less than or equal to 7 nm.

Thus, the oxidation of the conductor 1260 can be prevented, and oxygen released from the insulator 1280 can be supplied to the metal oxide 1230 efficiently.

<<Metal Oxide>>

The metal oxide 1230*a*, the metal oxide 1230*b*, and the metal oxide 1230*c* are formed using metal oxide such as In-M-Zn oxide (M is Al, Ga, Y, or Sn). Alternatively, an In—Ga oxide or an In—Zn oxide may be used for the metal oxide 1230.

The metal oxide 1230 according to the present invention is described below.

A metal oxide used as the metal oxide 1230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where a metal oxide contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in the metal oxide according to the present invention are described with reference to FIGS. 20A to 20C. Note that the proportion of oxygen atoms is not illustrated in FIGS. 20A to 20C. The terms of the atomic ratio of indium, the element M, and zinc contained in the metal oxide are denoted by [In], [M], and [Zn], respectively.

Figure 20A:
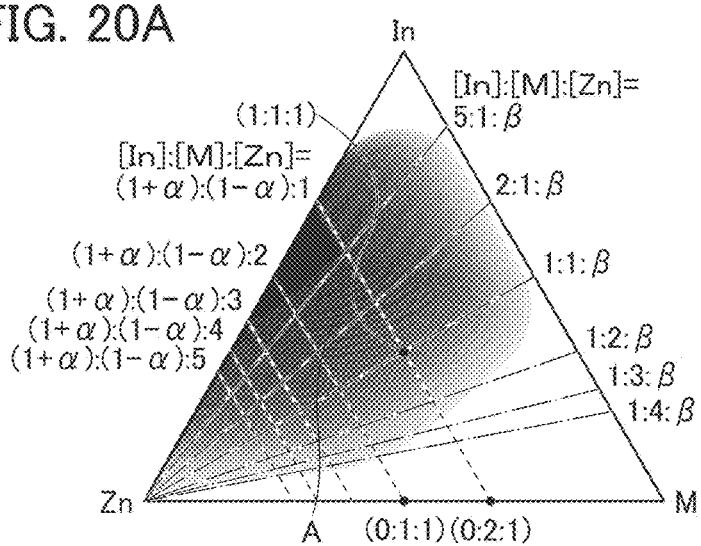
FIGS. 20A to 20C each illustrate an atomic ratio range of an oxide.
Figure 20B:
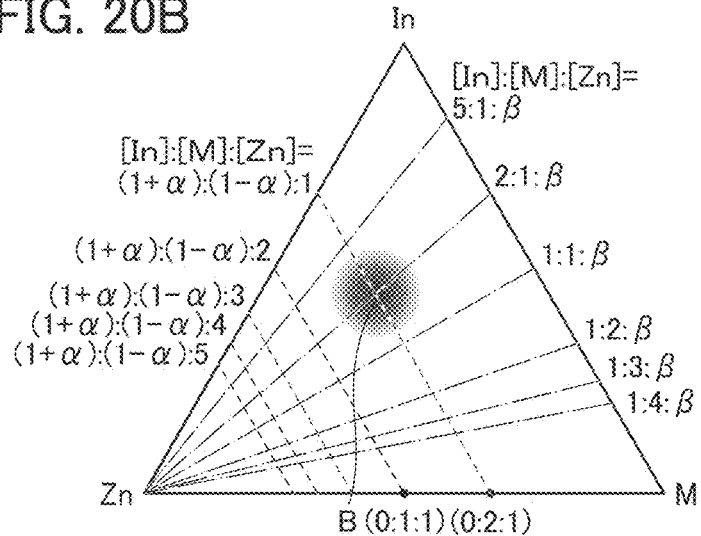
Figure 20C:
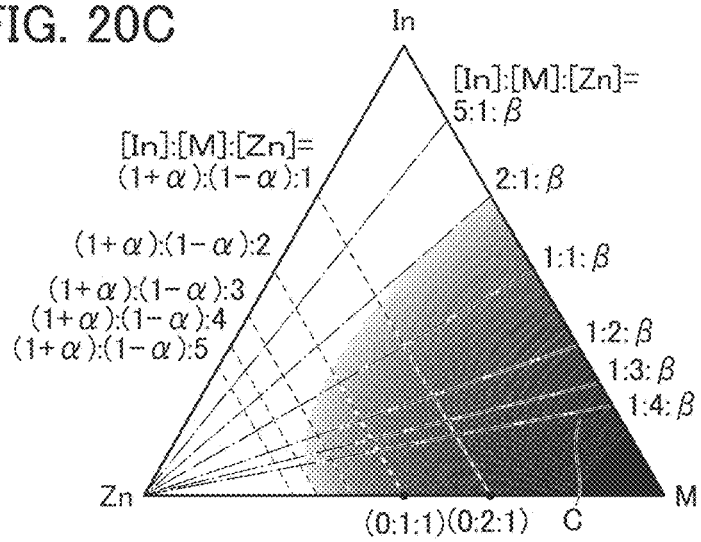

In FIGS. 20A to 20C, broken lines indicate a line where the atomic ratio [In]:[M]:[Zn] is $(1+\alpha):(1-\alpha):1$ where $\alpha$ is a real number greater than or equal to $-1$ and less than or equal to 1, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines correspond to a line representing the atomic ratio of [In]:[M]:[Zn]=$1:1:\beta$ where $\beta$ is a real number greater than or equal to 0, a line representing the atomic ratio of [In]:[M]:[Zn]=$1:2:\beta$, a line representing the atomic ratio of [In]:[M]:[Zn]=$1:3:\beta$, a line representing the atomic ratio of [In]:[M]:[Zn]=$1:4:\beta$, a line representing the atomic ratio of [In]:[M]:[Zn]=$2:1:\beta$, and a line representing the atomic ratio of [In]:[M]:[Zn]=$5:1:\beta$.

A metal oxide having the atomic ratio of [In]:[M]:[Zn] =0:2:1 or a neighborhood thereof in FIGS. 20A to 20C tends to have a spinel crystal structure.

FIGS. 20A and 20B illustrate examples of the preferred ranges of the atomic ratio of indium, the element M, and zinc contained in the metal oxide in one embodiment of the present invention.

Figure 21:
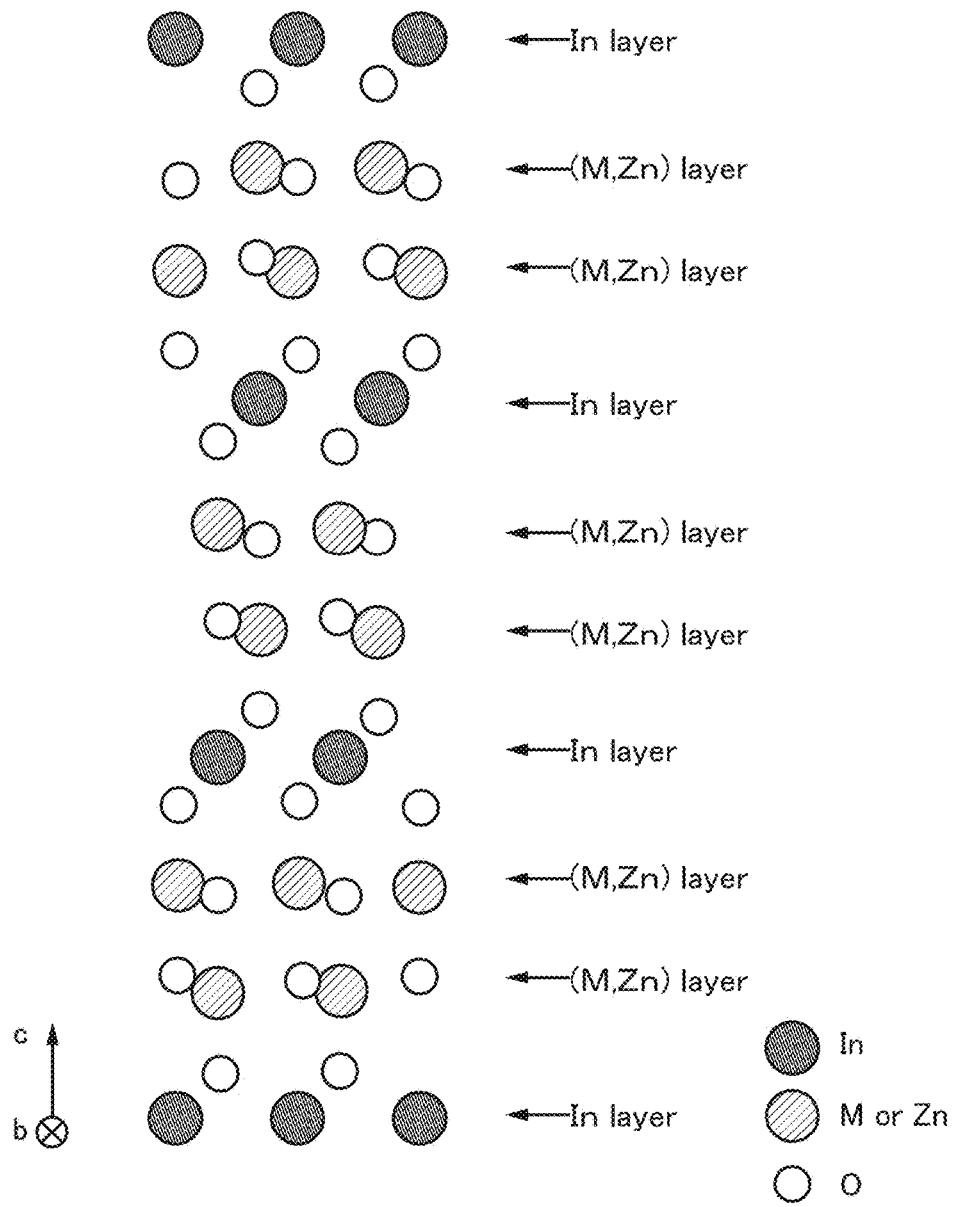
FIG. 21 illustrates an $InMZnO_4$ crystal.

FIG. 21 illustrates an example of the crystal structure of InMZnO$_4$ whose atomic ratio [In]:[M]:[Zn] is 1:1:1. The crystal structure illustrated in FIG. 21 is InMZnO$_4$ observed from a direction parallel to a b-axis. Note that a metal element in a layer that contains M, Zn, and oxygen (hereinafter, this layer is referred to as an "(M,Zn) layer") in FIG. 21 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as a layered structure) and includes two (M,Zn) layers that contain the element M and zinc with respect to one layer that contains indium (hereinafter referred to as an In layer), as illustrated in FIG. 21.

Indium and the element M can be replaced with each other. Therefore, when the element M in the (M,Zn) layer is replaced with indium, the layer can also be referred to as an (In,M,Zn) layer. In that case, a layered structure that includes two (In,M,Zn) layers with respect to one In layer is obtained.

A metal oxide whose atomic ratio [In]:[M]:[Zn] is 1:1:2 has a layered structure that includes three (M,Zn) layers with respect to one In layer. In other words, if [Zn] is larger than [In] and [M], the proportion of (M,Zn) layers to In layers becomes higher when the metal oxide is crystallized.

Note that in the case where the number of (M,Zn) layers with respect to one In layer is not an integer in the metal oxide, the metal oxide might have plural kinds of layered structures where the number of (M,Zn) layers with respect to one In layer is an integer. For example, in the case of [In]:[M]:[Zn]=1:1:1.5, the metal oxide might have the following layered structures: a layered structure of two (M,Zn) layers with respect to one In layer and a layered structure of three (M,Zn) layers with respect to one In layer.

For example, in the case where the metal oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

In addition, the metal oxide containing indium in a higher proportion can have a higher carrier mobility (electron mobility). This is because in a metal oxide containing indium, the element M, and zinc, the s orbital of heavy metal mainly contributes to carrier transfer, and when the indium content in the metal oxide is increased, overlaps of the s orbitals of indium atoms are increased; therefore, a metal oxide having a high content of indium has a higher carrier mobility than a metal oxide having a low content of indium.

In contrast, when the indium content and the zinc content in a metal oxide become lower, carrier mobility becomes lower. Thus, with an atomic ratio of [In]:[M]:[Zn]=0:1:0 and the neighborhood thereof (e.g., a region C in FIG. 20C), insulation performance becomes better.

Accordingly, a metal oxide in one embodiment of the present invention preferably has an atomic ratio represented by a region A in FIG. 20A. With the atomic ratio, a layered structure with high carrier mobility and a few grain boundaries is easily obtained.

A region B in FIG. 20B represents an atomic ratio of [In]:[M]:[Zn]=4:2:3 to 4:2:4.1 and the neighborhood thereof. The neighborhood includes an atomic ratio of [In]:[M]:[Zn]=5:3:4. A metal oxide with an atomic ratio represented by the region B is an excellent metal oxide that has particularly high crystallinity and high carrier mobility.

Note that the condition where a metal oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which a metal oxide has a layered structure, and boundaries of the regions A to C are not clear.

Next, the case where the metal oxide is used for a transistor is described.

Note that when the metal oxide is used for a transistor, carrier scattering or the like at a grain boundary can be reduced; thus, the transistor can have high field-effect mobility. In addition, the transistor can have high reliability.

A metal oxide with low carrier density is preferably used for the transistor. For example, the metal oxide has a carrier density lower than $8 \times 10^{11}/cm^3$, preferably lower than $1 \times 10^{11}/cm^3$, further preferably lower than $1 \times 10^{10}/cm^3$ and higher than or equal to $1 \times 10^{-9}/cm^3$.

A highly purified intrinsic or substantially highly purified intrinsic metal oxide has few carrier generation sources, and thus can have a low carrier density. A highly purified intrinsic or substantially highly purified intrinsic metal oxide has a low density of defect states and accordingly has low density of trap states in some cases.

Charge trapped by the trap states in the metal oxide takes a long time to be released and may behave like fixed charge. Thus, a transistor whose channel region is formed in a metal oxide having a high density of trap states has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the metal oxide is preferably reduced. As examples of the impurities, hydrogen, nitrogen, alkali metal, alkaline earth metal, iron, nickel, silicon, and the like are given.

Here, the influence of impurities in the metal oxide will be described.

When silicon or carbon that is one of Group 14 elements is contained in the metal oxide, defect states are formed in the metal oxide. Thus, the metal oxide is formed to have a region where the concentration of silicon or carbon (measured by secondary ion mass spectrometry (SIMS)) is controlled to be lower than or equal to $2 \times 10^{18}$ atoms/cm$^3$, preferably lower than or equal to $2 \times 10^{17}$ atoms/cm$^3$ in the metal oxide or around an interface with the metal oxide.

When the metal oxide contains alkali metal or alkaline earth metal, defect states are formed and carriers are generated, in some cases. Thus, a transistor including a metal oxide which contains alkali metal or alkaline earth metal is likely to be normally-on. Therefore, it is preferable to reduce the concentration of alkali metal or alkaline earth metal in the metal oxide. Specifically, the concentration of alkali metal or alkaline earth metal in the metal oxide, which is measured by SIMS, is lower than or equal to $1 \times 10^{18}$ atoms/cm$^3$, preferably lower than or equal to $2 \times 10^{16}$ atoms/cm$^3$.

When containing nitrogen, the metal oxide easily becomes n-type by generation of electrons serving as carriers and an increase of carrier density. Thus, when a metal oxide contains nitrogen, a transistor in which the metal oxide is used for a semiconductor is likely to be normally on. For this reason, nitrogen in the metal oxide is preferably reduced as much as possible; the nitrogen concentration of the metal oxide, which is measured by SIMS, is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in a metal oxide reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including a metal oxide that contains hydrogen is likely to be normally-on. Accordingly, hydrogen in the metal oxide is preferably reduced as much as possible. Specifically, the hydrogen concentration of the metal oxide, which is measured by SIMS, is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When a metal oxide with sufficiently reduced impurity concentration is used for a channel region in a transistor, the transistor can have stable electrical characteristics.

Next, the case where the metal oxide has a two-layer structure or a three-layer structure is described. A band diagram of a stacked-layer structure of a metal oxide S1, a metal oxide S2, and a metal oxide S3 and insulators that are in contact with the stacked-layer structure, and a band diagram of a stacked-layer structure of the metal oxides S2 and S3 and insulators that are in contact with the stacked-layer structure are described with reference to FIGS. 22A and 22B.

Figure 22A:
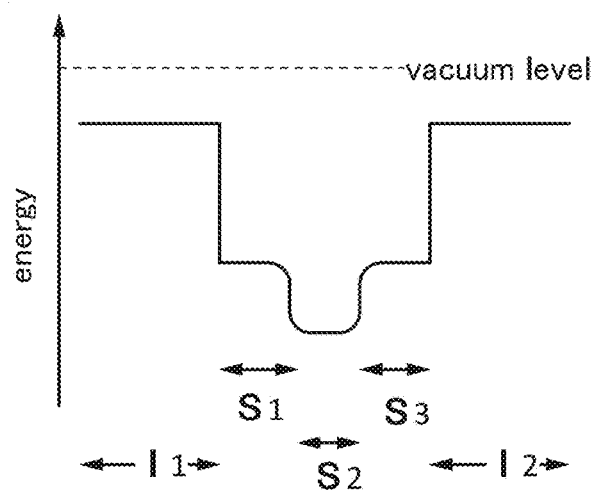
FIGS. 22A and 22B are each a band diagram of a stacked-layer structure including an oxide semiconductor.
Figure 22B:
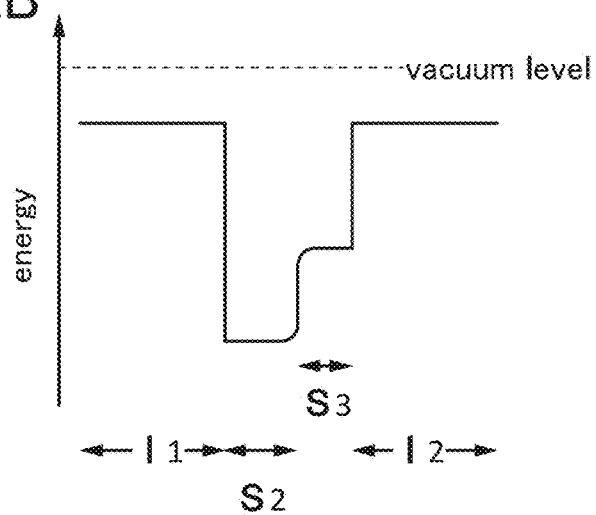

FIG. 22A is an example of a band diagram of a stacked-layer structure including an insulator I1, the metal oxide S1, the metal oxide S2, the metal oxide S3, and an insulator I2 in a thickness direction. FIG. 22B is an example of a band diagram of a stacked-layer structure including the insulator I1, the metal oxide S2, the metal oxide S3, and the insulator I2 in a thickness direction. Note that for easy understanding, the band diagrams show the conduction band minimum (Ec) of each of the insulator I1, the metal oxide S1, the metal oxide S2, the metal oxide S3, and the insulator I2.

The energy level of the conduction band minimum of each of the metal oxides S1 and S3 is closer to the vacuum level than that of the metal oxide S2 is. Typically, the energy level of the conduction band minimum of the metal oxide S2 is preferably lower than that of each of the metal oxides S1 and S3. Specifically, a difference in the energy level between the conduction band minimum of the metal oxide S2 and the conduction band minimum of each of the metal oxides S1 and S3 is preferably greater than or equal to 0.15 eV and less than or equal to 2 eV, further preferably greater than or equal to 0.5 eV and less than or equal to 1 eV. That is, it is preferable that the electron affinity of the metal oxide S2 be higher than the electron affinity of each of the metal oxides S1 and S3, and the difference between the electron affinity of each of the metal oxides S1 and S3 and the electron affinity of the metal oxide S2 be greater than or equal to 0.15 eV and less than or equal to 2 eV, further preferably greater than or equal to 0.5 eV and less than or equal to 1 eV.

As illustrated in FIGS. 22A and 22B, the conduction band minimum of each of the metal oxides S1 to S3 is gradually varied. In other words, the energy level of the conduction band minimum is continuously changed or continuously connected. In order to obtain such a band diagram, the density of defect states in a mixed layer formed at an interface between the metal oxides S1 and S2 or an interface between the metal oxides S2 and S3 is preferably made low.

Specifically, when the metal oxides S1 and S2 or the metal oxides S2 and S3 contain the same element (as a main component) in addition to oxygen, a mixed layer with a low density of defect states can be formed. For example, in the case where the metal oxide S2 is an In—Ga—Zn oxide, it is preferable to use an In—Ga—Zn oxide, a Ga—Zn oxide, gallium oxide, or the like as each of the metal oxides S1 and S3.

At this time, the metal oxide S2 serves as a main carrier path. Since the density of defect states at the interface between the metal oxides S1 and S2 and the interface between the metal oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The metal oxides S1 and S3 can make the trap state apart from the metal oxide S2. This structure can prevent the positive shift of the threshold voltage of the transistor.

A material whose conductivity is sufficiently lower than that of the metal oxide S2 is used for the metal oxides S1 and S3. In that case, the metal oxide S2, the interface between the metal oxides S1 and S2, and the interface between the metal oxides S2 and S3 mainly function as a channel region. For example, a metal oxide with high insulation performance and the atomic ratio represented by the region C in FIG. 20C can be used as the metal oxides S1 and S3. Note that the region C in FIG. 20C represents the atomic ratio of [In]:[M]:[Zn]=0:1:0 or the neighborhood thereof.

In the case where a metal oxide with the atomic ratio represented by the region A is used as the metal oxide S2, it is particularly preferable to use a metal oxide with an atomic ratio where [M]/[In] is greater than or equal to 1, preferably greater than or equal to 2 as each of the metal oxides S1 and S3. In addition, it is suitable to use a metal oxide with sufficiently high insulation performance and an atomic ratio where [M]/([Zn]+[In]) is greater than or equal to 1 as the metal oxide S3.

<<Source Electrode and Drain Electrode>>

One of a pair of the conductor 1240a and the conductor 1241a and a pair of the conductor 1240b the conductor 1241b functions as a source electrode, and the other pair functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 1240a, 1241a, 1240b, and 1241b. Although a two-layer structure is shown in FIG. 17B, a single-layer structure or a stacked-layer structure of three or more layers may be used.

For example, a titanium film is used as each of the conductor 1240a and the conductor 1240b, and an aluminum film is used as each of the conductor 1241a and the conductor 1241b. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

<<Gate Electrode>>

Conductors 1205a and 1205b that function as a gate electrode are described. A two-layer structure of the conductor 1205a and the conductor 1205b is shown in FIGS. 17A to 17C, but the structure of the conductor 1205 is not limited thereto, and a single-layer structure or a stacked-layer structure of three or more layers may be used. For example, a conductor having a barrier property with respect to hydrogen, e.g., tantalum nitride, may be used as the conductor 1205a, and tungsten, which has high conductivity, may be stacked thereover as the conductor 1205b. The use of the combination of the materials can prevent diffusion of hydrogen into the metal oxide 1230 while conductivity of a wiring is ensured.

Conductors 1260a and 1260b functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Further, one or more metal elements selected from manganese or zirconium may be used. Alternatively, a semiconductor typified by polycrystalline silicon doped with an impurity element such as phosphorus, or a silicide such as nickel silicide may be used.

For example, a two-layer structure where aluminum is used as the conductor 1260a and a titanium film is used as the conductor 1260b is used. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. Alternatively, an alloy film or a nitride film that contains aluminum and one or more elements selected from titanium, tantalum, tungsten, molybdenum, chromium, neodymium, and scandium may be used.

The conductor 1260 can also be formed using a light-transmitting conductive material such as indium tin oxide, indium metal oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 1260 can have a stacked-layer structure using the above light-transmitting conductive material and the above metal.

<<<S-Channel Structure>>>

As illustrated in FIG. 17C, the transistor 1200a has a structure in which a side surface of the metal oxide 1230b is surrounded by the conductor 1260. In this specification, a structure in which a region where a channel is formed is electrically surrounded by an electric field of a gate electrode is referred to as a surrounded channel (s-channel) structure. With such a structure, the metal oxide 1230 can be electrically surrounded by the electric field of the conductor 1260, so that a channel is formed in the entire metal oxide 1230b (bulk). Thus, a large amount of current can flow between the source and the drain of the transistor, so that a high on-state current can be achieved. Furthermore, a voltage is applied from all directions to a region where a channel is formed, and thus, a transistor in which leakage current is suppressed can be provided.

The s-channel structure, because of its high on-state current, is suitable for a semiconductor device such as large-scale integration (LSI) which requires a miniaturized transistor. A semiconductor device including the miniaturized transistor can have a high integration degree and high density.

Transistor Structure Example 2

Figure 18A:
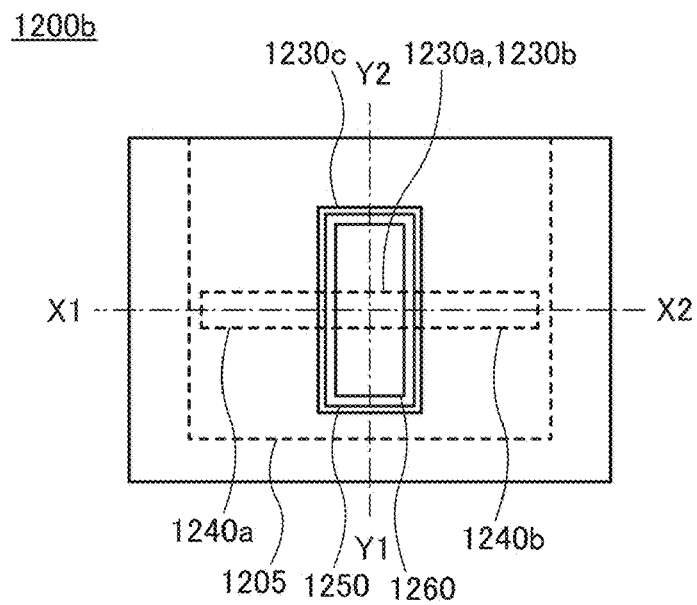
FIG. 18A is a top view and FIGS. 18B and 18C are cross-sectional views illustrating a structure example of a transistor.
Figure 18B:
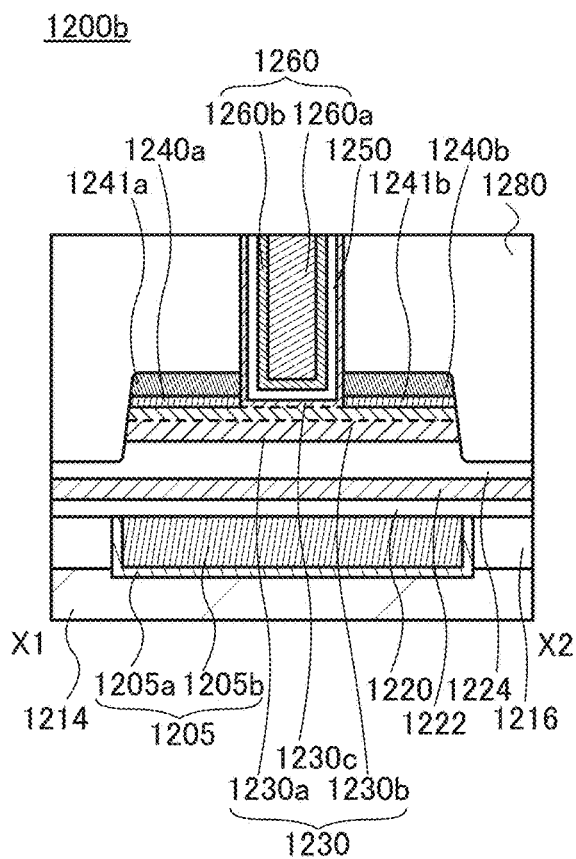
Figure 18C:
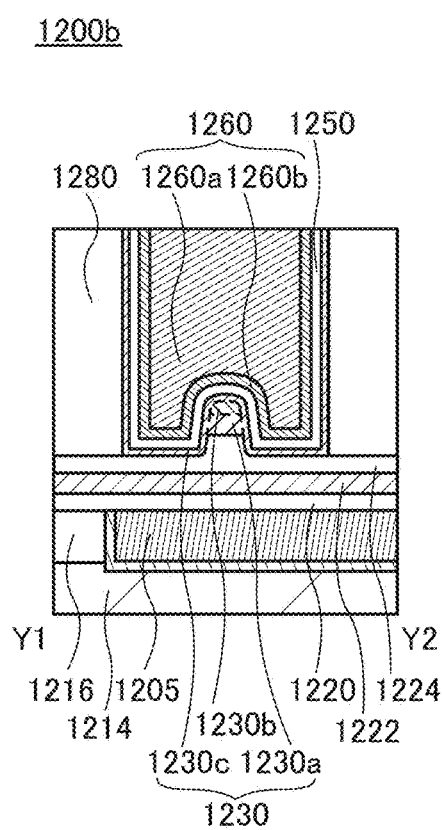

FIGS. 18A to 18C illustrates an example of a structure of a transistor different from the transistor 1200a. FIG. 18A illustrates a top surface of a transistor 1200b. FIG. 18B is a cross-sectional view taken along the dashed-dotted line X1-X2 in FIG. 18A, and FIG. 18C is a cross-sectional view taken along the dashed-dotted line Y1-Y2 in FIG. 18A.

Note that in the transistor 1200b in FIGS. 18A to 18C, components having the same function as the components in the transistor 1200a in FIGS. 17A to 17C are denoted by the same reference numerals.

In the structure illustrated in FIGS. 18A to 18C, the metal oxide 1230c, the insulator 1250, and the conductor 1260 are formed in an opening formed in the insulator 1280. An end portion of each of the conductors 1240a and 1241a and an end portion of each of the conductors 1240b and 1241b are aligned with an end portion of the opening formed in the insulator 1280. An end portion of each of the conductors 1240a, 1240b, 1241a, and 1241b is aligned with part of an end portion of the metal oxide 1230. Therefore, the conductors 1240a, 1240b, 1241a, and 1241b can be formed concurrently with the metal oxide 1230 or the opening in the insulator 1280. This leads to a reduction in the number of masks and steps and improvement in yield and productivity.

Since the transistor 1200b illustrated in FIGS. 18A to 18C has a structure in which the conductors 1240a, 1240b, 1241a, and 1241b hardly overlap with the conductor 1260, the parasitic capacitance added to the conductor 1260 can be reduced. Thus, the transistor 1200b with a high operation frequency can be provided.

Transistor Structure Example 3

Figure 19A:
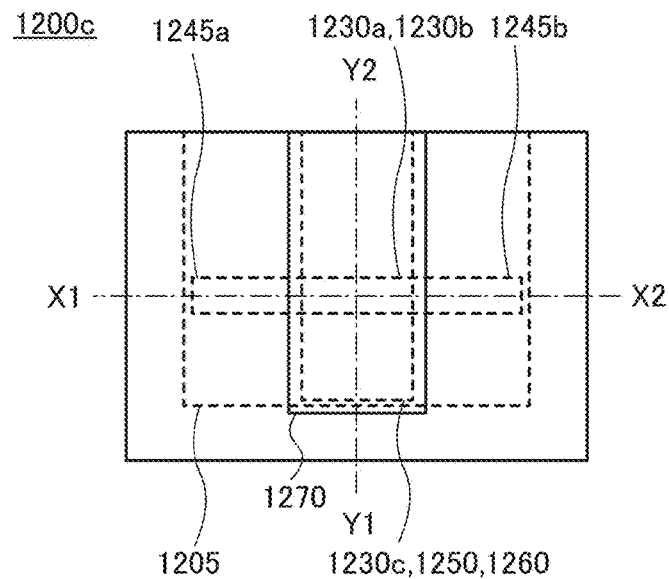
FIG. 19A is a top view and FIGS. 19B and 19C are cross-sectional views illustrating a structure example of a transistor.
Figure 19B:
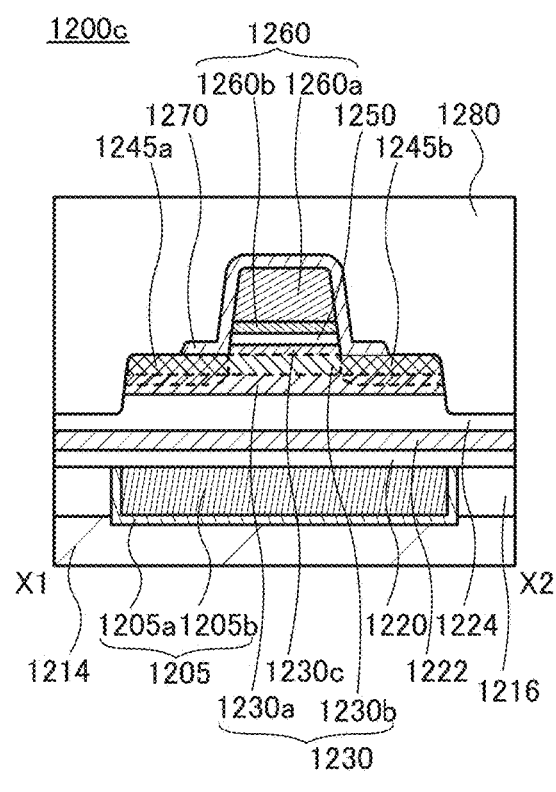
Figure 19C:
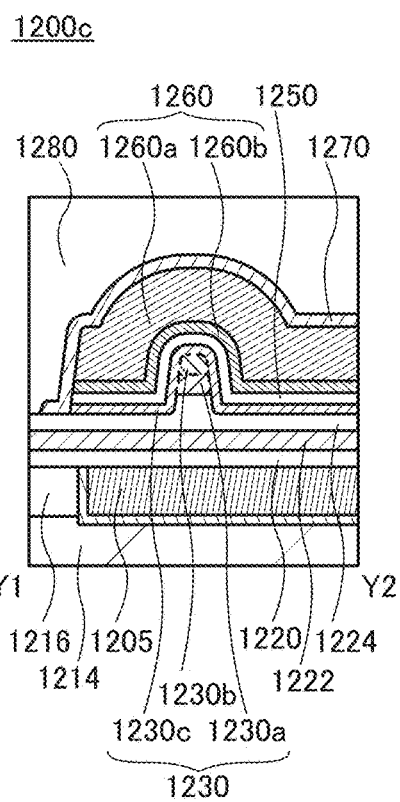

FIGS. 19A to 19C illustrate an example of a structure of a transistor different from the transistor 1200a and the transistor 1200b. FIG. 19A illustrates a top surface of a transistor 1200c. For simplification of the figure, some films are omitted in FIG. 19A. FIG. 19B is a cross-sectional view taken along dashed-dotted line X1-X2 in FIG. 19A, and FIG. 19C is a cross-sectional view taken along dashed-dotted line Y1-Y2 in FIG. 19A.

Note that in the transistor 1200c in each of FIGS. 19A to 19C, components having the same function as the components in the transistor 1200a in FIGS. 17A to 17C are denoted by the same reference numerals.

In the structure illustrated in FIGS. 19A to 19C, a region 1245a which functions as the one of the source region and the drain region and a region 1245b which functions as the other of the source region and the drain region are provided in the metal oxide 1230. The regions can be formed in such a manner that an impurity such as boron, phosphorus, or argon is added to the metal oxide 1230 using a conductor 1260 as a mask. Alternatively, the regions can be formed in such a manner that the insulator 1280 is formed of an insulator containing hydrogen, such as a silicon nitride film, and hydrogen is diffused to part of the metal oxide 1230. Thus, the number of masks can be reduced or the number of steps can be reduced. In addition, yield and productivity can be improved.

Transistor Structure Example 4

Figure 23A:
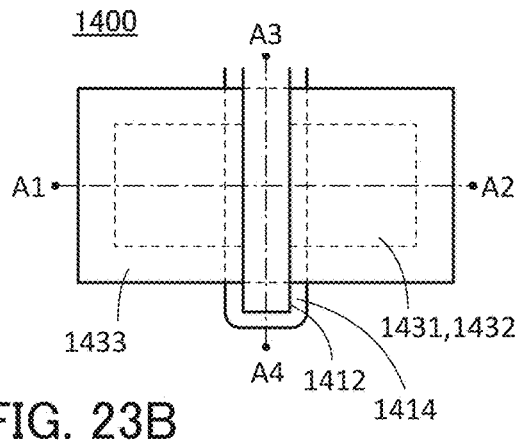
FIG. 23A is a top view and FIGS. 23B to 23D are cross-sectional views illustrating a structure example of a transistor.
Figure 23B:
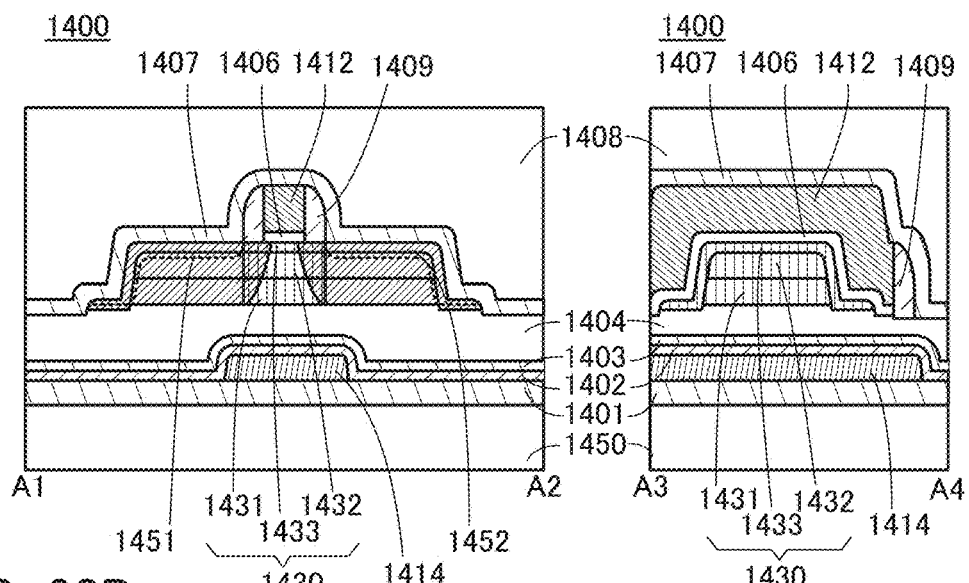
Figure 23C:
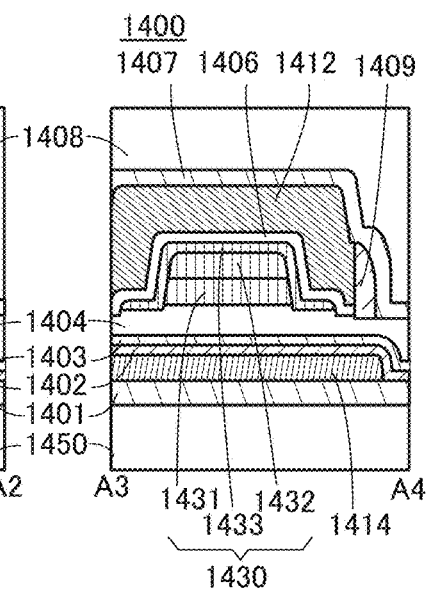

FIGS. 23A to 23D are a top view and cross-sectional views of a transistor 1400. FIG. 23A is a top view of the transistor 1400. FIG. 23B is a cross-sectional view taken along dashed-dotted line A1-A2 in FIG. 23A, and FIG. 23C is a cross-sectional view taken along dashed-dotted line A3-A4 in FIG. 23A. Note that the dashed-dotted line A1-A2 and the dashed-dotted line A3-A4 are sometimes referred to as a channel length direction and a channel width direction, respectively. The transistor 1400 has the s-channel structure like the transistor 1200a and the like.

The transistor 1400 includes a substrate 1450, an insulator 1401 over the substrate 1450, a conductor 1414 over the insulator 1401, an insulator 1402 provided to cover the conductor 1414, an insulator 1403 over the insulator 1402, an insulator 1404 over the insulator 1403, a stacked layer in which a metal oxide 1431, a metal oxide 1432, and a metal oxide 1433 are formed in this order (the stacked layer is collectively referred to as a metal oxide 1430 in some cases) over the insulator 1404, an insulator 1406 over the metal oxide 1433, a conductor 1412 over the insulator 1406, an insulator 1409 on side surfaces of the conductor 1412, an insulator 1407 provided to cover the insulator 1404, the metal oxide 1433, the insulator 1409, and the conductor 1412, and the insulator 1408 over the insulator 1407.

The insulator 1406 and the conductor 1412 overlap with the conductor 1414 and the metal oxide 1432 at least partly. It is preferable that the side edge of the conductor 1412 in the channel length direction be approximately aligned with the side edge of the insulator 1406 in the channel length direction. Here, the insulator 1406 serves as a gate insulator of the transistor 1400, the conductor 1412 serves as a gate electrode of the transistor 1400, and the insulator 1409 serves as a sidewall insulator of the transistor 1400.

The metal oxide 1432 has a region that overlaps with the conductor 1412 with the metal oxide 1433 and the insulator 1406 positioned therebetween. Preferably, the outer edge of the metal oxide 1431 is approximately aligned with the outer edge of the metal oxide 1432, and the outer edge of the metal oxide 1433 is positioned outward from the outer edges of the metal oxides 1431 and 1432. However, the shape of the transistor in this embodiment is not limited to that where the outer edge of the metal oxide 1433 is positioned outward from the outer edge of the metal oxide 1431. For example, the outer edge of the metal oxide 1431 may be positioned outward from the outer edge of the metal oxide 1433, or the side edge of the metal oxide 1431 may be approximately aligned with the side edge of the metal oxide 1433.

<<Substrate>>

As the substrate 1450, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

A flexible substrate may be used as the substrate 1450. As a method for providing a transistor over a flexible substrate, there is a method in which a transistor is formed over a non-flexible substrate, and then the transistor is separated and transferred to the substrate 1450 that is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 1450 has small thickness, the weight of the semiconductor device can be reduced. When the substrate 1450 has small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulator>>

The insulator 1401 is a film that prevents a current from flowing between the substrate 1450 and the conductor 1414.

The insulator 1401 or 1402 is formed using an insulator having a single-layer structure or a stacked-layer structure. Examples of materials used in the insulator includes aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulator 1402 may be formed using silicon oxide with high step coverage that is formed by reacting tetraethyl orthosilicate (TEOS), silane, or the like with oxygen, nitrous oxide, or the like.

After the insulator 1402 is formed, the insulator 1402 may be subjected to planarization treatment using a CMP method or the like to improve the planarity of the top surface thereof.

The insulator 1404 preferably contains an oxide. In particular, the insulator 1404 preferably contains an oxide material from which part of oxygen is released by heating. The insulator 1404 preferably contains an oxide containing oxygen more than that in the stoichiometric composition. Part of oxygen is released by heating from an oxide film containing oxygen more than that in the stoichiometric composition. Oxygen released from the insulator 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen in excess of that in the stoichiometric composition is an oxide film in which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

The insulator 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulator 1404.

To make the insulator 1404 contain excess oxygen, the insulator 1404 is formed in an oxygen atmosphere, for example. Alternatively, a region containing excess oxygen may be formed by introducing oxygen into the insulator 1404 that has been formed. Both the methods may be combined.

For example, oxygen (at least including any of oxygen radicals, oxygen atoms, and oxygen ions) may be introduced into the insulator 1404 that has been formed, so that a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Further, a rare gas may be included in the gas containing oxygen for the oxygen introduction treatment. Moreover, hydrogen or the like may be included. For example, a mixed gas of carbon dioxide, hydrogen, and argon may be used.

After the insulator 1404 is formed, the insulator 1404 may be subjected to planarization treatment using a CMP method or the like to improve the planarity of the top surface thereof.

The insulator 1403 has a passivation function of preventing oxygen contained in the insulator 1404 from decreasing by bonding to metal contained in the conductor 1414.

The insulator 1403 has a function of blocking oxygen, hydrogen, water, alkali metal, alkaline earth metal, and the like. Providing the insulator 1403 can prevent outward diffusion of oxygen from the metal oxide 1430 and entry of hydrogen, water, or the like into the metal oxide 1430 from the outside.

The insulator 1403 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect with respect to oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

The threshold voltage of the transistor 1400 can be controlled by injecting electrons into a charge trap layer. The charge trap layer is preferably provided in the insulator 1402 or the insulator 1403. For example, when the insulator 1403 is formed using hafnium oxide, aluminum oxide, tantalum oxide, aluminum silicate, or the like, the insulator 1403 can function as a charge trap layer.

<<Gate Electrode>>

The conductor 1412 functions as a first gate electrode. The conductor 1412 may have a stacked-layer structure in which a plurality of conductors overlap with each other. The conductor 1414 that is a gate electrode functions as a second gate electrode.

The conductors 1412 and 1414 each preferably have a single-layer structure or a stacked-layer structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductors are preferably formed using a low-resistance conductive material such as aluminum or copper. The conductors are preferably formed using a Cu—Mn alloy, since in that case, manganese oxide formed at the interface with an insulator containing oxygen has a function of preventing Cu diffusion.

Alternatively, the conductor 1412 and/or 1414 may be formed using any one of the metal oxides 1431 to 1433. In this case, to make the metal oxides 1431 to 1433 function as a conductor, an additional step is needed. Specifically, any one of the metal oxides 1431 to 1433 is formed as the conductor 1412 and/or 1414, and a silicon nitride film is formed as the insulator 1407 by a method using plasma containing hydrogen such as a CVD method, thereby reducing the resistance of the metal oxides 1431 to 1433. As a result, the metal oxides 1431 to 1433 function as a conductor and can be used for the conductor 1412 or conductor 1414.

<<Metal Oxide Layer>>

For the details of the metal oxide 1431, the description of the metal oxide 1230*a* illustrated in FIGS. 17A to 17C may be referred to. For the details of the metal oxide 1432, the description of the metal oxide 1230*b* illustrated in FIGS. 17A to 17C may be referred to. For the details of the metal oxide 1433, the description of the metal oxide 1230*c* illustrated in FIGS. 17A to 17C may be referred to.

<<Low-Resistance Region>>

Figure 23D:
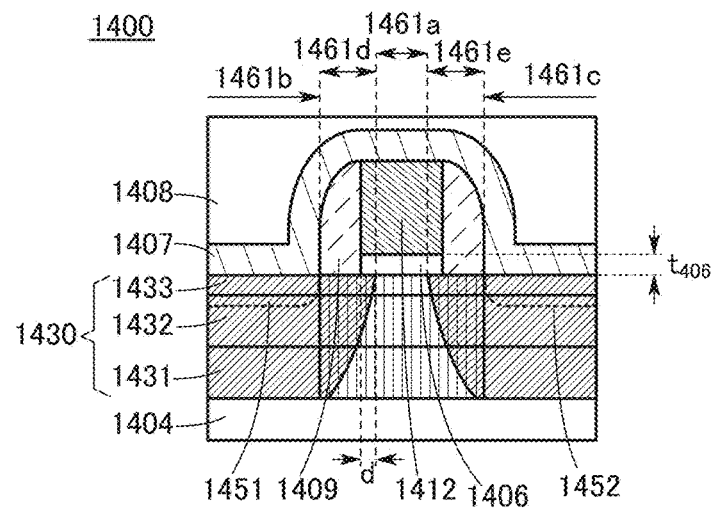

FIG. 23D is an enlarged view of part of FIG. 23B. As shown in FIG. 23D, regions 1461*a* to 1461*e* are formed in the metal oxide 1430. The regions 1461*b* to 1461*e* have a higher concentration of dopant and therefore have a lower resistance than the region 1461*a*. Furthermore, the regions 1461*b* and 1461*c* have a higher concentration of hydrogen and therefore have a much lower resistance than the regions 1461*d* and 1461*e*. The concentration of a dopant in the region 1461*a* is, for example, lower than or equal to 5%, lower than or equal to 2%, or lower than or equal to 1% of the maximum concentration of a dopant in the region 1461*b* or 1461*c*. Note that the dopant may be rephrased as a donor, an acceptor, an impurity, or an element.

As illustrated in FIG. 23D, in the metal oxide 1430, the region 1461*a* substantially overlaps with the conductor 1412, and the regions 1461*b* to 1461*e* are the regions other than the region 1461*a*. In the regions 1461*b* and 1461*c*, the top surface of the metal oxide 1433 is in contact with the insulator 1407. In the regions 1461*d* and 1461*e*, the top surface of the metal oxide 1433 is in contact with the insulator 1409 or 1406. That is, as illustrated in FIG. 23D, the border between the regions 1461*b* and 1461*d* overlaps with the border between the side edges of the insulators 1407 and 1409. The same applies to the border between the regions 1461*c* and 1461*e*. Here, part of the regions 1461*d* and 1461*e* preferably overlaps with part of a region (a channel formation region) where the metal oxide 1432 and the conductor 1412 overlap with each other. For example, preferably, the side edges of the regions 1461*d* and 1461*e* in the channel length direction are inside of the conductor 1412 and the distance between the side edge of the conductor 1412 and each of the side edges of the regions 1461*d* and 1461*e* is d. In that case, the thickness $t_{406}$ of the insulator 1406 and the distance d preferably satisfy $0.25t_{406} < d < t_{406}$.

In the above manner, the regions 1461*d* and 1461*e* are formed in part of the region where the metal oxide 1430 and the conductor 1412 overlap with each other. Accordingly, the channel formation region of the transistor 1400 is in contact with the low-resistance regions 1461*d* and 1461*e* and a high-resistance offset region is not formed between the region 1461*a* and each of the regions 1461*d* and 1461*e*, so that the on-state current of the transistor 1400 can be increased. Furthermore, since the side edges of the regions 1461*d* and 1461*e* in the channel length direction are formed so as to satisfy the above range, the regions 1461*d* and 1461*e* can be prevented from spreading inward too much in the channel formation region and thus the transistor 1400 can be prevented from being constantly in an on state.

The regions 1461*b* to 1461*e* are formed by ion doping treatment such as an ion implantation method. Therefore, as illustrated in FIG. 23D, the positions of the side edges of the regions 1461*d* and 1461*e* in the channel length direction are sometimes shifted to the side edge of the metal oxide 1430 in the channel length direction in a deeper area from the top surface of the metal oxide 1433. The distance din that case is the distance between the side edge of the conductor 1412 in the channel length direction and each of the side edges of the regions 1461*d* and 1461*e* that are closest to the inner part of the conductor 1412.

In some cases, for example, the regions 1461*d* and 1461*e* in the metal oxide 1431 do not overlap with the conductor 1412. In that case, at least part of the regions 1461*d* and 1461*e* in the metal oxide 1431 or 1432 is preferably formed in a region overlapping with the conductor 1412.

In addition, low-resistance regions 1451 and 1452 are preferably formed in the metal oxide 1431, the metal oxide 1432, and the metal oxide 1433 in the vicinity of the interface with the insulator 1407. The low-resistance regions 1451 and 1452 contain at least one of elements included in the insulator 1407. Preferably, part of the low-resistance regions 1451 and 1452 is substantially in contact with or overlaps partly with the region (the channel formation region) where the metal oxide 1432 and the conductor 1412 overlap with each other.

Since a large part of the metal oxide 1433 is in contact with the insulator 1407, the low-resistance regions 1451 and 1452 are likely to be formed in the metal oxide 1433. The low-resistance regions 1451 and 1452 in the metal oxide 1433 contain a higher concentration of elements included in the insulator 1407 than the region other than the low-resistance regions 1451 and 1452 of the metal oxide 1433 (e.g., the region of the metal oxide 1433 that overlaps with the conductor 1412).

The low-resistance regions 1451 and 1452 are formed in the regions 1461*b* and 1461*c*, respectively. Ideally, the metal oxide 1430 has a structure in which the concentration of added elements is the highest in the low-resistance regions 1451 and 1452, the second highest in the regions 1461*b* and 1461*c* to 1461*e* other than the low-resistance regions 1451 and 1452, and the lowest in the region 1461*a*. The added elements refer to a dopant for forming the regions 1461*b* and 1461*c* and an element added from the insulator 1407 to the low-resistance regions 1451 and 1452.

Although the low-resistance regions 1451 and 1452 are formed in the transistor 1400, the semiconductor device shown in this embodiment is not limited to this structure. For example, the low-resistance regions 1451 and 1452 need not be formed in the case where the regions 1461*b* and 1461*c* have a sufficiently low resistance.

<Gate Insulating Film>

The insulator 1406 preferably contains an insulator with a high relative dielectric constant. For example, the insulator 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulator 1406 preferably has a stacked-layer structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the stacked-layer structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulator 1407 has a function of blocking oxygen, hydrogen, water, alkali metal, alkaline earth metal, and the like. Providing the insulator 1407 can prevent outward diffusion of oxygen from the metal oxide 1430 and entry of hydrogen, water, or the like into the metal oxide 1430 from the outside.

The insulator 1407 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect with respect to oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

An aluminum oxide film is preferably used as the insulator 1407 because it is highly effective in preventing transmission of both oxygen and impurities such as hydrogen and moisture.

The insulator 1408 can be formed using an insulator containing at least one materials selected from aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, neodymium oxide, and tantalum oxide. Alternatively, for the insulator 1408, a resin such as a polyimide resin, a polyamide resin, an acrylic resin, a siloxane resin, an epoxy resin, or a phenol resin can be used. The insulator 1408 may be a stack including any of the above materials.

Transistor Structure Example 5

Figure 24A:
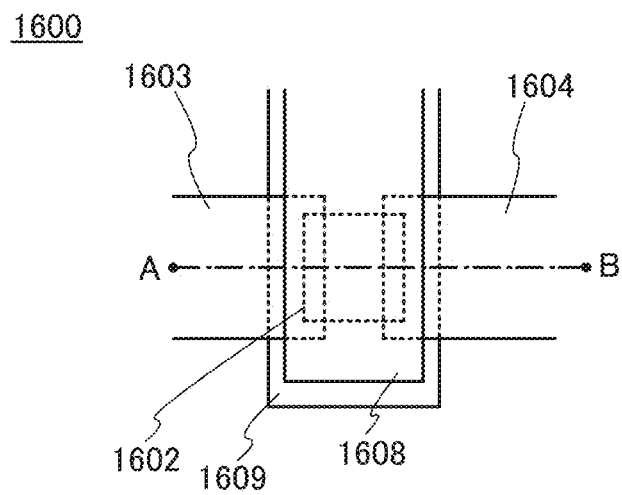
FIGS. 24A and 24B are a top view and a cross-sectional view illustrating a structure example of a transistor.
Figure 24B:
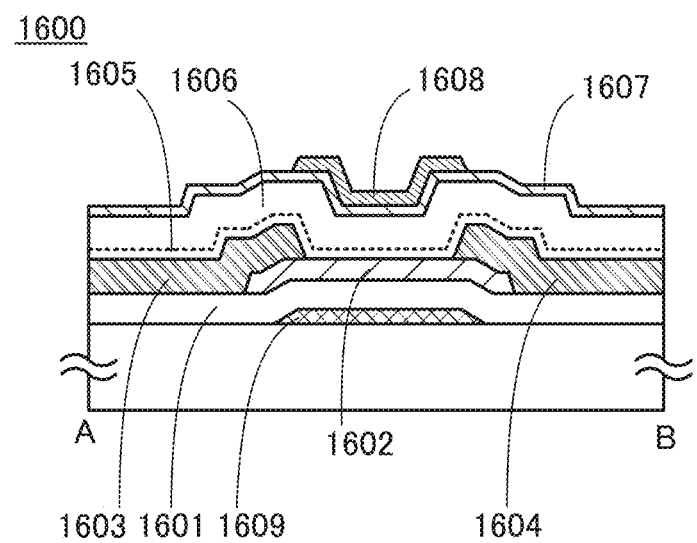

FIGS. 24A and 24B are a top view and a cross-sectional view of a transistor 1600. FIG. 24A is a top view, and FIG.

24B is a cross-sectional view taken along dashed-dotted line A-B in FIG. 24A. Note that for simplification of the drawing, some components are increased or reduced in size, or omitted in FIGS. 24A and 24B. The direction of the dashed-dotted line A-B may be referred to as a channel length direction.

The transistor 1600 illustrated in FIG. 24B includes a conductor 1609 serving as a first gate, a conductor 1608 serving as a second gate, a metal oxide 1602, a conductor 1603 and a conductor 1604 serving as a source and a drain, an insulator 1601, an insulator 1605, an insulator 1606, and an insulator 1607.

The conductor 1609 is on an insulating surface. The conductor 1609 overlaps with the metal oxide 1602 with the insulator 1601 provided therebetween. The conductor 1608 overlaps with the metal oxide 1602 with the insulators 1605, 1606, and 1607 provided therebetween. The conductors 1603 and 1604 are connected to the metal oxide 1602.

The description of the conductor 1412 or 1414 in FIGS. 23A to 23D can be referred to for the details of the conductors 1609 and 1608.

The conductors 1609 and 1608 may be supplied with different potentials, or may be supplied with the same potential at the same time. The conductor 1608 serving as a second gate electrode in the transistor 1600 leads to stabilization of threshold voltage. Note that the conductor 1608 may be omitted in some cases.

The description of the metal oxide 1230b in FIGS. 17A to 17C can be referred to for the details of the metal oxide 1602. The metal oxide 1602 may be a single layer or a stack of a plurality of semiconductor layers.

The conductors 1603 and 1604 each preferably have a single-layer structure or a stacked-layer structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive layers are preferably formed using a low-resistance conductive material such as aluminum or copper. The conductors are preferably formed using a Cu—Mn alloy, since in that case, manganese oxide formed at the interface with an insulator containing oxygen has a function of preventing Cu diffusion.

The conductors 1603 and 1604 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

The description of the insulator 1406 in FIGS. 23A to 23D can be referred to for the details of the insulator 1601.

The insulators 1605 to 1607 are sequentially stacked over the metal oxide 1602 and the conductors 1603 and 1604 in FIG. 24B; however, an insulator provided over the metal oxide 1602 and the conductors 1603 and 1604 may be a single layer or a stack including a plurality of insulators.

In the case of using an oxide semiconductor as the metal oxide 1602, the insulator 1606 preferably contains oxygen at a proportion higher than or equal to that in the stoichiometric composition and has a function of supplying part of oxygen to the metal oxide 1602 by heating. Note that in the case where providing the insulator 1606 directly on the metal oxide 1602 causes damage to the metal oxide 1602 at the time of formation of the insulator 1606, the insulator 1605 is preferably provided between the metal oxide 1602 and the insulator 1606, as illustrated in FIG. 24B. The insulator 1605 preferably allows oxygen to pass therethrough, and causes little damage to the metal oxide 1602 when the insulator 1605 is formed compared with the case of the insulator 1606. If damage to the metal oxide 1602 can be reduced and the insulator 1606 can be formed directly on the metal oxide 1602, the insulator 1605 is not necessarily provided.

For the insulators 1605 and 1606, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulator 1607 preferably has an effect of blocking diffusion of oxygen, hydrogen, and water. Alternatively, the insulator 1607 preferably has an effect of blocking diffusion of hydrogen and water.

As the insulator has higher density and is denser or has a fewer dangling bonds and is more chemically stable, the insulator has a higher blocking effect. An insulator that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulator that has an effect of blocking diffusion of hydrogen and water can be formed using, for example, silicon nitride or silicon nitride oxide.

In the case where the insulator 1607 has an effect of blocking diffusion of water, hydrogen, and the like, impurities such as water and hydrogen that exist in a resin in a panel or exist outside the panel can be prevented from entering the metal oxide 1602. In the case where an oxide semiconductor is used as the metal oxide 1602, part of water or hydrogen that enters the oxide semiconductor serves as an electron donor (donor). Thus, the use of the insulator 1607 having the blocking effect can prevent a shift in the threshold voltage of the transistor 1600 due to generation of donors.

In addition, since an oxide semiconductor is used for the metal oxide 1602, when the insulator 1607 has an effect of blocking diffusion of oxygen, diffusion of oxygen from the oxide semiconductor to the outside can be prevented. Accordingly, oxygen vacancies in the oxide semiconductor that serve as donors are reduced, so that a shift in the threshold voltage of the transistor 1600 due to generation of donors can be prevented.

Note that this embodiment can be combined with any of the other embodiments in this specification as appropriate.

Embodiment 8

Described in this embodiment are structures of an oxide semiconductor film capable of being used for the metal oxide 1230, the metal oxide 1430, and the metal oxide 1602 described in the above embodiments.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 25A:
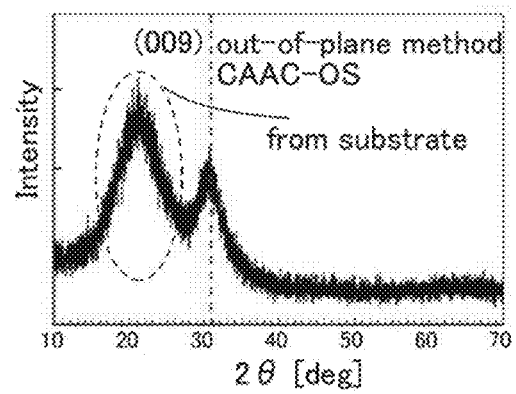
FIGS. 25A to 25E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 25A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

Figure 25B:
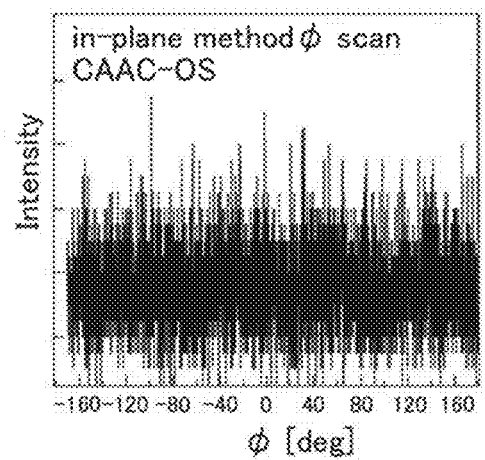
Figure 25C:
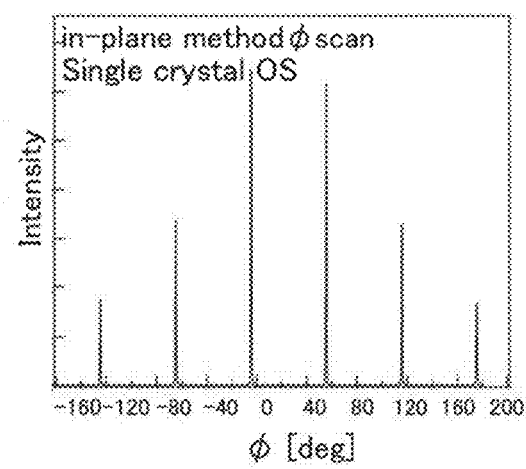

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 25B, a peak is not clearly observed. In contrast, in the case where single crystal InGaZnO$_4$ is subjected to φ scan with 2θ fixed at around 56°, as shown in FIG. 25C, six peaks which are derived from crystal planes equivalent to the (110) plane are observed. Accordingly, the structural analysis using XRD shows that the directions of a-axes and b-axes are irregularly oriented in the CAAC-OS.

Figure 25D:
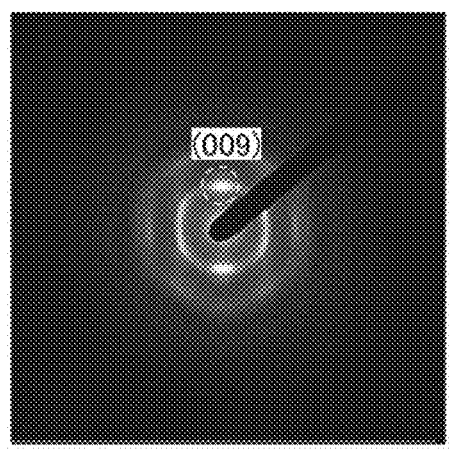
Figure 25E:
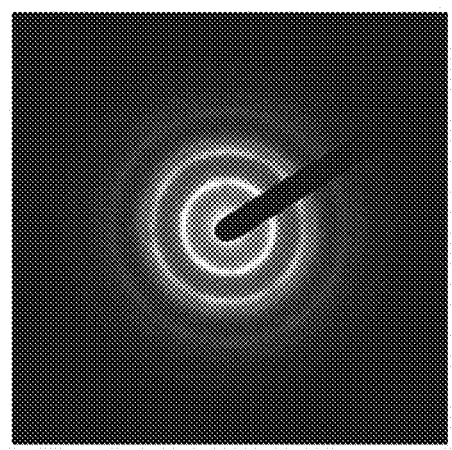

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 25D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 25E shows a diffraction pattern obtained in such a manner that an electron beam with a probe diameter of 300 nm is incident on the same sample in a direction perpendicular to the sample surface. As shown in FIG. 25E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 25E is considered to be derived from the (010) plane, the (100) plane, and the like of the InGaZnO$_4$ crystal. The second ring in FIG. 25E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 26A:
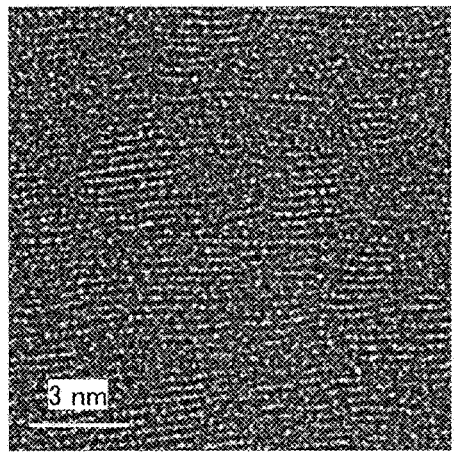
FIGS. 26A to 26E show a cross-sectional TEM image and plan-view TEM images of a CAAC-OS and images obtained through analysis thereof.

FIG. 26A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 26A shows pellets in which metal atoms are arranged in a layered manner. FIG. 26A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 26B:
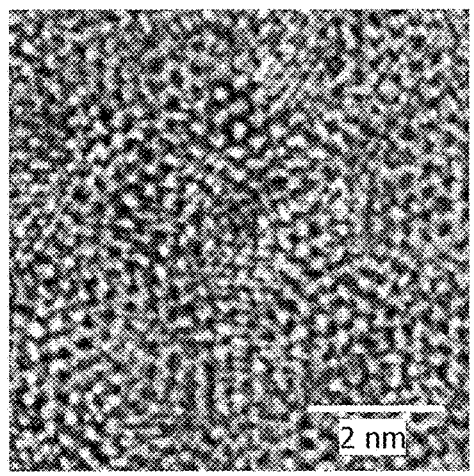
Figure 26C:
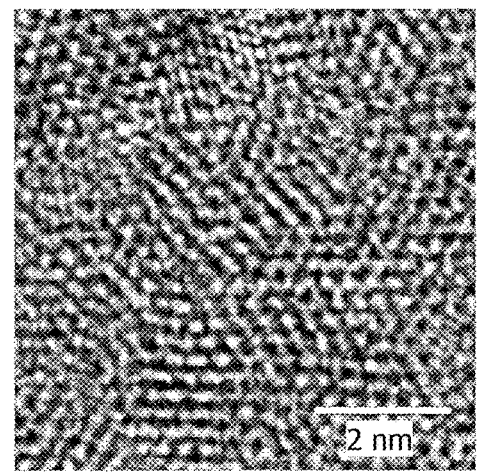
Figure 26D:
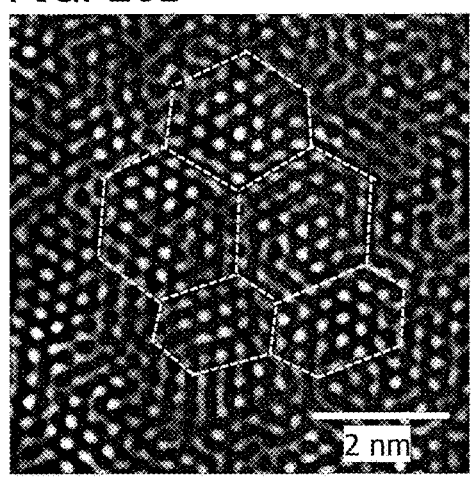
Figure 26E:
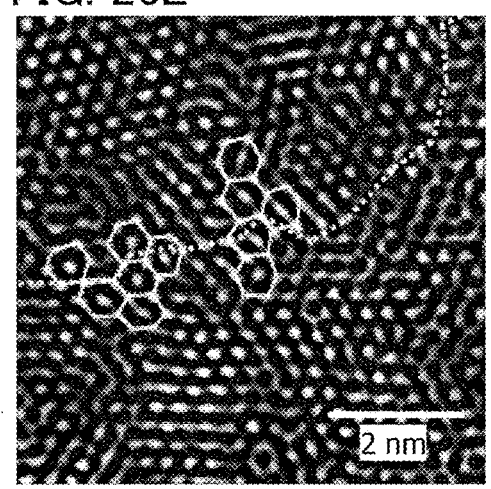

FIGS. 26B and 26C show Cs-corrected high-resolution TEM images of a plane of the CAAC-OS observed from a direction substantially perpendicular to the sample surface. FIGS. 26D and 26E are images obtained through image processing of FIGS. 26B and 26C. The method of image processing is as follows. The image in FIG. 26B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 26D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape.

Note that the shape of the pellet is not always a regular hexagon but is a non-regular hexagon in many cases.

In FIG. 26E, a dotted line denotes a portion between a region where a lattice arrangement is well aligned and another region where a lattice arrangement is well aligned. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the arrangement of oxygen atoms in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 27A:
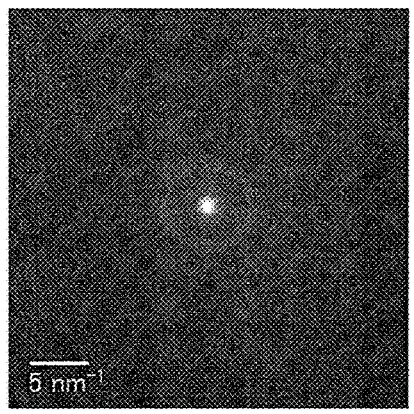
FIGS. 27A to 27D show electron diffraction patterns and a cross-sectional TEM image of an nc-OS.
Figure 27B:
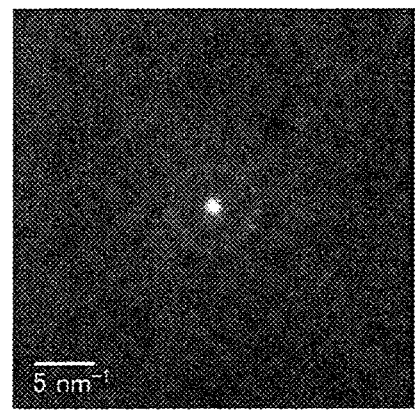

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 27A is observed. FIG. 27B shows a diffraction pattern (a nanobeam electron diffraction pattern) obtained when an electron beam with a probe diameter of 1 nm is incident on the same sample. As shown in FIG. 27B, a plurality of spots are observed in a ring-like region. In other words, ordering in an nc-OS is not observed with an electron beam with a probe diameter of 50 nm but is observed with an electron beam with a probe diameter of 1 nm.

Figure 27C:
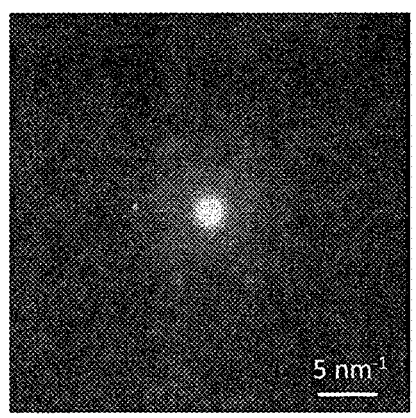

Furthermore, an electron diffraction pattern in which spots are arranged in an approximately regular hexagonal shape is observed in some cases as shown in FIG. 27C when an electron beam having a probe diameter of 1 nm is incident on a region with a thickness less than 10 nm. This means that an nc-OS has a well-ordered region, i.e., a crystal, in the range less than 10 nm in thickness. Note that an electron diffraction pattern having regularity is not observed in some regions because crystals are aligned in various directions.

Figure 27D:
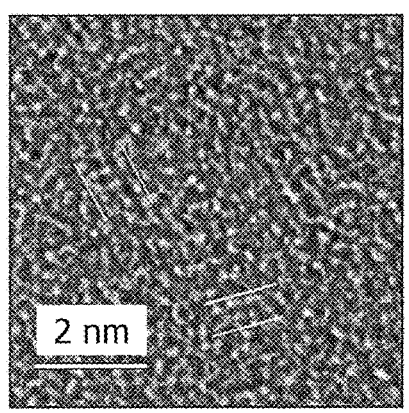

FIG. 27D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 27D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and the amorphous oxide semiconductor.

Figure 28A:
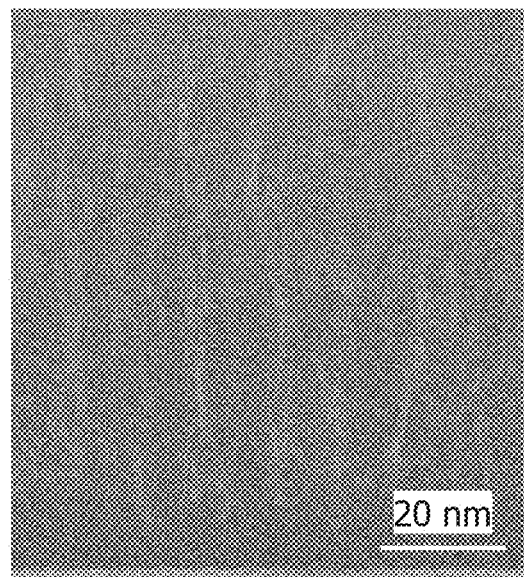
FIGS. 28A and 28B show cross-sectional TEM images of an a-like OS.
Figure 28B:
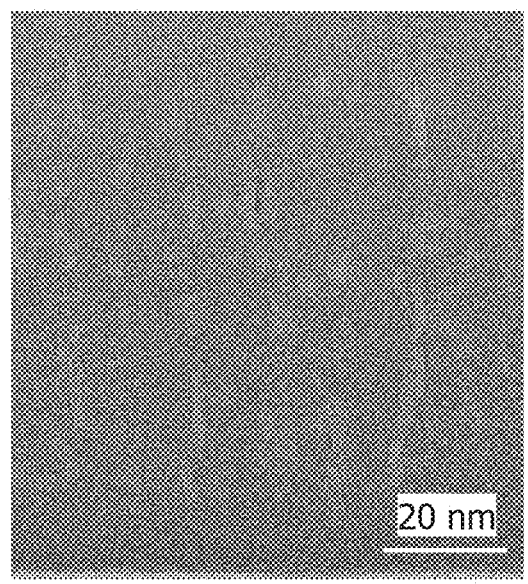

FIGS. 28A and 28B are high-resolution cross-sectional TEM images of an a-like OS. FIG. 28A is the high-resolution cross-sectional TEM image of the a-like OS at the start of the electron irradiation. FIG. 28B is the high-resolution cross-sectional TEM image of the a-like OS after the electron ($e^-$) irradiation at $4.3 \times 10^8$ $e^-/nm^2$.

FIGS. 28A and 28B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 29:
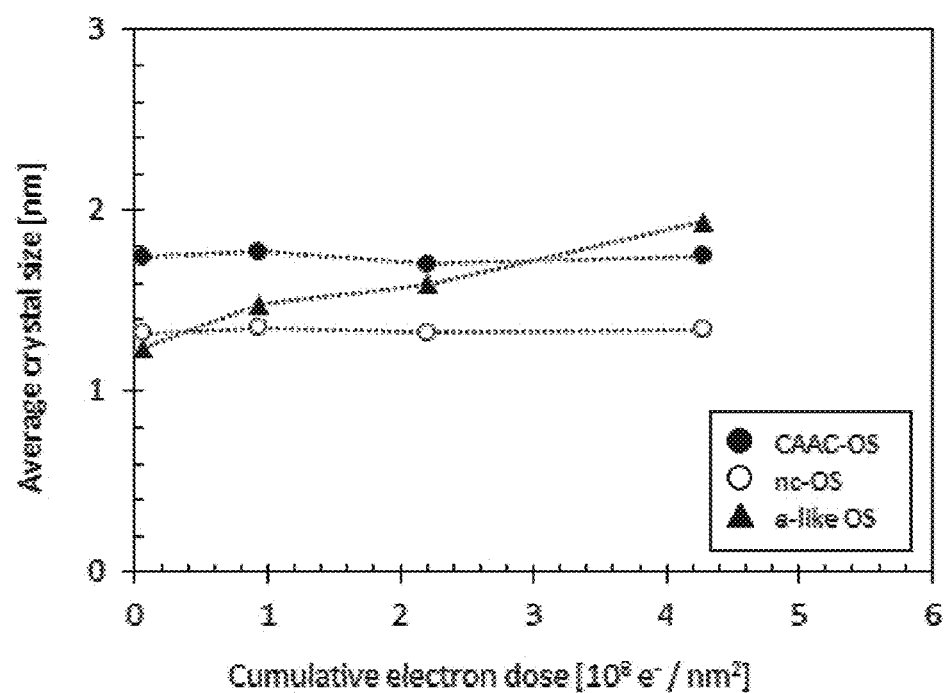
FIG. 29 shows a change in crystal part of an In—Ga—Zn oxide induced by electron irradiation.

FIG. 29 shows change in the average size of crystal parts (at 22 points to 30 points) in each sample. Note that the crystal part size corresponds to the length of a lattice fringe. FIG. 29 indicates that the crystal part size in the a-like OS increases with an increase in the cumulative electron dose in obtaining TEM images, for example. As shown in FIG. 29, a crystal part of approximately 1.2 nm (also referred to as an initial nucleus) at the start of TEM observation grows to a size of approximately 1.9 nm at a cumulative electron (e) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. As shown in FIG. 29, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2$·s); and the diameter of the irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^3$, and further preferably lower than $1 \times 10^{10}$ cm$^3$ and is higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

Note that this embodiment can be combined with any of the other embodiments in this specification as appropriate.

Notes on the Description in this Specification and the Like

The following are notes on the structures in the above embodiments.

Notes on One Embodiment of the Present Invention Described in Embodiments

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

Notes on Ordinal Numbers

In this specification and the like, ordinal numbers such as first, second, and third are used in order to avoid confusion among components. Thus, the terms do not limit the number or order of components. Thus, the terms do not limit the number or order of components. In the present specification and the like, a "first" component in one embodiment can be referred to as a "second" component in other embodiments or claims. Furthermore, in the present specification and the like, a "first" component in one embodiment can be referred to without the ordinal number in other embodiments or claims.

Notes on the Description for Drawings

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the embodiments, the same portions or portions having similar functions are denoted by the same reference numerals in different drawings, and the description of such portions is not repeated.

In this specification and the like, the terms for explaining arrangement, such as "over" and "under," are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as plan views (also referred to as layout views) and perspective views, some of components might not be illustrated for clarity of the drawings.

In the drawings, the same components, components having similar functions, components formed of the same material, or components formed at the same time are denoted by the same reference numerals in some cases, and the description thereof is not repeated in some cases.

Notes on Expressions that can be Rephrased

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. Note that in this specification and the like, a channel formation region refers to a region where a current mainly flows, and a current can flow between the source and the drain through the channel formation region.

Furthermore, functions of a source and a drain might be interchanged with each other when transistors having different polarities are employed or a direction of current flow is changed in circuit operation, for example. Therefore, the terms "source" and "drain" can be interchanged with each other in this specification and the like.

In this specification and the like, in the case where a transistor has two or more gates (this structure is referred to as a dual-gate structure in some cases), these gates are referred to as a first gate and a second gate or a front gate and a back gate in some cases. In particular, the term "front gate" can be replaced with a simple term "gate". Note that a "bottom gate" is a terminal which is formed before a channel formation region in manufacture of a transistor, and a "top gate" is a terminal which is formed after a channel formation region in manufacture of a transistor.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term "signal line" in some cases. For example, the term "wiring" can be changed into the term such as "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases. The term "potential" that is applied to a wiring can be changed into the term "signal" or the like depending on circumstances or conditions. Inversely, the term "signal" or the like can be changed into the term "potential" in some cases.

Notes on Definitions of Terms

The following are definitions of the terms mentioned in the above embodiments.

<<Semiconductor>>

In this specification, a "semiconductor" may have characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor layer is silicon, examples of an impurity which changes the characteristics of the semiconductor include oxygen, Group 1 elements except hydrogen, Group 2 elements, Group 13 elements, and Group 15 elements.

<<Switch>>

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

In one transistor, channel widths in all regions are not necessarily the same. In other words, the channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of the transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a line, an electrode, a terminal, a conductive film, a layer, or the like).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial no. 2016-010520 filed with Japan Patent Office on Jan. 22, 2016 and Japanese Patent Application serial no. 2016-010524 filed with Japan Patent Office on Jan. 22, 2016, the entire contents of which are hereby incorporated by reference.

What is claimed is:

1. A semiconductor device comprising:
   a first transistor;
   a second transistor;
   a third transistor;
   a fourth transistor;
   a first capacitor;
   a second capacitor;
   a first wiring;
   a second wiring; and
   a third wiring,
   wherein the first wiring serves as a gate of the first transistor and a gate of the third transistor,
   wherein a first terminal of the first capacitor is electrically connected to one of a source electrode and a drain electrode of the first transistor,
   wherein the second wiring serves as a gate of the second transistor and a gate of the fourth transistor,
   wherein a first terminal of the second capacitor is electrically connected to one of a source electrode and a drain electrode of the second transistor,
   wherein a channel formation region in the first transistor is formed in a first oxide semiconductor,
   wherein a channel formation region in the second transistor is formed in the first oxide semiconductor,
   wherein a channel formation region in the third transistor is formed in a second oxide semiconductor,
   wherein a channel formation region in the fourth transistor is formed in the second oxide semiconductor,
   wherein the first oxide semiconductor and the second oxide semiconductor are separated from each other,
   wherein the third wiring is between the first transistor and the second transistor,
   wherein the third wiring is between the third transistor and the fourth transistor,
   wherein the first wiring, the second wiring and the third wiring are formed from a same conductive film,
   wherein the third wiring overlaps with the first oxide semiconductor with an insulating film interposed therebetween,
   wherein the first transistor and the second transistor are configured to be electrically isolated by a potential of the third wiring, and
   wherein the third transistor and the fourth transistor are configured to be electrically isolated by the potential of the third wiring.

2. The semiconductor device according to claim 1, further comprising:
   a fourth wiring; and
   a fifth wiring,
   wherein the fourth wiring is electrically connected to the other of the source electrode and the drain electrode of the first transistor,
   wherein the fifth wiring is electrically connected to the other of the source electrode and the drain electrode of the second transistor,
   wherein the first oxide semiconductor overlaps with the first wiring, the second wiring, the third wiring, the fourth wiring, and with the fifth wiring,
   wherein the fourth wiring overlaps with the first wiring, the second wiring, and the third wiring, and
   wherein the fifth wiring overlaps with the first wiring, the second wiring, and the third wiring.

3. The semiconductor device according to claim 1, further comprising a sixth wiring,
   wherein the sixth wiring is provided to overlap with the third wiring with the first oxide semiconductor and the second oxide semiconductor positioned between the sixth wiring and the third wiring, wherein the first transistor and the second transistor are configured to be electrically isolated by a potential of the sixth wiring, and wherein the third transistor and the fourth transistor are configured to be electrically isolated by a potential of the sixth wiring.

4. The semiconductor device according to claim 1, further comprising:

a seventh wiring; and an eighth wiring, wherein the seventh wiring serves as a back gate of the first transistor and a back gate of the third transistor, wherein the seventh wiring is provided to overlap with the first wiring with the channel formation region in the first transistor positioned between the seventh wiring and the first wiring, wherein the eighth wiring serves as a back gate of the second transistor and a back gate of the fourth transistor, and wherein the eighth wiring is provided to overlap with the second wiring with the channel formation region in the second transistor positioned between the eighth wiring and the second wiring.

5. The semiconductor device according to claim 1, wherein the first oxide semiconductor comprises at least one of indium, an element M, and zinc, and wherein the element M represents any one of aluminum, gallium, yttrium, and tin.

6. An electronic device comprising:

the semiconductor device according to claim 1; and a housing, wherein the semiconductor device is provided in the housing.

7. A semiconductor device comprising:

a first transistor;

a second transistor;

a third transistor;

a fourth transistor;

a fifth transistor;

a sixth transistor;

a first capacitor;

a second capacitor;

a first wiring;

a second wiring; and a third wiring, wherein the first wiring serves as a gate of the first transistor and a gate of the fifth transistor, wherein a first terminal of the first capacitor is electrically connected to one of a source electrode and a drain electrode of the first transistor, wherein a gate of the second transistor is electrically connected to one of the source electrode and the drain electrode of the first transistor, wherein the second wiring serves as a gate of the third transistor and a gate of the sixth transistor, wherein a first terminal of the second capacitor is electrically connected to one of a source electrode and a drain electrode of the third transistor, wherein a gate of the fourth transistor is electrically connected to one of the source electrode and the drain electrode of the third transistor, wherein a channel formation region in the first transistor is formed in a first oxide semiconductor, wherein a channel formation region in the third transistor is formed in the first oxide semiconductor, wherein a channel formation region in the fifth transistor is formed in a second oxide semiconductor, wherein a channel formation region in the sixth transistor is formed in the second oxide semiconductor, wherein the first oxide semiconductor and the second oxide semiconductor are separated from each other, wherein the third wiring is between the first transistor and the second transistor, wherein the third wiring is between the fifth transistor and the sixth transistor, wherein the first wiring, the second wiring and the third wiring are formed from a same conductive film, wherein the third wiring overlaps with the first oxide semiconductor with an insulating film interposed therebetween, wherein the first transistor and the second transistor are configured to be electrically isolated by a potential of the third wiring, and wherein the fifth transistor and the sixth transistor are configured to be electrically isolated by the potential of the third wiring.

8. The semiconductor device according to claim 7, further comprising:

a fourth wiring;

a fifth wiring;

a sixth wiring;

a seventh wiring; and an eighth wiring, wherein the fourth wiring is electrically connected to the other of the source electrode and the drain electrode of the first transistor, wherein the fifth wiring is electrically connected to one of a source electrode and a drain electrode of the second transistor, wherein the sixth wiring is electrically connected to the other of the source electrode and the drain electrode of the third transistor, wherein the seventh wiring is electrically connected to one of a source electrode and a drain electrode of the fourth transistor, wherein the eighth wiring is electrically connected to the other of the source electrode and the drain electrode of the second transistor, wherein the eighth wiring is electrically connected to the other of the source electrode and the drain electrode of the fourth transistor, wherein the first oxide semiconductor overlaps with the first wiring, the second wiring, the third wiring, the fourth wiring, the fifth wiring, the sixth wiring, the seventh wiring, and the eighth wiring, wherein the first wiring overlaps with the fourth wiring, the fifth wiring, the sixth wiring, the seventh wiring, and the eighth wiring, wherein the second wiring overlaps with the fourth wiring, the fifth wiring, the sixth wiring, the seventh wiring, and the eighth wiring, and wherein the third wiring overlaps with the fourth wiring, the fifth wiring, the sixth wiring, the seventh wiring, and the eighth wiring.

9. The semiconductor device according to claim 7, further comprising:

a fourth wiring;

a fifth wiring; and a sixth wiring, wherein the fourth wiring is electrically connected to the other of the source electrode and the drain electrode of the first transistor, wherein the fourth wiring is electrically connected to one of a source electrode and a drain electrode of the second transistor, wherein the fifth wiring is electrically connected to the other of the source electrode and the drain electrode of the third transistor, wherein the fifth wiring is electrically connected to one of a source electrode and a drain electrode of the fourth transistor, wherein the sixth wiring is electrically connected to the other of the source electrode and the drain electrode of the second transistor, wherein the sixth wiring is electrically connected to the other of the source electrode and the drain electrode of the fourth transistor, wherein the first oxide semiconductor overlaps with the first wiring, the second wiring, the third wiring, the fourth wiring, the fifth wiring, and the sixth wiring, wherein the first wiring overlaps with the fourth wiring, the fifth wiring, and the sixth wiring, wherein the second wiring overlaps with the fourth wiring, the fifth wiring, and the sixth wiring, and wherein the third wiring overlaps with the fourth wiring, the fifth wiring, and the sixth wiring.

10. The semiconductor device according to claim 7, further comprising a ninth wiring, wherein the ninth wiring is provided to overlap with the third wiring with the first oxide semiconductor and the second oxide semiconductor positioned between the ninth wiring and the third wiring, wherein the first transistor and the second transistor are configured to be electrically isolated by a potential of the ninth wiring, and wherein the fifth transistor and the sixth transistor are configured to be electrically isolated by a potential of the ninth wiring.

11. The semiconductor device according to claim 7, further comprising:

a tenth wiring; and an eleventh wiring, wherein the tenth wiring serves as a back gate of the first transistor and a back gate of the fifth transistor, wherein the tenth wiring is provided to overlap with the first wiring with the channel formation region in the first transistor positioned between the tenth wiring and the first wiring, wherein the eleventh wiring serves as a back gate of the third transistor and a back gate of the sixth transistor, and wherein the eleventh wiring is provided to overlap with the second wiring with the channel formation region in the third transistor positioned between the eleventh wiring and the second wiring.

12. The semiconductor device according to claim 7, further comprising an insulating layer, wherein the first transistor and the third transistor are over the insulating layer, and wherein the second transistor and the fourth transistor are under the insulating layer.

13. The semiconductor device according to claim 7, wherein at least one of channel formation regions in the second transistor and the fourth transistor comprises silicon.

14. The semiconductor device according to claim 7, wherein the first oxide semiconductor comprises at least one of indium, an element M, and zinc, and wherein the element M represents any one of aluminum, gallium, yttrium, and tin.

15. An electronic device comprising:

the semiconductor device according to claim 7; and a housing, wherein the semiconductor device is provided in the housing.

16. The semiconductor device according to claim 1, wherein the gate of the first transistor is over and overlaps with one of the source electrode and the drain electrode of the first transistor, wherein the gate of the second transistor is over and overlaps with one of the source electrode and the drain electrode of the second transistor, wherein the third wiring does not overlap with one of the source electrode and the drain electrode of the first transistor and one of the source electrode and the drain electrode of the second transistor.

17. The semiconductor device according to claim 7, wherein the gate of the first transistor is over and overlaps with one of the source electrode and the drain electrode of the first transistor, wherein the gate of the second transistor is over and overlaps with one of the source electrode and the drain electrode of the second transistor, wherein the third wiring does not overlap with one of the source electrode and the drain electrode of the first transistor, and one of the source electrode and the drain electrode of the second transistor.

* * * * *